United States Patent
Hiraoka

(10) Patent No.: US 8,653,381 B2
(45) Date of Patent: Feb. 18, 2014

(54) WIRING BOARD COMPRISING WIRINGS ARRANGED WITH CREST AND TROUGH

(75) Inventor: Tetsuya Hiraoka, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 110 days.

(21) Appl. No.: 13/328,351

(22) Filed: Dec. 16, 2011

(65) Prior Publication Data

US 2012/0241197 A1   Sep. 27, 2012

(30) Foreign Application Priority Data

Mar. 22, 2011 (JP) ................................. 2011-063152

(51) Int. Cl.
*H05K 1/16* (2006.01)

(52) U.S. Cl.
USPC ............................ 174/260; 174/250; 361/748

(58) Field of Classification Search
USPC ......... 174/250–252, 254–256, 258, 260–264, 174/268; 361/520, 749, 783, 829
See application file for complete search history.

(56) References Cited

U.S. PATENT DOCUMENTS

2007/0246250 A1*   10/2007   Tomita et al. ................. 174/258

FOREIGN PATENT DOCUMENTS

| JP | 2005-159133 A | 6/2005 |
| JP | 2006-186286 A | 7/2006 |
| JP | 2009-076721 A | 4/2009 |

* cited by examiner

*Primary Examiner* — Jeremy Norris
*Assistant Examiner* — Tremesha S Willis
(74) *Attorney, Agent, or Firm* — Fujitsu Patent Center

(57) ABSTRACT

A wiring board includes: a first wiring; a second wiring being disposed adjacently to the first wiring; a third wiring being disposed adjacently to the first wiring; a fourth wiring being disposed adjacently to the third wiring; and an insulating layer, wherein the second wiring and the fourth wiring are disposed adjacently to each other, the first wiring and the fourth wiring are not overlapped, the second wiring and the third wiring are not overlapped, a crest and a trough are provided on a side face of the first wiring, the crest and the trough are provided on a side face of the second wiring, the trough provided on the side face of the first wiring and the third wiring are overlapped, and the trough provided on the side face of the second wiring and the fourth wiring are overlapped.

12 Claims, 29 Drawing Sheets

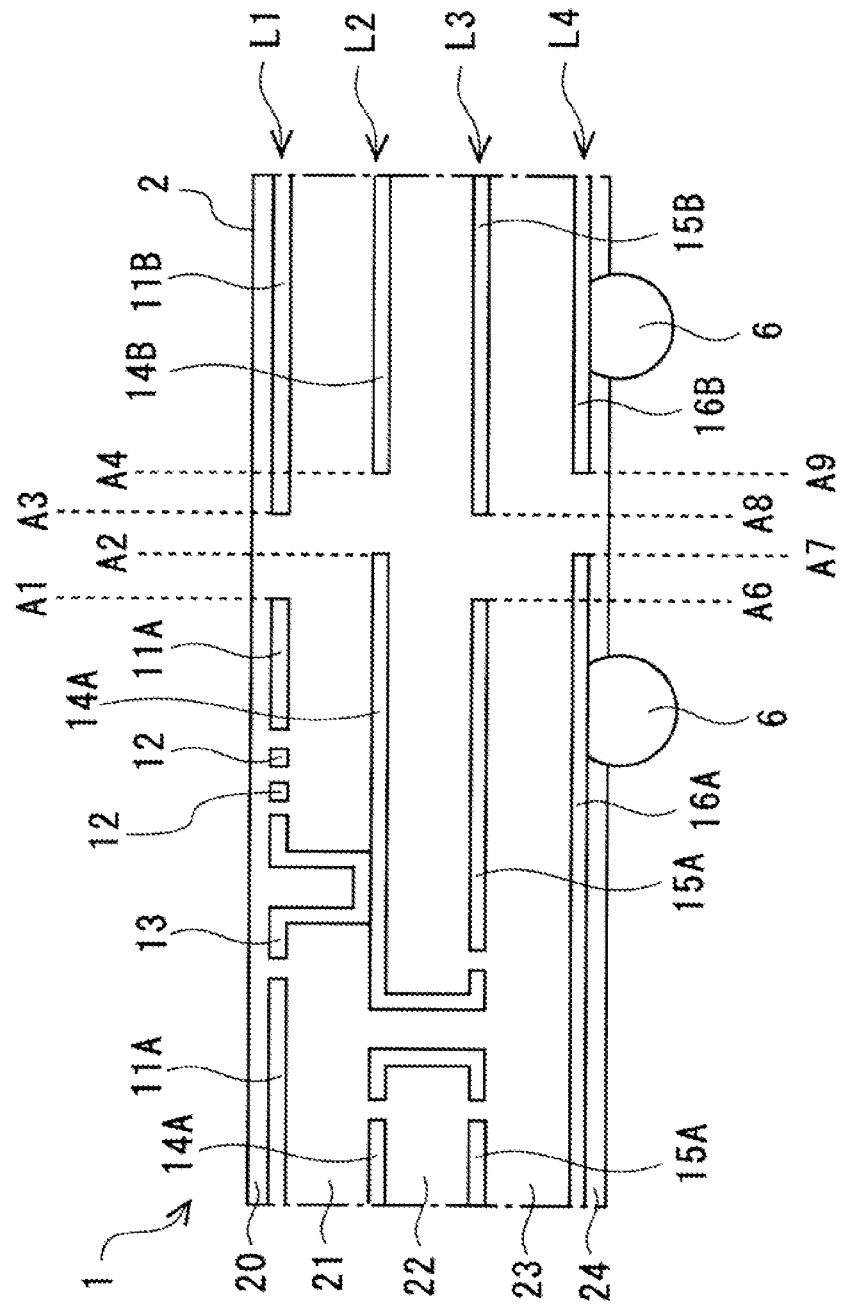

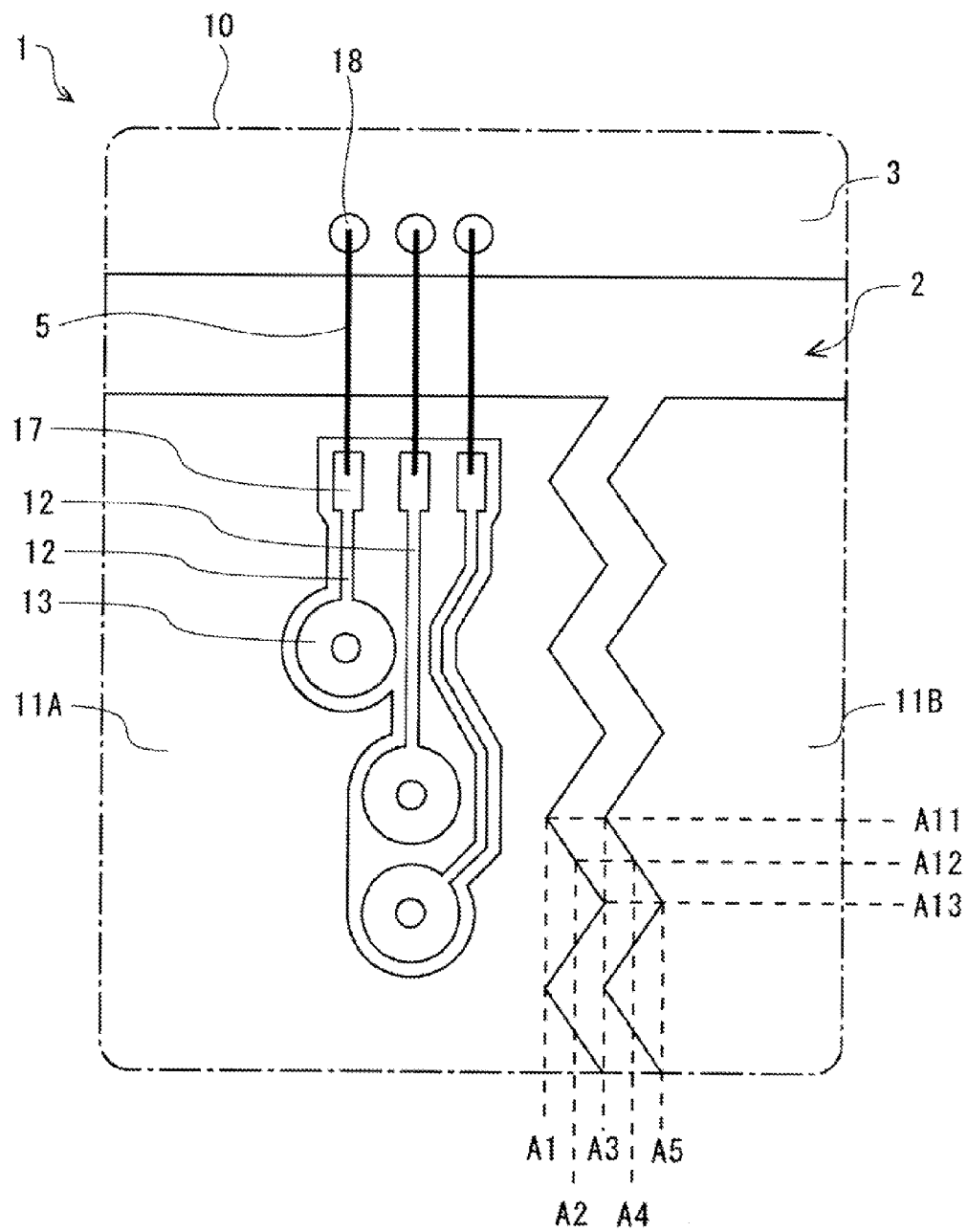

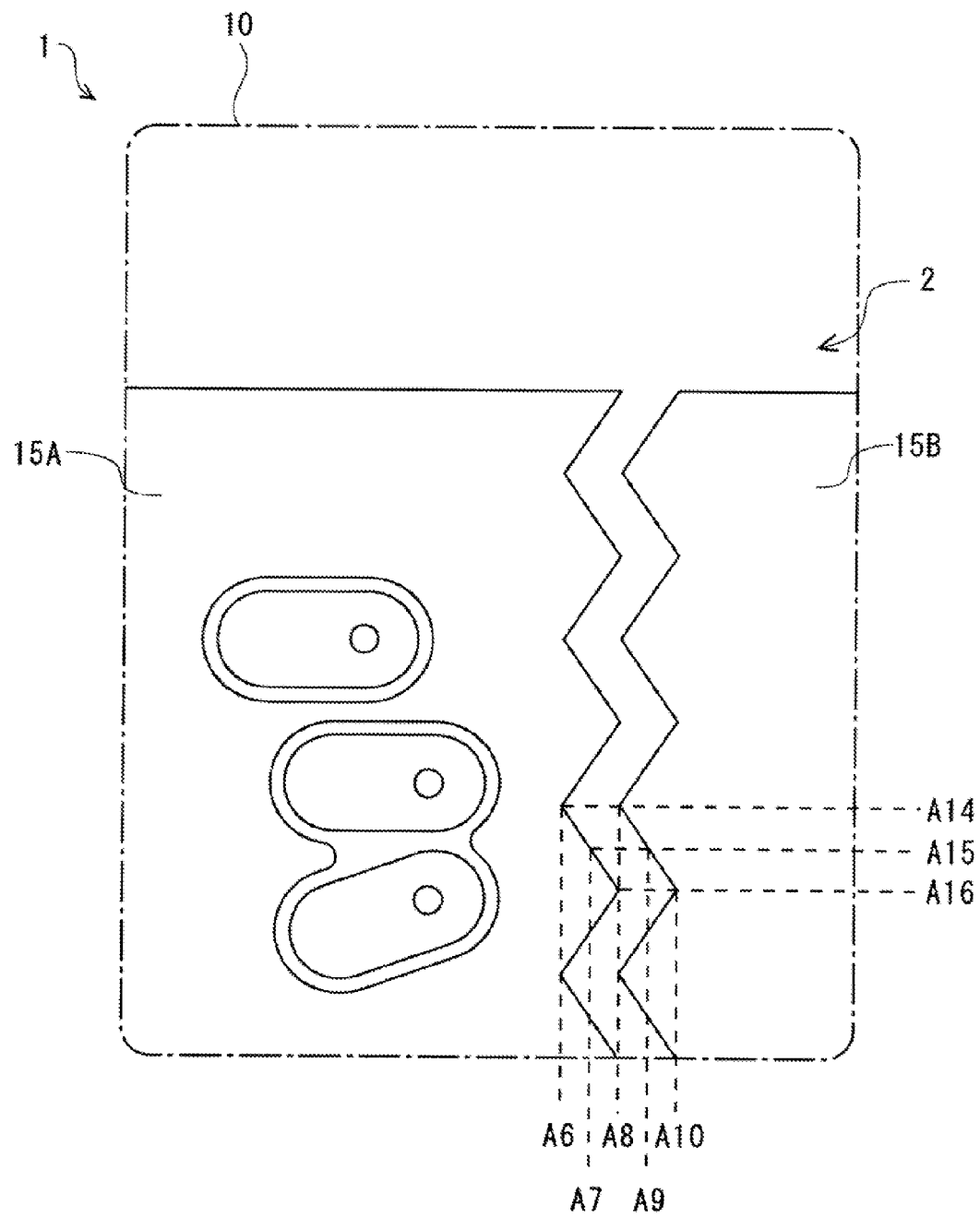

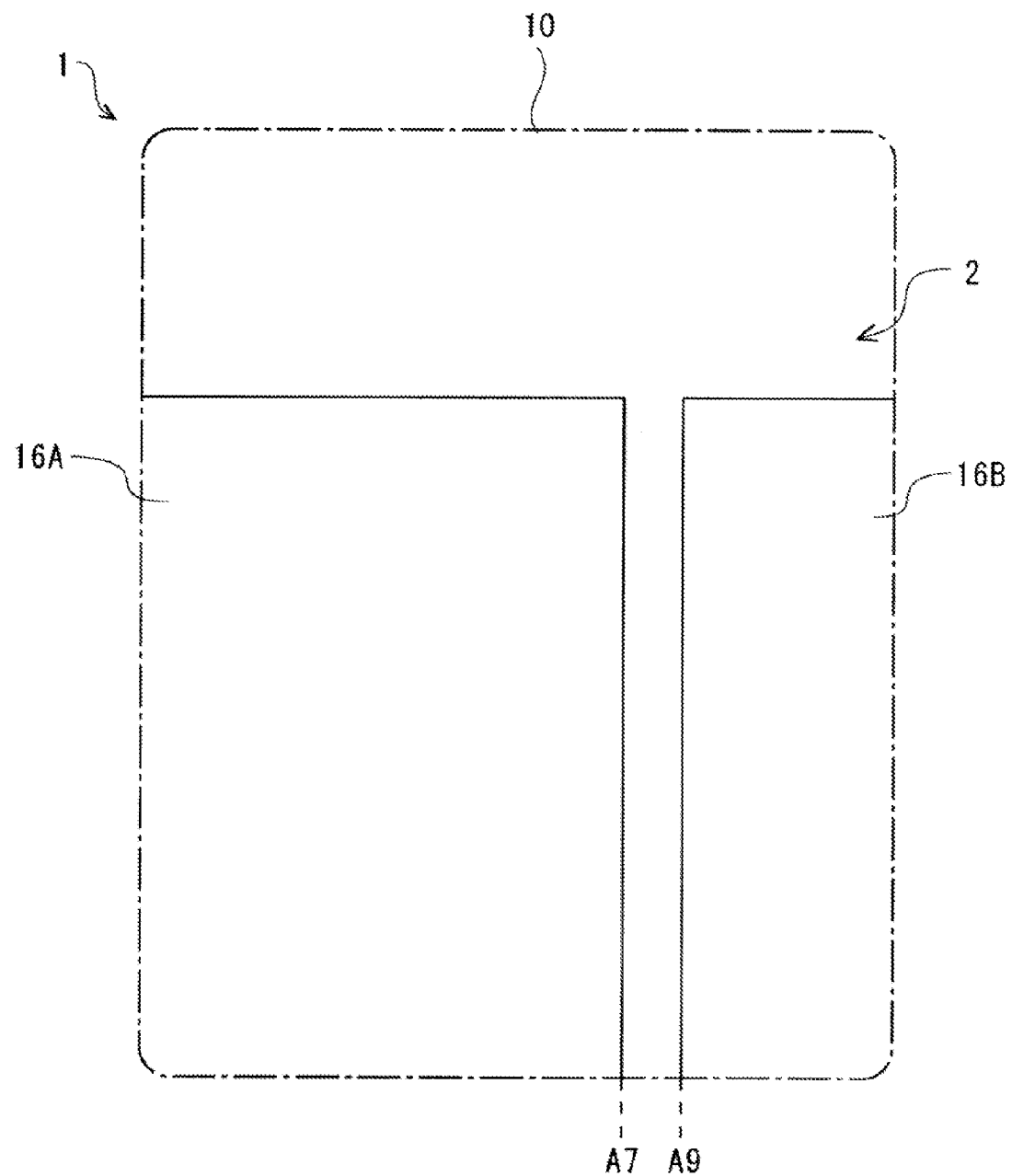

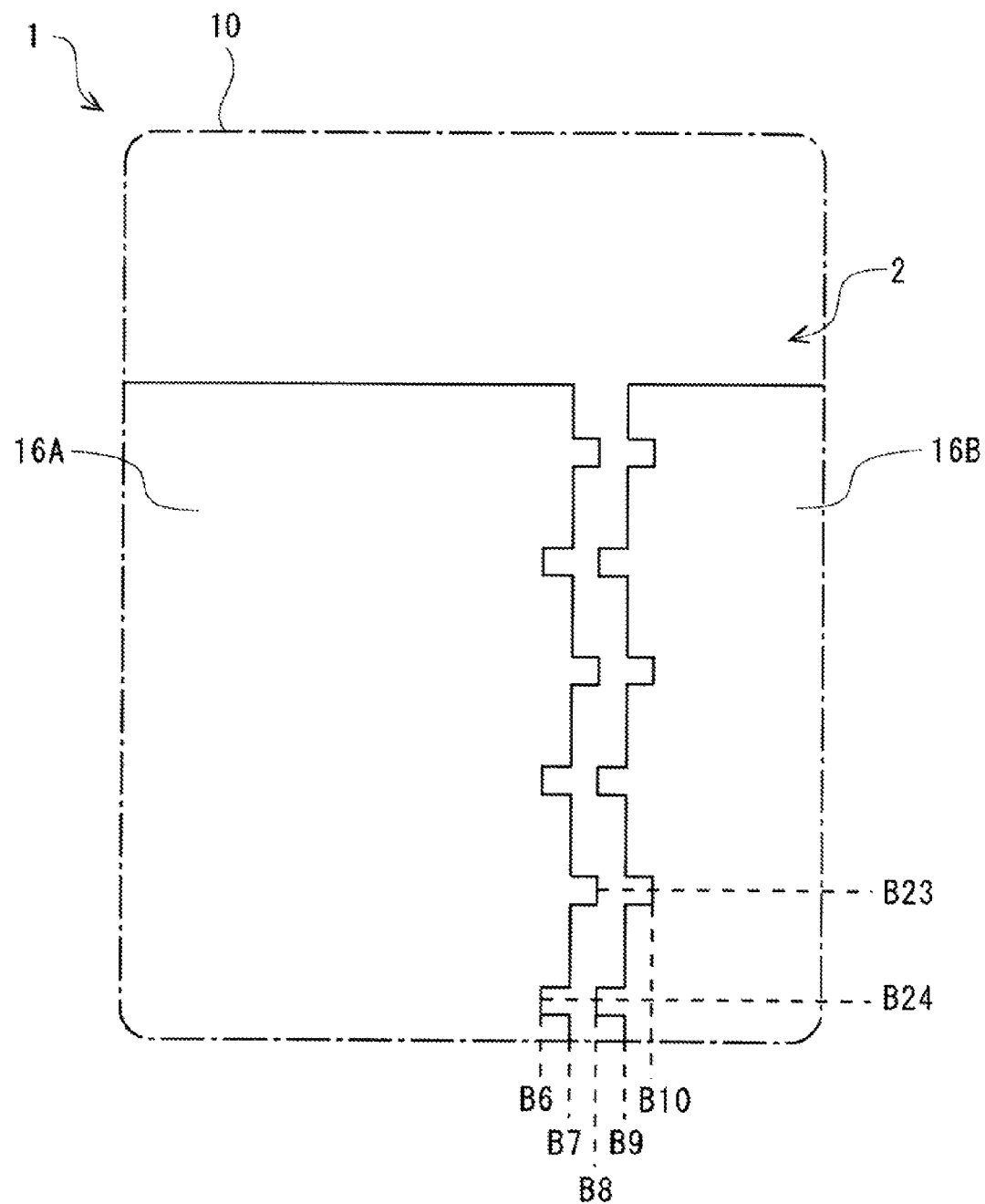

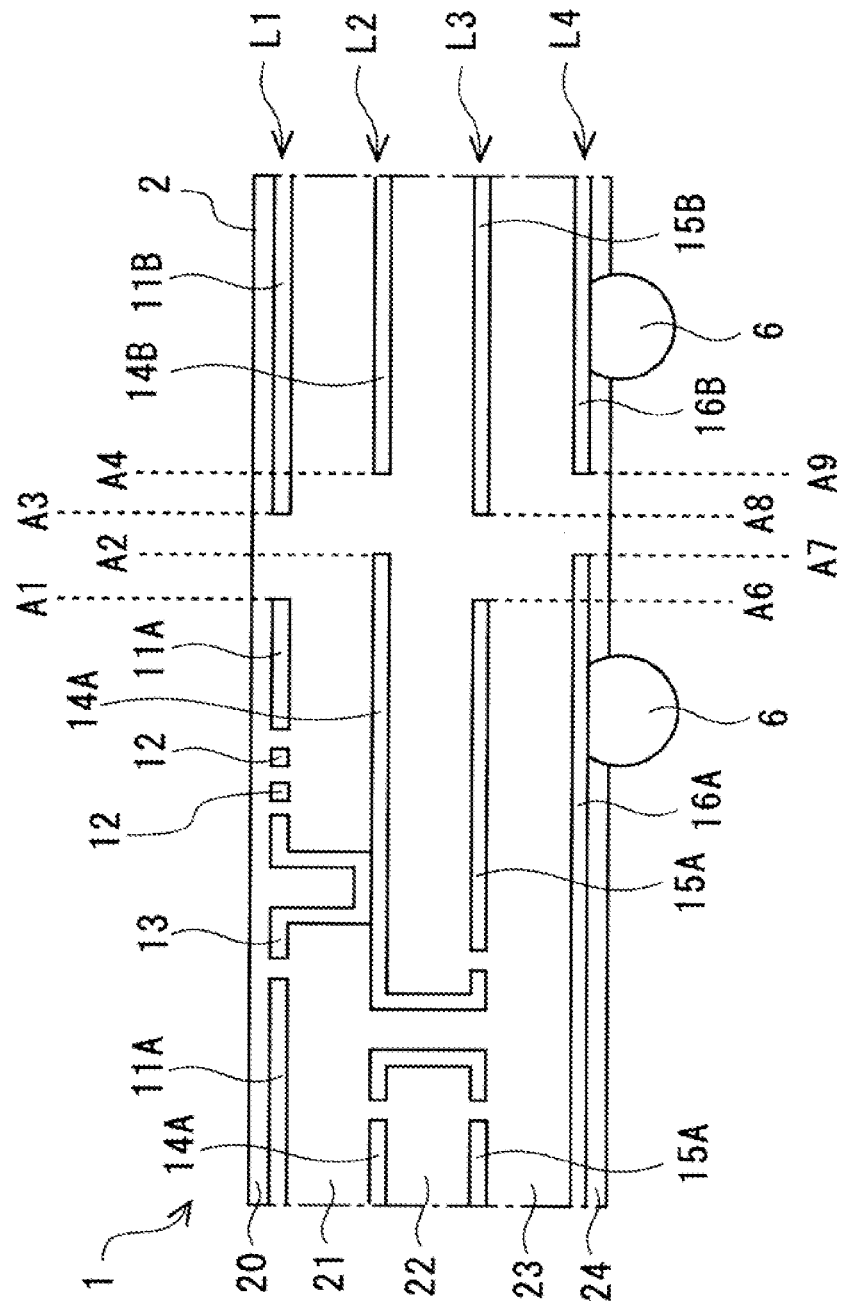

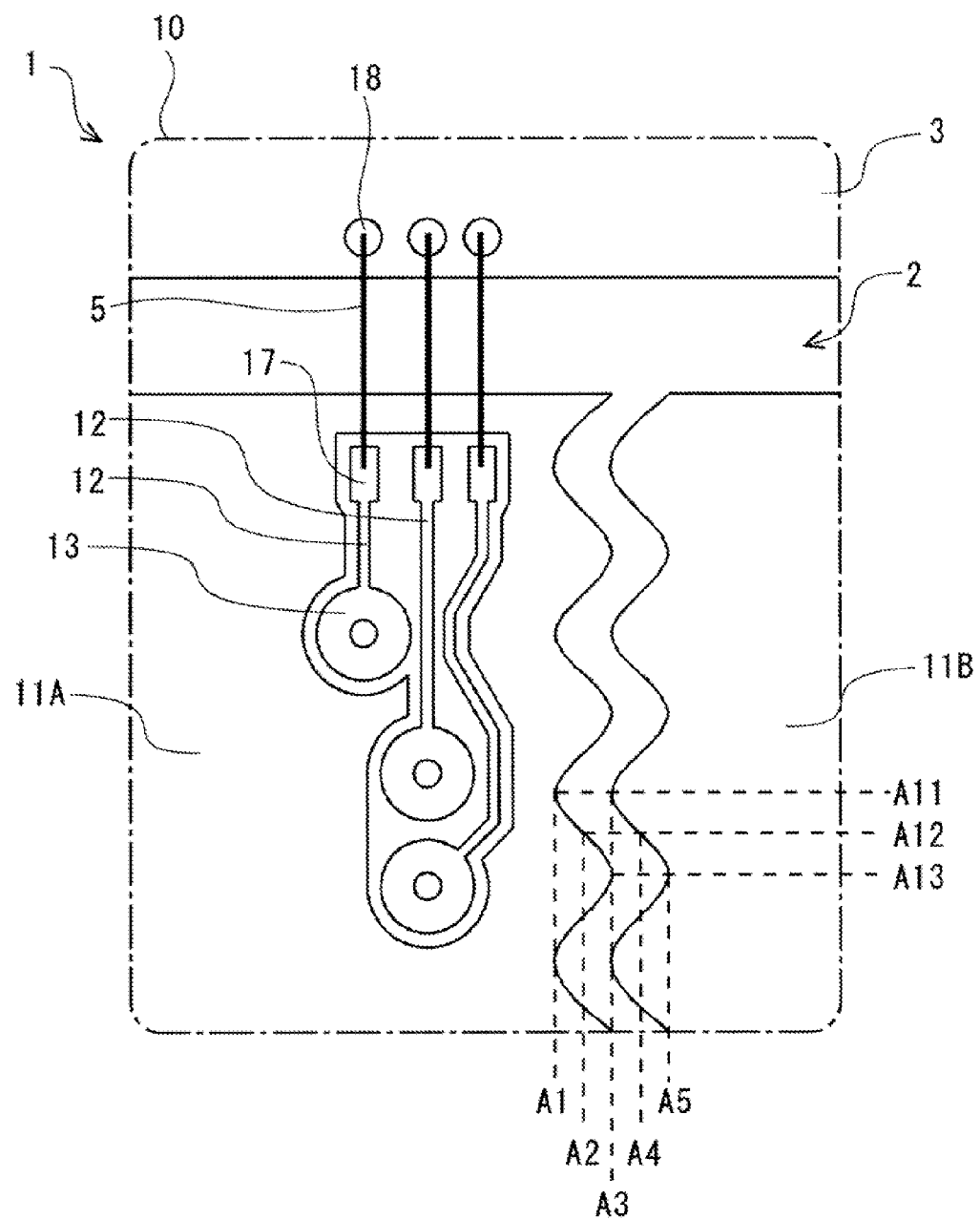

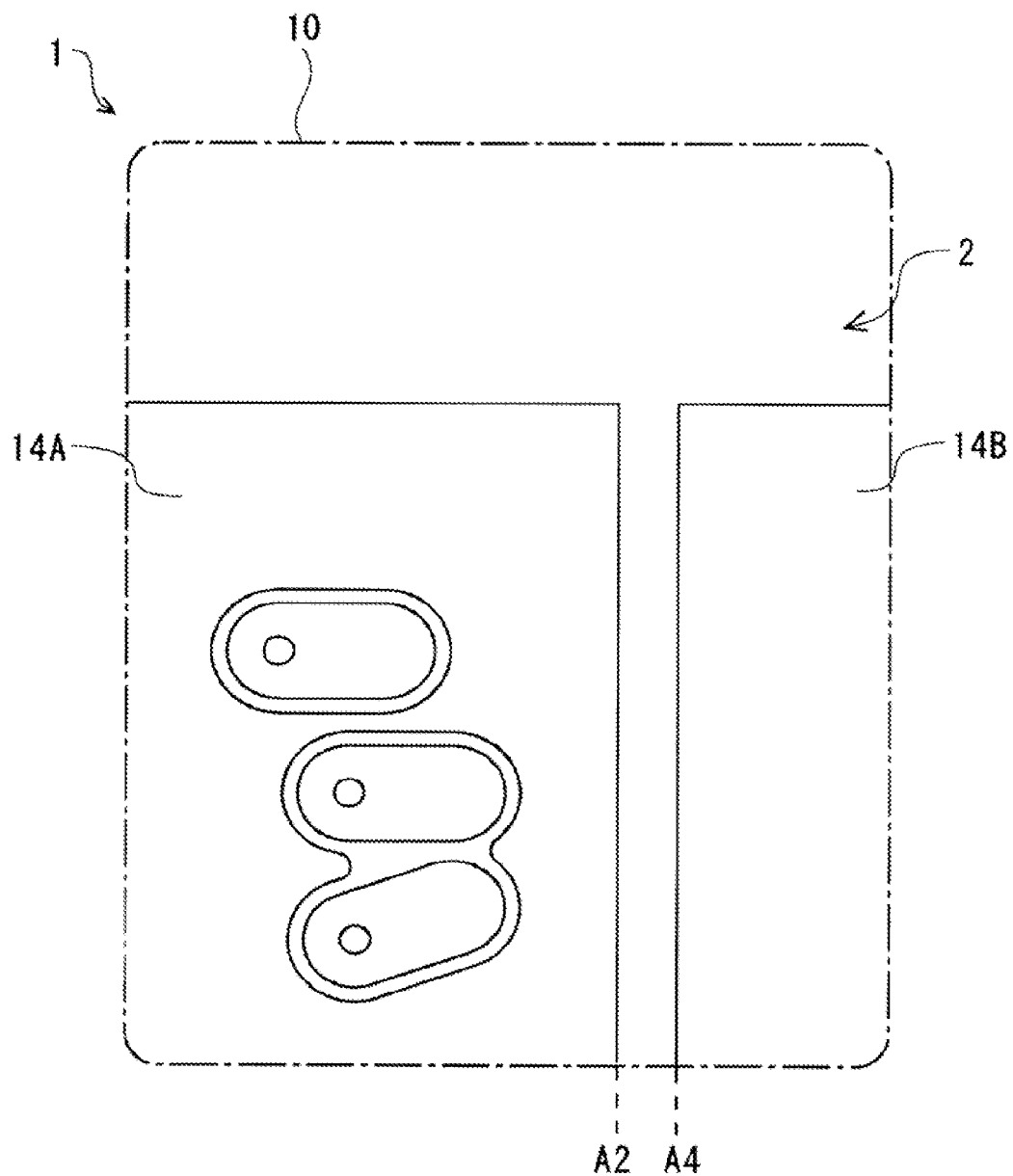

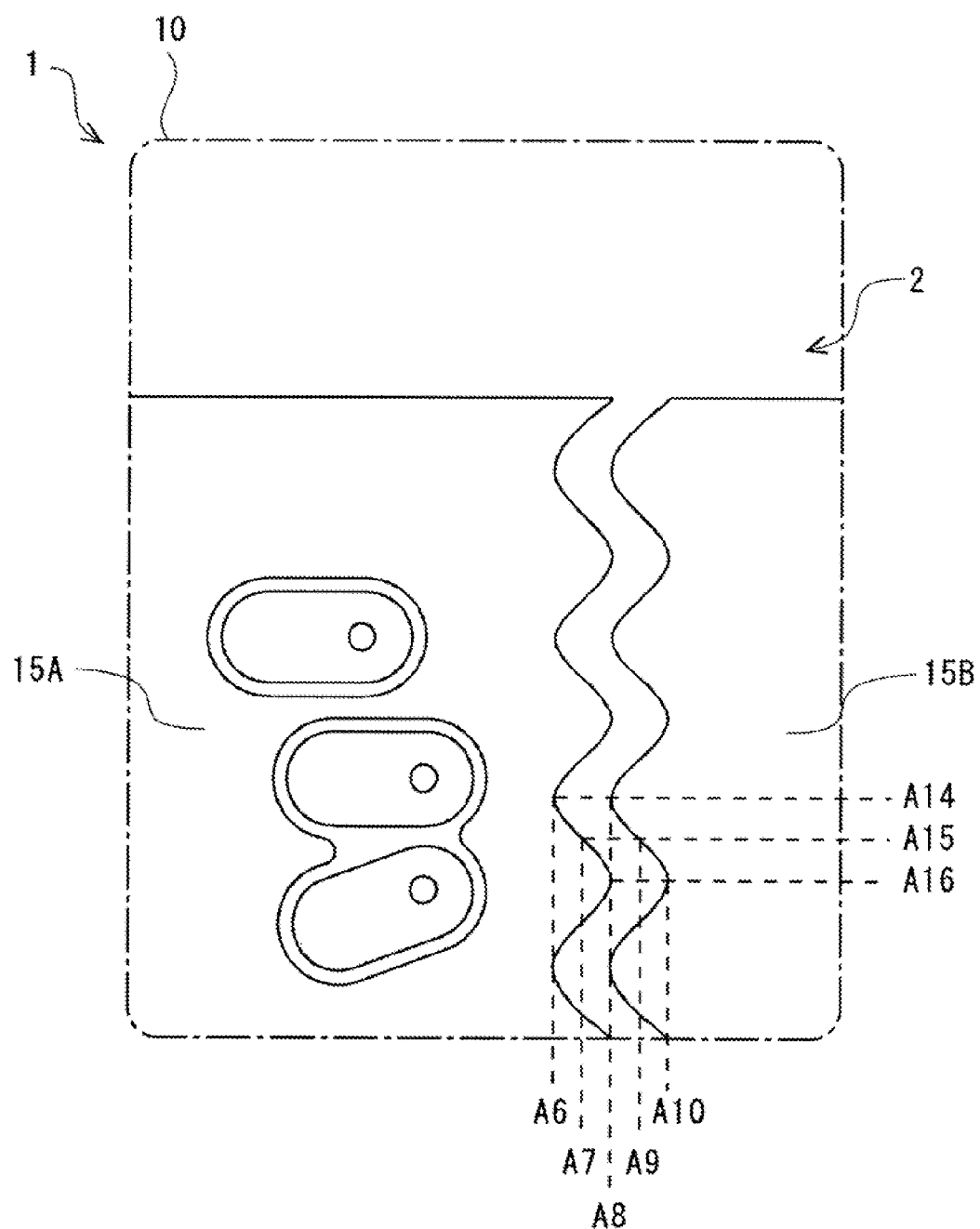

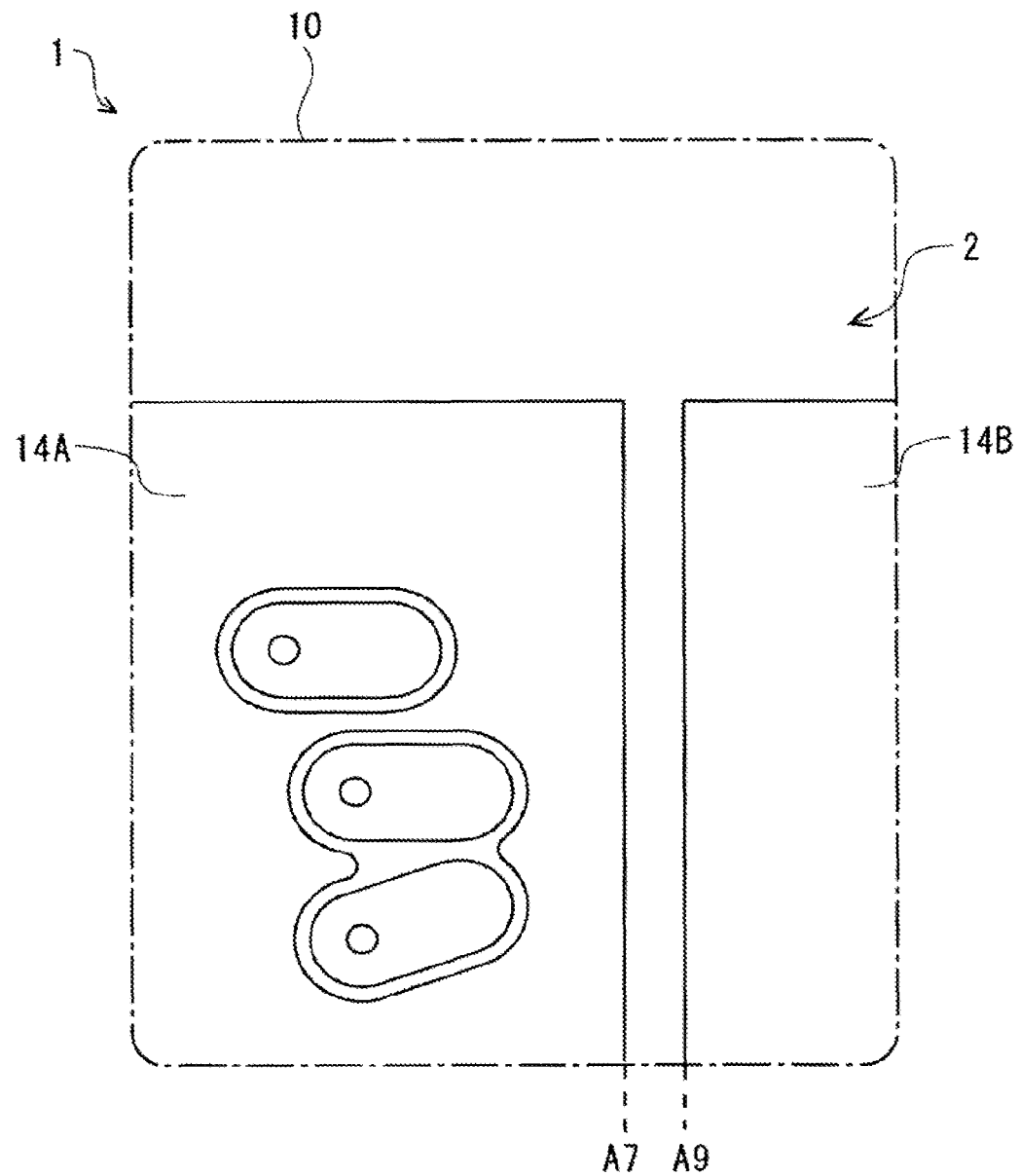

WIRING BOARD COMPRISING WIRINGS ARRANGED WITH CREST AND TROUGH

CROSS-REFERENCE TO RELATED APPLICATION

This application is based upon and claims the benefit of priority of the prior Japanese Patent Application No. 2011-63152, filed on Mar. 22, 2011, the entire contents of which are incorporated herein by reference.

FIELD

The embodiment related to a wiring board.

BACKGROUND

As electronic devices have been downsized and have enhanced their densities and functions, semiconductor devices mounted on the electronic devices have been requested to be downsized and thinned. What is proposed as a configuration of the semiconductor device in response to the request for downsizing and thinning the semiconductor device is a semiconductor package (surface mounting type package) such as Ball Grid Array (BGA). The semiconductor package is such that a semiconductor chip is packaged on a wiring board, e.g., a printed board, a buildup board, etc. As power consumption has increased due to higher performance and upsizing of the semiconductor chip, an exothermic quantity of the semiconductor chip has increased to a great degree. The semiconductor chip has a large elastic modulus in comparison with the wiring board, and hence there is a case in which the wiring board is warped due to a thermal stress with the result that a crack is caused in an insulating layer of the wiring board. There is a known technology for preventing the crack from being caused in the insulating layer of the wiring board.

[Patent document 1] Japanese Laid-open Patent Publication No. 2005-159133
[Patent document 2] Japanese Laid-open Patent Publication No. 2006-186286
[Patent document 3] Japanese Laid-open Patent Publication No. 2009-076721

When the crack is caused in the insulating layer of the wiring board, what is requested is to restrain a spread of the crack caused in the insulating layer. There is a method for restraining the spread of the crack caused in the insulating layer of the wiring board by shifting wiring arrangements in respective layers of the wiring board. If the wirings arranged in the respective layers of the wiring board become excessively close to each other, a voltage fluctuation of the wirings in one side affects a voltage of the wirings in the other side, resulting in a possibility of deteriorating electric characteristics of the wirings arranged in the respective layers.

SUMMARY

According to an aspect of the embodiment, a wiring board includes: a first wiring; a second wiring being disposed adjacently to the first wiring in a plane direction of the wiring board; a third wiring being disposed adjacently to the first wiring in a thickness direction of the wiring board; a fourth wiring being disposed adjacently to the third wiring in the plane direction of the wiring board; and an insulating layer being formed between the first wiring and the second wiring, between the first wiring and the third wiring, between the second wiring and the fourth wiring and between the third wiring and the fourth wiring, wherein the second wiring and the fourth wiring are disposed adjacently to each other in the thickness direction of the wiring board, the first wiring and the fourth wiring are not overlapped in the thickness direction of the wiring board, the second wiring and the third wiring are not overlapped in the thickness direction of the wiring board, a crest and a trough are provided on a side face of the first wiring in an area where the first wiring is adjacent to the second wiring, the crest and the trough are provided on a side face of the second wiring in the area where the first wiring is adjacent to the second wiring, the trough provided on the side face of the first wiring and the third wiring are overlapped in the thickness direction of the wiring board, and the trough provided on the side face of the second wiring and the fourth wiring are overlapped in the thickness direction of the wiring board. The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 2B is a sectional view of the principal portion of the semiconductor device 1, which is taken along the alternate long and short dash line B-B in FIG. 2A.

FIG. 3A is a plan view of a principal portion of an L1 layer of a wiring board 2 provided in the semiconductor device 1 according to the first working example.

FIG. 3C is a plan view of a principal portion of an L3 layer of the wiring board 2 provided in the semiconductor device 1 according to the first working example.

FIG. 3D is a plan view of a principal portion of an L4 layer of the wiring board 2 provided in the semiconductor device 1 according to the first working example.

FIG. 5D is a plan view of the principal portion of the L4 layer of the wiring board 2 provided in the semiconductor device 1 according to the second working example.

FIG. 7B is a sectional view of the principal portion of the semiconductor device 1, which is taken along the alternate long and short dash line J-J in FIG. 7A.

FIG. 8A is a plan view of a principal portion of the L1 layer of the wiring board 2 provided in the semiconductor device 1 according to the third working example.

FIG. 8B is a plan view of a principal portion of the L2 layer of the wiring board 2 provided in the semiconductor device 1 according to the third working example.

FIG. 8C is a plan view of a principal portion of the L3 layer of the wiring board 2 provided in the semiconductor device 1 according to the third working example.

FIG. 8D is a plan view of a principal portion of the L4 layer of the wiring board 2 provided in the semiconductor device 1 according to the third working example.

DESCRIPTION OF EMBODIMENT

Figure 9A:
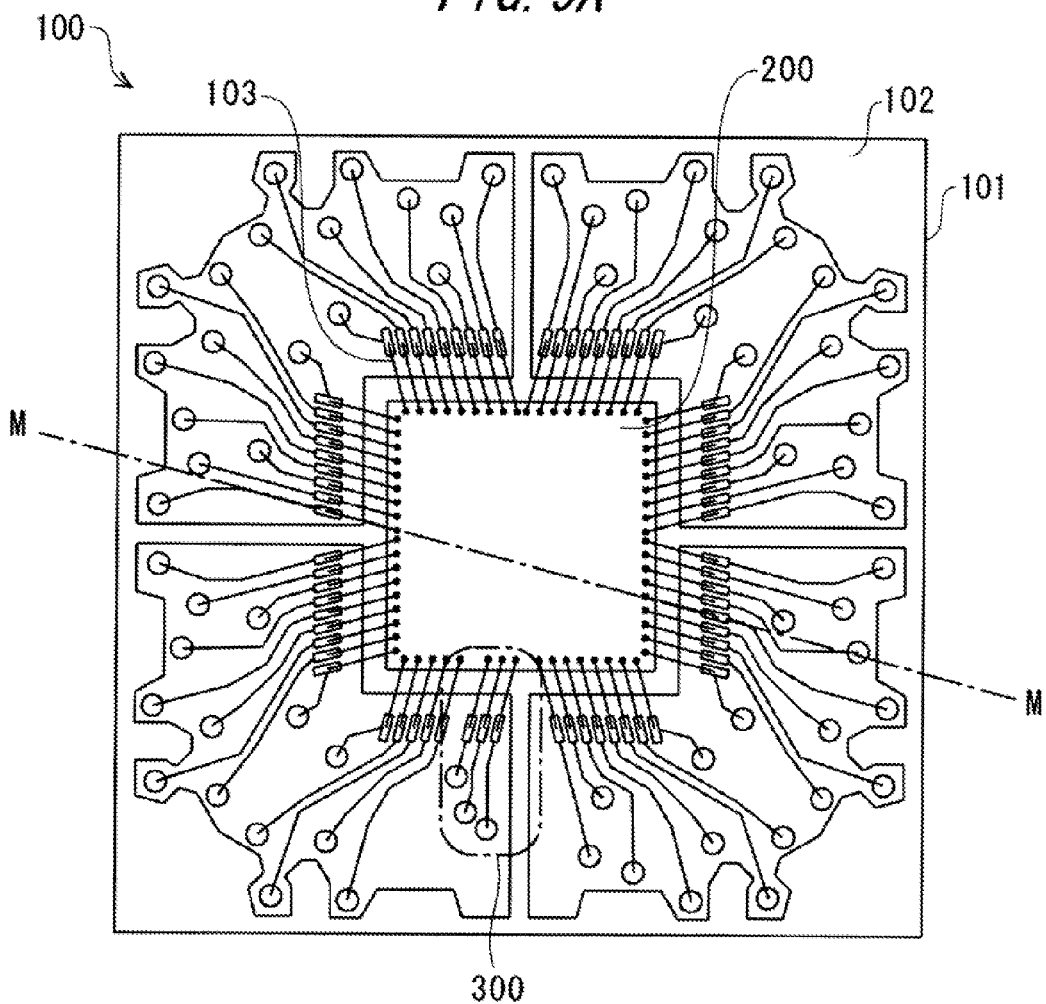
FIG. 9A is a top view of a semiconductor device 100.
Figure 9B:
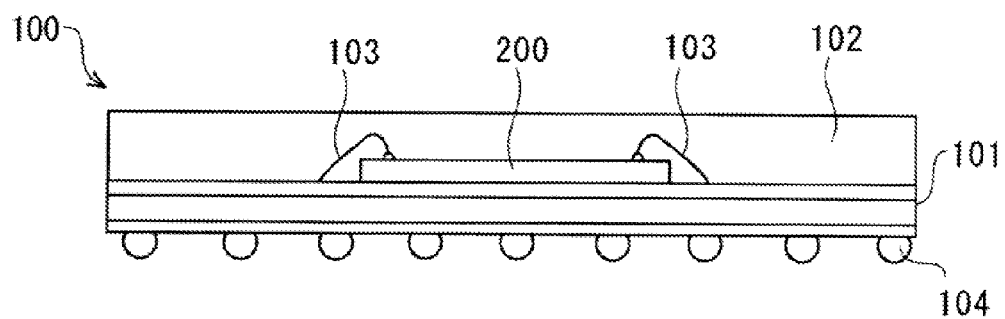
FIG. 9B is a sectional view of the semiconductor device 100, which is taken along the alternate long and short dash line M-M in FIG. 9A.

FIGS. 9A and 9B illustrate one example of a semiconductor device as a semiconductor package. FIG. 9A is a top view of a semiconductor device 100. FIG. 9B is a sectional view of the semiconductor device 100, which is taken along the alternate long and short dash line M-M in FIG. 9A. The semiconductor device 100 depicted in FIGS. 9A and 9B is configured so that a semiconductor element 200 is packaged via a bonding agent on a packaging surface (upper surface) of a wiring board (which is also referred to as a support board or an interposer) 101. The packaging surface of the wiring board 101 is sealed by a sealing resin 102. The wiring board 101 is connected via wires 103 to the semiconductor element 200. Solder balls 104 are disposed on a surface (undersurface) opposite to the packaging surface of the wiring board 101.

Figure 10A:
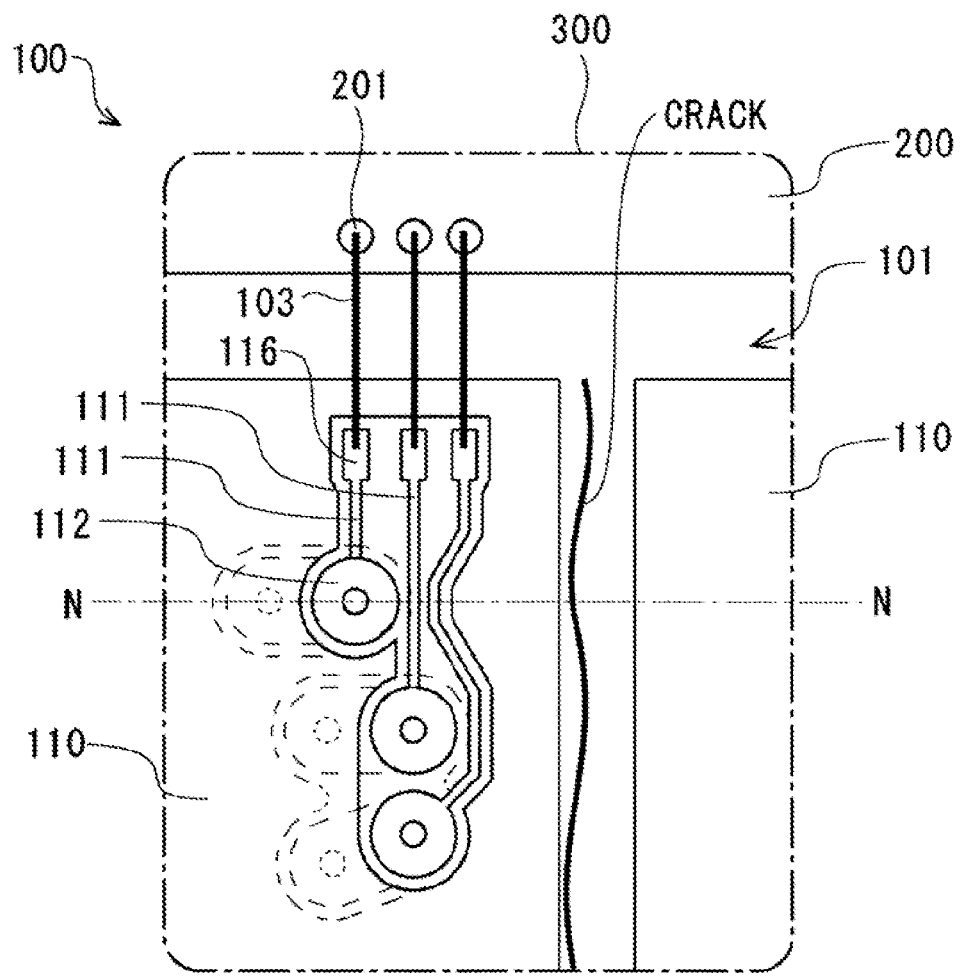
FIG. 10A is an enlarged view of a region 300 circumscribed by the alternate long and short dash line in FIG. 9A.

FIG. 10A is an enlarged view of a region 300 circumscribed by the alternate long and short dash line in FIG. 9A.

Figure 10B:
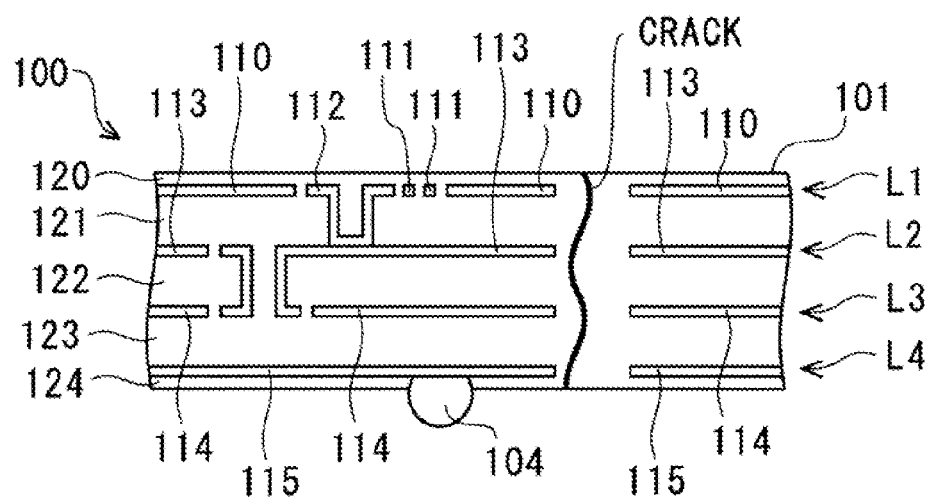
FIG. 10B is a sectional view of a principal portion of the semiconductor device 100, which is taken along the alternate long and short dash line N-N in FIG. 10A.

FIG. 10B is a sectional view of a principal portion of the semiconductor device 100, which is taken along the alternate long and short dash line N-N in FIG. 10A. As illustrated in FIGS. 10A and 10B, the wiring board 101 includes ground planes 110, signal wirings 111 and conducting-vias 112 in an L1 layer. Further, as depicted in FIG. 10B, the wiring board 101 includes power planes 113 in an L2 layer, ground planes 114 in an L3 layer and lands 115 in a L4 layer.

As illustrated in FIG. 10A, bonding pads 116 formed on the wiring board 101 are connected via wires 103 to bonding pads 201 formed on the semiconductor element 200. As depicted in FIG. 10A, signal wirings 111 are connected to the conducting-vias 112 and the bonding pads 116.

As illustrated in FIGS. 10A and 10B, the wiring board 101 includes an insulating layer 120 over the ground planes 110, the signal wirings 111 and the conducting-vias 112. As depicted in FIG. 10B, the wiring board 101 includes an insulating layer 121 between the L1 layer and the L2 layer, further includes an insulating layer 122 between the L2 layer and a L3 layer, and includes an insulating layer 123 between the L3 layer and an L4 layer. As illustrated in FIG. 10B, on the wiring board 101, an insulating layer 124 is formed on the surface opposite to the surface on which the semiconductor element 200 is packaged. As illustrated in FIG. 10B, the solder balls 104 are joined to the land 115.

If the insulating layer 120 formed on the upper layer of the wiring board 101 is cracked, the crack spreads in a plane direction and in a thickness direction (stacking direction) of the wiring board 101, with the result that the continuous crack is generated in the plane direction and in the thickness direction of the wiring board 101. As illustrated in FIG. 10B, if the insulating layer 120 is cracked, the crack spreads to the insulating layer 120 along a portion formed with none of the ground plane 110 just under the insulating layer 120. The crack spreads to the insulating layer 120 along the portion formed with none of the ground plane 110 just under the insulating layer 120, whereby the continuous crack is generated in the plane direction of the wiring board 101. Further, as depicted in FIG. 10B, the insulating layer 120 is cracked, the crack spreads through the insulating layers, 121, 122, 123 and down to the insulating layer 124. The crack spreads through the insulating layers, 121, 122, 123 and down to the insulating layer 124, with the result that the continuous crack is generated in the stacking direction of the wiring board 101.

Figure 1A:
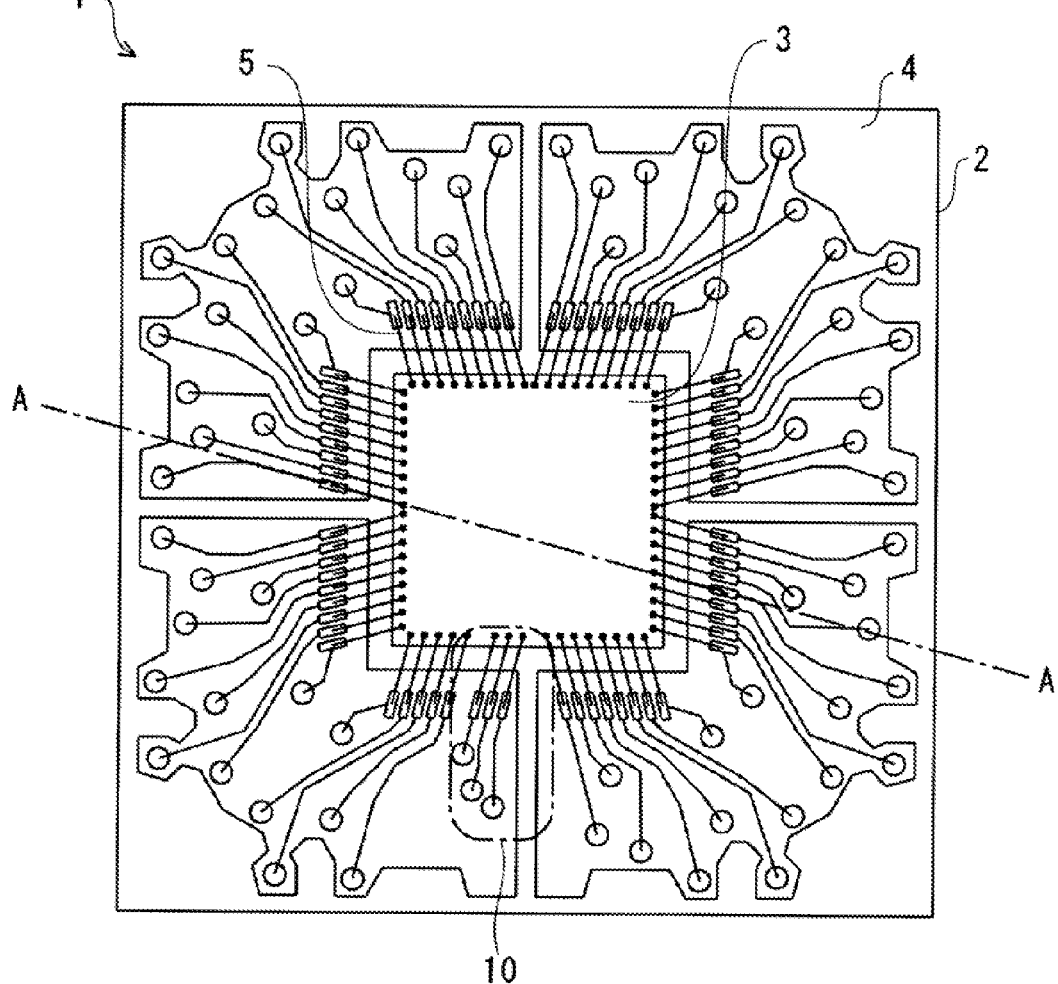
FIG. 1A is a plan view of a semiconductor device 1 according to the embodiment.
Figure 1B:
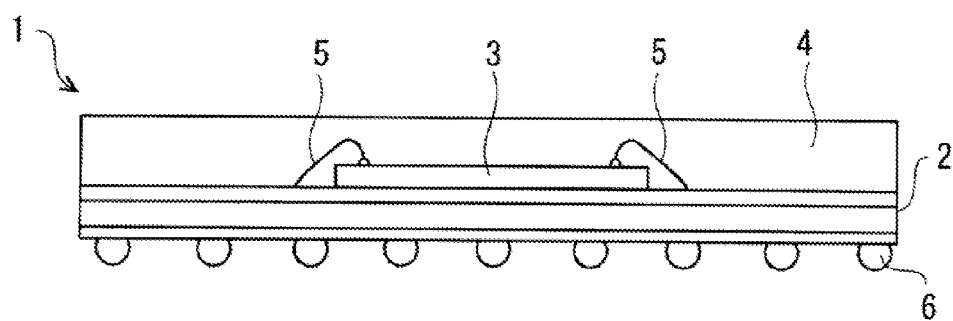
FIG. 1B is a sectional view of the semiconductor device 1, which taken along the alternate long and short dash line A-A in FIG. 1A.

An embodiment for solving the problems described above will hereinafter be discussed with reference to the drawings. FIG. 1A is a plan view of a semiconductor device 1 according to the embodiment. FIG. 1B is a sectional view of the semiconductor device 1, which taken along the alternate long and short dash line A-A in FIG. 1A. The semiconductor device 1 depicted in FIGS. 1A and 1B is configured so that a semiconductor element (semiconductor chip) 3 is packaged via a bonding agent on a packaging surface (upper surface) of a wiring board (which is also referred to as a support board or an interposer) 2. The wiring board 2 is exemplified by an organic substrate such as a build-up substrate (or a build-up board). The packaging surface of the wiring board 2 is sealed by a sealing resin 4. The sealing resin 4 is, e.g., an epoxy resin. The wiring board 2 is connected to the semiconductor element 3 via wires 5 composed of gold (Au) etc). Solder balls 6 are disposed on the surface (undersurface) opposite to the packaging surface of the wiring board 2. The semiconductor device 1 is connected to another board such as a motherboard etc via the solder balls 6.

[First Working Example]

Figure 2A:
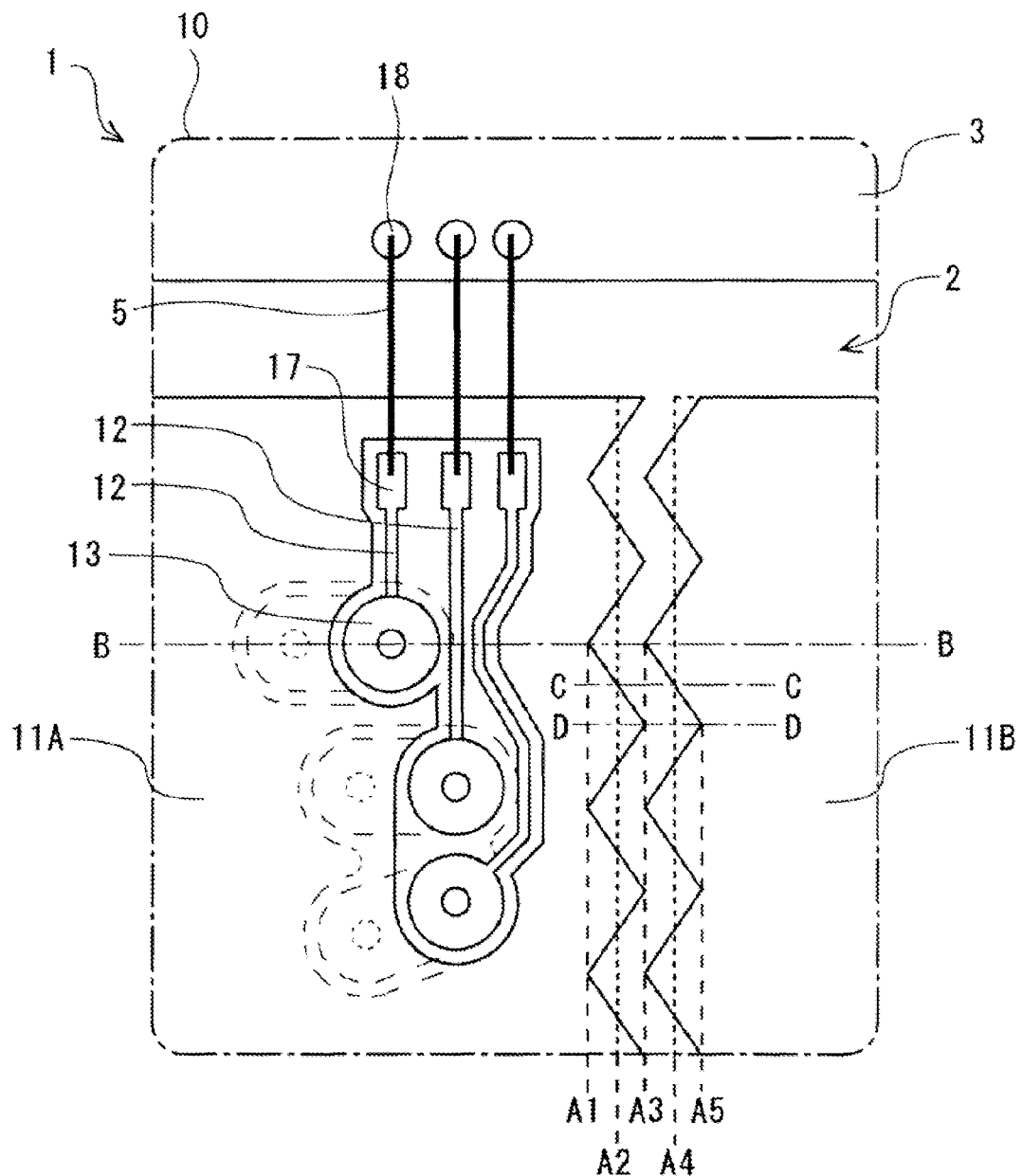
FIG. 2A is a plan view of a principal portion of the semiconductor device 1 according to a first working example.
Figure 2C:
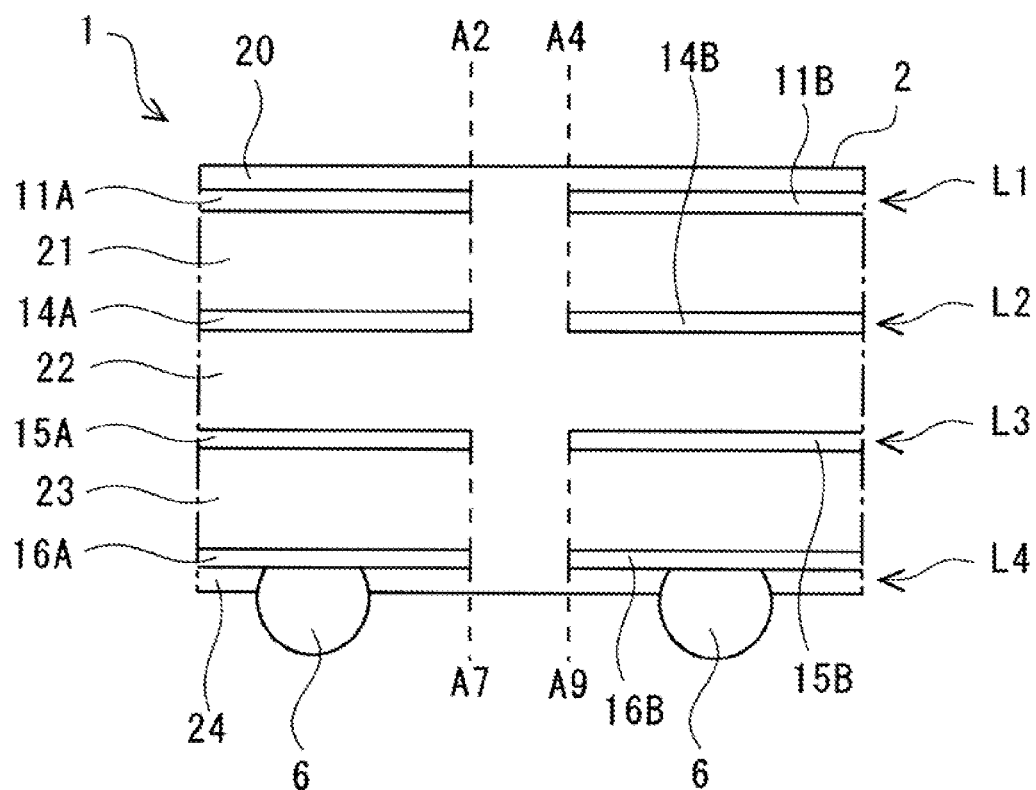
FIG. 2C is a sectional view of the principal portion of the semiconductor device 1, which is taken along the alternate long and short dash line C-C in FIG. 2A.
Figure 2D:
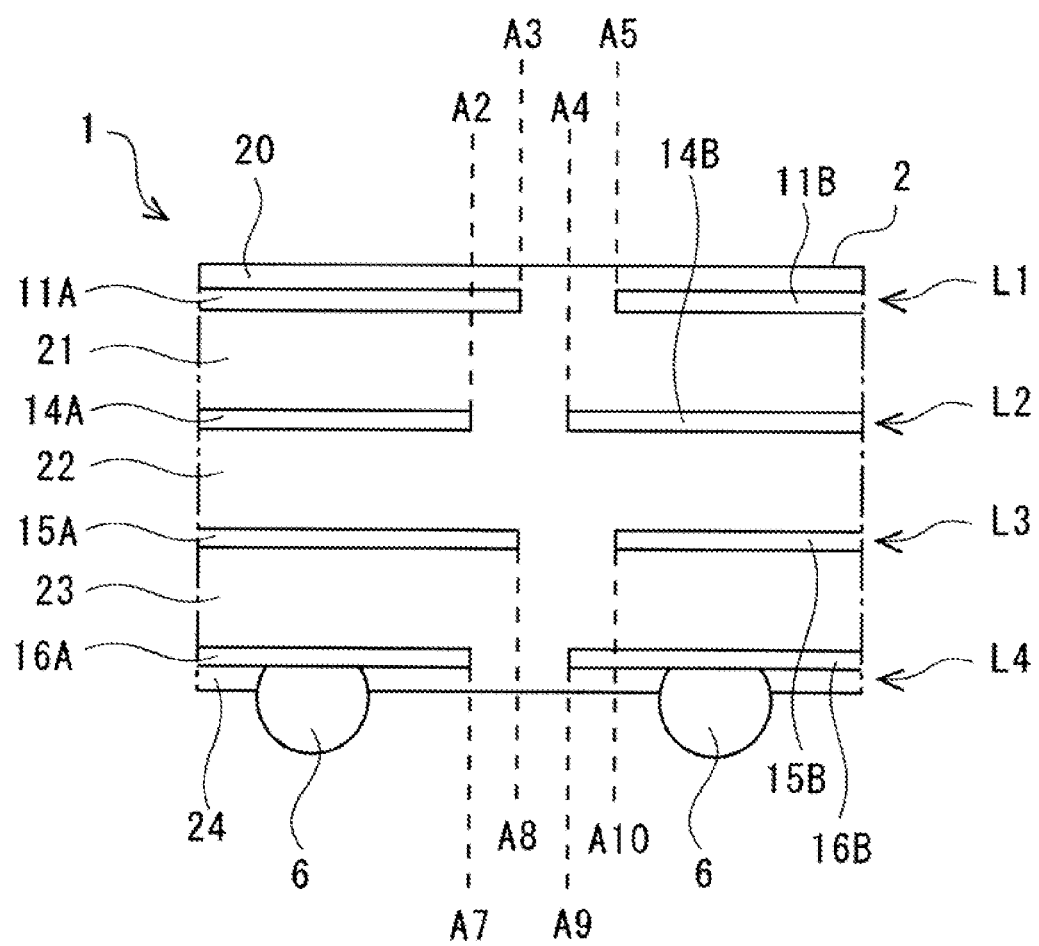
FIG. 2D is a sectional view of the principal portion of the semiconductor device 1, which is taken along the alternate long and short dash line D-D in FIG. 2A.

A first working example of the embodiment will be described. A configuration of the first working example is an exemplification, and the semiconductor device 1 according to the embodiment is not limited to the configuration of the first working example. FIG. 2A is a plan view of a principal portion of the semiconductor device 1 according to the first working example. FIG. 2A illustrates an enlarged view of a region 10 circumscribed by the alternate long and short dash line in FIG. 1A. FIG. 2B is a sectional view of the principal portion of the semiconductor device 1, which is taken along the alternate long and short dash line B-B in FIG. 2A. FIG. 2C is a sectional view of the principal portion of the semiconductor device 1, which is taken along the alternate long and short dash line C-C in FIG. 2A. FIG. 2D is a sectional view of the principal portion of the semiconductor device 1, which is taken along the alternate long and short dash line D-D in FIG. 2A. In FIGS. 2A through 2D, the illustration of the sealing resin 4 is omitted.

As illustrated in FIGS. 2A and 2B, ground planes 11A, 11B, signal wirings 12 and conducting-vias 13 are formed in an L1 layer of the wiring board 2. Further, as depicted in FIGS. 2B through 2D, power planes 14A, 14B are formed in the L2 layer of the wiring board 2, ground planes 15A, 15B are formed in the L3 layer of the wiring board 2, and lands 16A, 16B are formed in the L4 layer of the wiring board 2. A first wiring is one example of the ground plane 11A and the power plane 14A. A second wiring is one example of the ground plane 11B and the power plane 14B. A third wiring is one example of the ground plane 11A and the power plane 14A. A fourth wiring is one example of the ground plane 11B and the power plane 14B.

As depicted in FIGS. 2A through 2D, the ground plane 11A and the ground plane 11B are disposed in a side-by-side relationship in the plane direction of the wiring board 2. As illustrated in FIGS. 2B through 2D, the power plane 14A and the power plane 14B are disposed in the side-by-side relationship in the plane direction of the wiring board 2. As depicted in FIGS. 2B through 2D, the ground plane 15A and the ground plane 15B are disposed in the side-by-side relationship in the plane direction of the wiring board 2. As illustrated in FIGS. 2B through 2D, the land 16A and the land 16B are disposed in the side-by-side relationship in the plane direction of the wiring board 2.

As depicted in FIGS. 2B through 2D, the power plane 14A is disposed under the ground plane 11A, and the power plane 14B is disposed under the ground plane 11B. Namely, as illustrated in FIGS. 2B through 2D, in the thickness direction of the wiring board 2, the ground plane 11A and the power plane 14A are disposed in the side-by-side relationship, and the ground plane 11B and the power plane 14B are disposed in the side-by-side relationship. As illustrated in FIGS. 2B through 2D, the ground plane 15A is disposed under the power plane 14A, and the ground plane 15B is disposed under the power plane 14B. Namely, as illustrated in FIGS. 2B through 2D, in the thickness direction of the wiring board 2, the power plane 14A and the ground plane 15A are disposed in the side-by-side relationship, and the power plane 14B and the ground plane 15B are disposed in the side-by-side relationship. As depicted in FIGS. 2B through 2D, the land 16A is disposed under the ground plane 15A, and the land 16B is disposed under the ground plane 15B. Namely, as illustrated in FIGS. 2B through 2D, in the thickness direction of the wiring board 2, the ground plane 15A and the land 16A are disposed in the side-by-side relationship, and the ground plane 15B and the land 16B are disposed in the side-by-side relationship.

The ground planes 11A, 15A and the power plane 14A are connected through an unillustrated conducting-via to the land 16A. The ground planes 11B, 15B and the power plane 14B are connected through the unillustrated conducting-via to the land 16B. The ground planes 11A, 11B, 15A, 15B, the signal wirings 12, the conducting-vias 13, the power planes 14A, 14B and the lands 16A, 16B may involve using a metal such as copper (Cu) as their material. As depicted in FIGS. 2B through 2D, the solder balls 6 are joined to the lands 16A, 16B.

As illustrated in FIG. 2A, the bonding pads 17 formed on the wiring board 2 are connected via the wires 5 to the bonding pads 18 formed on the semiconductor element 3. As illustrated in FIG. 2A, the signal wirings 12 are connected to the conducting-vias 13 and the bonding pads 17.

As depicted in FIGS. 2B through 2D, in the wiring board 2, the insulating layer 20 is formed over the ground planes 11A, 11B, the signal wirings 12 and the conducting-vias 13. A material of the insulating layer 20 may involve using, e.g., a solder resist. The solder resist may be liquid and may also take a dry-film shape. In FIG. 2A, the illustration of the insulating layer 20 is omitted. As illustrated in FIGS. 2B through 2D, the wiring board 2 includes an insulating layer 21 between the L1 layer and the L2 layer, includes an insulating layer 22 between the L2 layer and the L3 layer, and includes an insulating layer 23 between the L3 layer and the L4 layer.

As depicted in FIGS. 2B through 2D, the wiring board 2 is formed with the insulating layer 21 between the ground plane 11A and the power plane 14A and between the ground plane 11B and the power plane 14B. As illustrated in FIGS. 2B through 2D, the wiring board 2 is formed with the insulating layer 22 between the power plane 14A and the ground plane 15A and between the power plane 14B and the ground plane 15B. As depicted in FIGS. 2B through 2D, the wiring board 2 is formed with the insulating layer 23 between the ground plane 15A and the land 16A and between the ground plane 15B and the land 16B. A material of the insulating layers 21, 22, 23 may involve using, e.g., the epoxy resin. A thickness of each of the insulating layers 21, 22, 23 may be set equal to or larger than, e.g., 30 μm but equal to or smaller than 100 μm.

As depicted in FIGS. 2B through 2D, the wiring board 2 is formed with an insulating layer 24 on the surface opposite to the surface on which the semiconductor element 3 is packaged. A material of the insulating layer 24 may involve using, e.g., the solder resist. The solder resist may be liquid and may also take the dry-film shape.

Figure 3B:
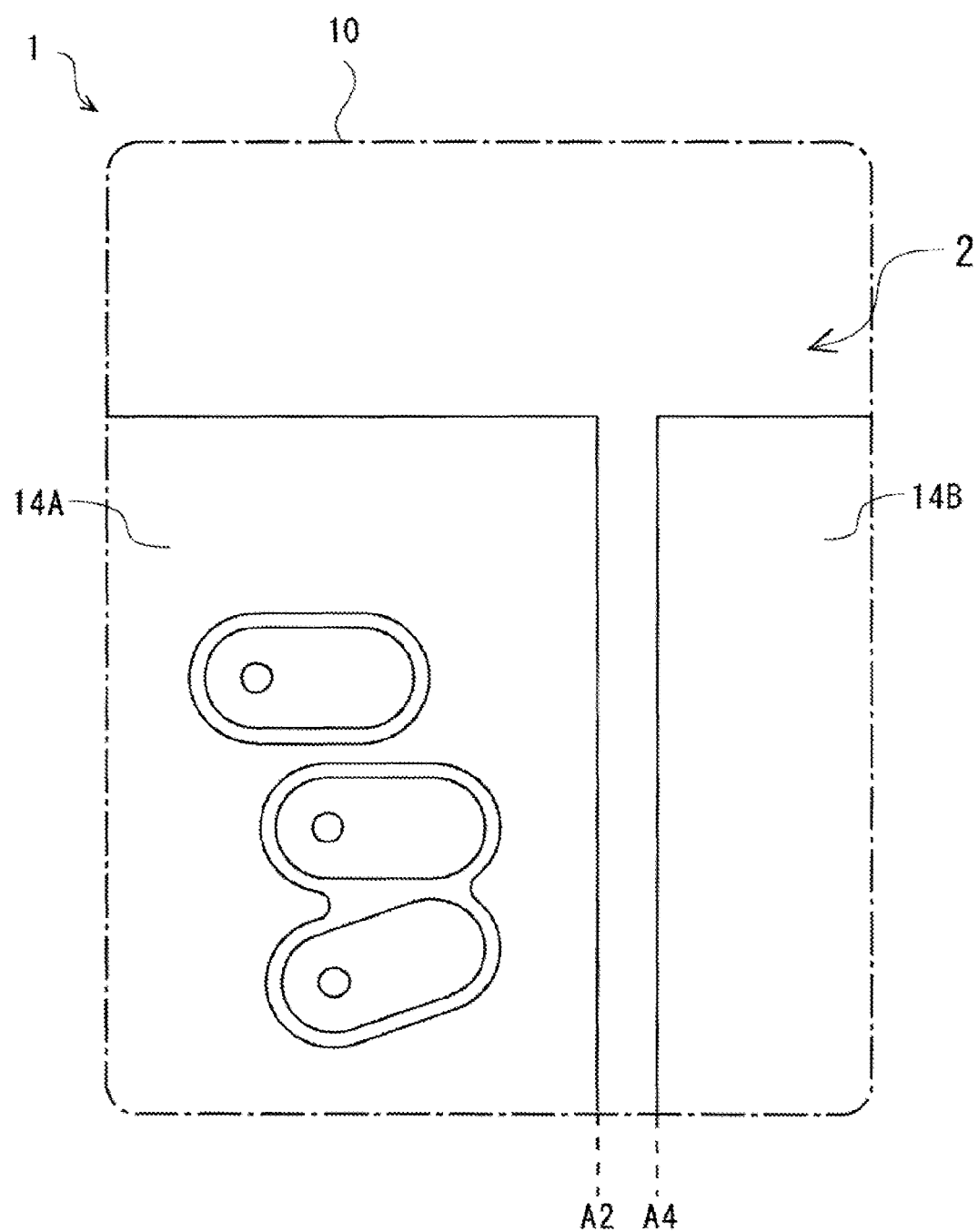
FIG. 3B is a plan view of a principal portion of an L2 layer of the wiring board 2 provided in the semiconductor device 1 according to the first working example.

FIG. 3A is a plan view of a principal portion of the L1 layer of the wiring board 2 provided in the semiconductor device 1 according to the first working example. The illustrations of the sealing resin 4 and the insulating layer 20 are omitted in FIG. 3A. FIG. 3B is a plan view of a principal portion of the L2 layer of the wiring board 2 provided in the semiconductor device 1 according to the first working example. The illustrations of the sealing resin 4, the insulating layer 20 and the L1 layer of the wiring board 2 are omitted in FIG. 3B. FIG. 3C is a plan view of a principal portion of the L3 layer of the wiring board 2 provided in the semiconductor device 1 according to the first working example. The illustrations of the sealing resin 4, the insulating layer 20 and the L1 and L2 layers of the wiring board 2 are omitted in FIG. 3C. FIG. 3D is a plan view of a principal portion of the L4 layer of the wiring board 2 provided in the semiconductor device 1 according to the first working example. The illustrations of the sealing resin 4, the insulating layer 20 and the L1, L2 and L3 layers of the wiring board 2 are omitted in FIG. 3D. Note that FIGS. 3A through 3D similar to FIG. 2A are enlarged plan views of the region 10 circumscribed by the alternate long and short dash line in FIG. 1A.

As illustrated in FIG. 3A, the ground plane 11A and the ground plane 11B are disposed in the side-by-side relationship in the plane direction of the wiring board 2. As illustrated in FIG. 3B, the power plane 14A and the power plane 14B are disposed in the side-by-side relationship in the plane direction of the wiring board 2. As illustrated in FIG. 3C, the ground plane 15A and the ground plane 15B are disposed in the side-by-side relationship in the plane direction of the wiring board 2. As illustrated in FIG. 3D, the land 16A and the land 16B are disposed in the side-by-side relationship in the plane direction of the wiring board 2.

As depicted in FIGS. 3A through 3D, side faces of the ground planes 11A, 11B, 15A, 15B are formed partially in a non-linear shape, while side faces of the power planes 14A, 14B and the lands 16A, 16B are formed partially in a linear shape. Namely, the side faces of the ground planes 11A, 11B, 15A, 15B are partially non-planar, while the side faces of the power planes 14A, 14B and the lands 16A, 16B are partially planar.

As depicted in FIG. 3A, the side face, adjacent to the ground plane 11B, of the ground plane 11A takes the non-linear shape (zigzag shape). To be specific, the side face, adjacent to the ground plane 11B, of the ground plane 11A is provided with a triangular crest (projection) and a triangular trough (dent), alternately and repeatedly. In the specification, the side face, adjacent to the ground plane 11B, of the ground plane 11A is referred to also as the adjacent side face of the ground plane 11A. In the first working example, the crest provided on the adjacent side face of the ground plane 11A is a portion projected from A2 in FIG. 3A toward an arrangement direction of the ground plane 11B. In the first working example, the trough provided on the adjacent side face of the ground plane 11A is a portion dented from A2 in FIG. 3A toward the arrangement direction of the ground plane 11B.

As illustrated in FIG. 3A, the side face, adjacent to the ground plane 11A, of the ground plane 11B takes the non-linear shape (zigzag shape). Specifically, the side face, adjacent to the ground plane 11A, of the ground plane 11B is provided with the triangular crest (projection) and the triangular trough (dent), alternately and repeatedly. In the specification, the side face, adjacent to the ground plane 11A, of the ground plane 11B is referred to also as the adjacent side face of the ground plane 11B. In the first working example, the crest provided on the adjacent side face of the ground plane 11B is a portion projected from A4 in FIG. 3A toward the arrangement direction of the ground plane 11A. In the first working example, the trough provided on the adjacent side face of the ground plane 11B is a portion dented from A4 in FIG. 3A toward the arrangement direction of the ground plane 11A.

As depicted in FIG. 3B, the side face, adjacent to the power plane 14B, of the power plane 14A takes the linear shape. To be specific, the side face, adjacent to the power plane 14B, of the power plane 14A is planar. In the specification, the side face, adjacent to the power plane 14B, of the power plane 14A is referred to also as an adjacent side face of the of the power plane 14A. As illustrated in FIG. 3B, the side face, adjacent to the power plane 14A, of the power plane 14B takes the linear shape. Specifically, the side face, adjacent to the power plane 14A, of the power plane 14B is planar. In the specification, the side face, adjacent to the power plane 14A, of the power plane 14B is referred to also as the adjacent side face of the of the power plane 14B.

As depicted in FIG. 3C, the side face, adjacent to the ground plane 15B, of the ground plane 15A takes the non-linear shape (zigzag shape). To be specific, the side face, adjacent to the ground plane 15B, of the ground plane 15A is provided with the triangular crest (projection) and the triangular trough (dent), alternately and repeatedly. In the specification, the side face, adjacent to the ground plane 15B, of the ground plane 15A is referred to also as the adjacent side face of the ground plane 15A. In the first working example, the crest provided on the adjacent side face of the ground plane 15A is a portion projected from A7 in FIG. 3C toward an arrangement direction of the ground plane 15B. In the first working example, the trough provided on the adjacent side face of the ground plane 15A is a portion dented from A7 in FIG. 3C toward the arrangement direction of the ground plane 15B.

As depicted in FIG. 3C, the side face, adjacent to the ground plane 15A, of the ground plane 15B takes the non-linear shape (zigzag shape). To be specific, the side face, adjacent to the ground plane 15A, of the ground plane 15B is provided with the triangular crest (projection) and the triangular trough (dent), alternately and repeatedly. In the specification, the side face, adjacent to the ground plane 15A, of the ground plane 15B is referred to also as the adjacent side face of the ground plane 15B. In the first working example, the crest provided on the adjacent side face of the ground plane 15B is a portion projected from A9 in FIG. 3C toward an arrangement direction of the ground plane 15A. In the first working example, the trough provided on the adjacent side face of the ground plane 15B is a portion dented from A9 in FIG. 3C toward the arrangement direction of the ground plane 15A.

As illustrated in FIG. 3D, the side face, adjacent to the land 16B, of the land 16A takes a linear shape. Specifically, the side face, adjacent to the land 16B, of the land 16A is planar. In the specification, the side face, adjacent to the land 16B, of the land 16A is referred to also as the adjacent side face of the land 16A. As depicted in FIG. 3D, the side face, adjacent to the land 16A, of the land 16B takes the linear shape. To be specific, the side face, adjacent to the land 16A, of the land 16B is planar. In the specification, the side face, adjacent to the land 16A, of the land 16B is referred to also as the adjacent side face of the land 16B.

The ground plane 11A and the ground plane 11B are disposed apart at a predetermined distance. The insulating layer 20 is formed between the ground plane 11A and the ground plane 11B. The insulating layer 21 may be formed between the ground plane 11A and the ground plane 11B. The insulating layer 20 and the insulating layer 21 may also be formed between the ground plane 11A and the ground plane 11B. A distance between the adjacent side face of the ground plane 11A and the adjacent side face of the ground plane 11B (a distance between A1 and A3 in FIGS. 2A and 2B, a distance between A2 and A4 in FIGS. 2A and 2C, and a distance between A3 and A5 in FIGS. 2A and 2D) may be set equal to or larger than 50 μm but equal to or smaller than 300 μm.

With respect to the adjacent side face of the ground plane 11A, a distance between a bottom point (which is an intersection between A2 and A11 in FIG. 3A) and a middle point (which is an intersection between A2 and A12 in FIG. 3A) of the non-linear shape, may be set equal to or larger than, e.g., 100 μm but equal to or smaller than 300 μm. In regard to the adjacent side face of the ground plane 11B, a distance between the middle point (which is the intersection between A2 and A12 in FIG. 3A) and an apex (which is the intersection between A3 and A13 in FIG. 3A) of the non-linear shape, may be set equal to or larger than, for instance, 100 μm but equal to or smaller than 300 μm. In connection with the adjacent side face of the ground plane 11A, a distance between the bottom point (which is the intersection between A1 and A11 in FIG. 3A) and the apex (which is the intersection between A3 and A13 in FIG. 3A) of the non-linear shape, may be set equal to or larger than, for example, 200 μm but equal to or smaller than 600 µm. That is to say, a pitch between crooked points of the adjacent side face of the ground plane 11A may be set equal to or larger than, e.g., 200 µm but equal to or smaller than 600 µm.

With respect to the adjacent side face of the ground plane 11B, a distance between the apex (which is the intersection between A3 and A11 in FIG. 3A) and the middle point (which is the intersection between A4 and A12 in FIG. 3A) of the non-linear shape, may be set equal to or larger than, for example, 100 µm but equal to or smaller than 300 µm. As for the adjacent side face of the ground plane 11B, a distance between the middle point (which is the intersection between A4 and A12 in FIG. 3A) and the bottom point (which is the intersection between A5 and A13 in FIG. 3A) of the non-linear shape, may be set equal to or larger than, for example, 100 µm but equal to or smaller than 300 µm. In regard to the adjacent side face of the ground plane 11B, a distance between the apex (which is the intersection between A3 and A11 in FIG. 3A) and the bottom point (which is the intersection between A5 and A13 in FIG. 3A) of the non-linear shape, may be set equal to or larger than, for example, 200 µm but equal to or smaller than 600 µm. That is to say, a pitch between the crooked points of the adjacent side face of the ground plane 11B may be set equal to or larger than, for example, 200 µm but equal to or smaller than 600 µm.

The power plane 14A and the power plane 14B are disposed apart at the predetermined distance. The insulating layer 21 is formed between the power plane 14A and the power plane 14B. The insulating layer 22 may be formed between the power plane 14A and the power plane 14B. The insulating layer 21 and the insulating layer 22 may also be formed between the power plane 14A and the power plane 14B. A distance between the adjacent side face of the power plane 14A and the adjacent side face of the power plane 14B (a distance between A2 and A4 in FIG. 3B) may be set equal to or larger than 50 µm but equal to or smaller than 300 µm.

The ground plane 15A and the ground plane 15B are disposed apart at a predetermined distance. The insulating layer 22 is formed between the ground plane 15A and the ground plane 15B. The insulating layer 23 may be formed between the ground plane 15A and the ground plane 15B. The insulating layer 22 and the insulating layer 23 may also be formed between the ground plane 15A and the ground plane 15B. A distance between the adjacent side face of the ground plane 15A and the adjacent side face of the ground plane 15B (a distance between A6 and A8 in FIG. 2B, a distance between A7 and A9 in FIG. 2C, and a distance between A8 and A10 in FIG. 2D) may be set equal to or larger than 50 µm but equal to or smaller than 300 µm.

With respect to the adjacent side face of the ground plane 15A, a distance between the bottom point (which is the intersection between A6 and A14 in FIG. 3C) and the middle point (which is the intersection between A7 and A15 in FIG. 3C) of the non-linear shape, may be set equal to or larger than, for example, 100 µm but equal to or smaller than 300 µm. As for the adjacent side face of the ground plane 15B, a distance between the middle point (which is the intersection between A7 and A15 in FIG. 3C) and the apex (which is the intersection between A8 and A16 in FIG. 3C) of the non-linear shape, may be set equal to or larger than, for example, 100 µm but equal to or smaller than 300 µm. In regard to the adjacent side face of the ground plane 15A, a distance between the bottom point (which is the intersection between A6 and A14 in FIG. 3C) and the apex (which is the intersection between A8 and A16 in FIG. 3C) of the non-linear shape, may be set equal to or larger than, for example, 200 µm but equal to or smaller than 600 µm. Namely, a pitch between the crooked points of the adjacent side face of the ground plane 15A may be set equal to or larger than, for example, 200 µm but equal to or smaller than 600 µm.

With respect to the adjacent side face of the ground plane 15B, a distance between the apex (which is the intersection between A8 and A14 in FIG. 3C) and the middle point (which is the intersection between A9 and A15 in FIG. 3C) of the non-linear shape, may be set equal to or larger than, for example, 100 µm but equal to or smaller than 300 µm. As for the adjacent side face of the ground plane 15B, a distance between the middle point (which is the intersection between A9 and A15 in FIG. 3C) and the bottom point (which is the intersection between A10 and A16 in FIG. 3C) of the non-linear shape, may be set equal to or larger than, for example, 100 µm but equal to or smaller than 300 µm. In regard to the adjacent side face of the ground plane 15B, a distance between the apex (which is the intersection between A8 and A14 in FIG. 3C) and the bottom point (which is the intersection between A10 and A16 in FIG. 3C) of the non-linear shape, may be set equal to or larger than, for example, 200 µm but equal to or smaller than 600 µm. That is to say, a pitch between the crooked points of the adjacent side face of the ground plane 15B may be set equal to or larger than, for example, 200 µm but equal to or smaller than 600 µm.

The land 16A and the land 16B are disposed apart at the predetermined distance. The insulating layer 24 is formed between the land 16A and the land 16B. The insulating layer 23 may also be formed between the land 16A and the land 16B. The insulating layer 23 and the insulating layer 24 may also be formed between the land 16A and the land 16B. A distance between the adjacent side face of the land 16A and the adjacent side face of the land 16B (a distance between A7 and A9 in FIG. 3D) may be set equal to or larger than, for example, 50 µm but equal to or smaller than 300 µm.

As illustrated in FIG. 2B, the trough provided on the adjacent side face of the ground plane 11A is dented from the portion (A2 in FIG. 3B) of the linear shape of the adjacent side face of the power plane 14A toward the arrangement direction of the ground plane 11B. Accordingly, as depicted in FIG. 2B, the power plane 14A exists downwardly of the trough provided on the adjacent side face of the ground plane 11A in the thickness direction of the wiring board 2. To be specific, the wiring board 2 includes an overlapped area of the trough provided on the adjacent side face of the ground plane 11A and the power plane 14A in the thickness direction of the wiring board 2. As illustrated in FIG. 2D, the crest provided on the adjacent side face of the ground plane 11A is projected from the portion (A2 in FIG. 3B) of the linear shape of the adjacent side face of the power plane 14A toward the arrangement direction of the ground plane 11B. Accordingly, as depicted in FIG. 2D, the wiring board 2 includes an area in which the power plane 14A does not exist downwardly of the crest provided on the adjacent side face of the ground plane 11A in the thickness direction of the wiring board 2.

A projection quantity of the crest or a dent quantity of the trough provided on the adjacent side face of the ground plane 11A may be set to an any value. The projection quantity of the crest provided on the adjacent side face of the ground plane 11A is a quantity of the projection from a straight line passing through the respective middle points of the non-linear shape of the ground plane 11A in the case of drawing the straight line so as to pass through the respective middle points of the non-linear shape of the ground plane 11A. The dent quantity of the trough provided on the adjacent side face of the ground plane 11A is a quantity of the dent from the straight line passing through the respective middle points of the non-linear shape of the ground plane 11A in the case of drawing the straight line so as to pass through the respective middle points of the non-linear shape of the ground plane 11A. The projection quantity of the crest provided on the adjacent side face of the ground plane 11A may be set equal to or larger than, for example, 25 μm but equal to or smaller than 150 μm. The dent quantity of the trough provided on the adjacent side face of the ground plane 11A may be set equal to or larger than, for example, 25 μm but equal to or smaller than 150 μm.

As illustrated in FIG. 2B, the crest provided on the adjacent side face of the ground plane 11B is projected from the portion (A4 in FIG. 3B) of the linear shape of the adjacent side face of the power plane 14B toward the arrangement direction of the ground plane 11A. Accordingly, as depicted in FIG. 2B, the wiring board 2 includes an area in which the power plane 14B does not exist downwardly of the crest provided on the adjacent side face of the ground plane 11B in the thickness direction of the wiring board 2. As depicted in FIG. 2D, the trough provided on the adjacent side face of the ground plane 11B is dented from the portion (A4 in FIG. 3B) of the linear shape of the adjacent side face of the power plane 14A toward the arrangement direction of the ground plane 11A. Accordingly, as depicted in FIG. 2D, the power plane 14B exists downwardly of the trough provided on the adjacent side face of the ground plane 11B in the thickness direction of the wiring board 2. That is to say, the wiring board 2 includes an overlapped area of the trough provided on the adjacent side face of the ground plane 11B and the power plane 14B in the thickness direction of the wiring board 2.

A projection quantity of the crest or a dent quantity of the trough provided on the adjacent side face of the ground plane 11B may be set to an any value. The projection quantity of the crest provided on the adjacent side face of the ground plane 11B is a quantity of the projection from a straight line passing through the respective middle points of the non-linear shape of the ground plane 11B in the case of drawing the straight line so as to pass through the respective middle points of the non-linear shape of the ground plane 11B. The dent quantity of the trough provided on the adjacent side face of the ground plane 11B is a quantity of the dent from the straight line passing through the respective middle points of the non-linear shape of the ground plane 11A in the case of drawing the straight line so as to pass through the respective middle points of the non-linear shape of the ground plane 11B. The projection quantity of the crest provided on the adjacent side face of the ground plane 11B may be set equal to or larger than, for example, 25 μm but equal to or smaller than 150 μm. The dent quantity of the trough provided on the adjacent side face of the ground plane 11B may be set equal to or larger than, for example, 25 μm but equal to or smaller than 150 μm.

If the ground plane 11A and the power plane 14B are overlapped in the thickness direction of the wiring board 2, a voltage fluctuation of one plane affects a voltage of the other plane, resulting in deteriorating an electric characteristic of the ground plane 11A or the power plane 14B. Further, if the ground plane 11B and the power plane 14A are overlapped in the thickness direction of the wiring board 2, the voltage fluctuation of one plane affects the voltage of the other plane, resulting in deteriorating the electric characteristic of the ground plane 11B or the power plane 14A. Accordingly, as illustrated in FIGS. 2B through 2D, the ground plane 11A and the power plane 14B are disposed so that the ground plane 11A and the power plane 14B are not overlapped in the thickness direction of the wiring board 2. Still further, as illustrated in FIGS. 2B through 2D, the ground plane 11B and the power plane 14A are disposed so that the ground plane 11B and the power plane 14A are not overlapped in the thickness direction of the wiring board 2.

In the first working example, the ground plane 11A and the power plane 14A are so disposed as to be shifted in the plane direction of the wiring board 2. Further, in the first working example, the ground plane 11B and the power plane 14B are so disposed as to be shifted in the plane direction of the wiring board 2.

If the apex portion of the non-linear shape of the adjacent side face of the ground plane 11A is coincident with the portion of the linear shape of the power plane 14A in the thickness direction of the wiring board 2, it is feasible to further restrain the crack from spreading in the thickness direction of the wiring board 2. Moreover, if the apex portion of the non-linear shape of the adjacent side face of the ground plane 11B is coincident with the portion of the linear shape of the power plane 14B in the thickness direction of the wiring board 2, it is possible to further restrain the crack from spreading in the thickness direction of the wiring board 2. Whereas if the distance between the ground plane 11A and the power plane 14B becomes excessively short, however, the voltage fluctuation of one plane affects the voltage of the other plane, whereby there is a possibility of deteriorating the electric characteristic of the ground plane 11A or the power plane 14B. Further, if the distance between the ground plane 11B and the power plane 14A becomes excessively short, the voltage fluctuation of one plane affects the voltage of the other plane, whereby there is the possibility of deteriorating the electric characteristic of the ground plane 11B or the power plane 14A.

Therefore, it is desirable to take into consideration a balance between the restraint of the spread of the crack and the restraint of the deterioration of the electric characteristic of the ground plane 11A or the power plane 14B. Furthermore, it is desirable to take into consideration the balance between the restraint of the spread of the crack and the restraint of the deterioration of the electric characteristic of the ground plane 11B or the power plane 14A. It is preferable from this point that a shift quantity between the apex portion of the non-linear shape of the adjacent side face of the ground plane 11A and the portion of the linear shape of the adjacent side face of the power plane 14A is set to approximately a half of the distance between the adjacent side face of the ground plane 11A and the adjacent side face of the ground plane 11B. Moreover, it is preferable that a shift quantity between the apex portion of the non-linear shape of the adjacent side face of the ground plane 11B and the portion of the linear shape of the adjacent side face of the power plane 14B is set to approximately a half of the distance between the adjacent side face of the ground plane 11A and the adjacent side face of the ground plane 11B.

The shift quantity between the apex portion of the non-linear shape of the adjacent side face of the ground plane 11A and the portion of the linear shape of the adjacent side face of the power plane 14A is referred to as a shift quantity A. The shift quantity A is, when the ground plane 11A and the power plane 14A are overlapped, the shortest distance between the apex portion of the non-linear shape of the adjacent side face of the ground plane 11A and the portion of the linear shape of the adjacent side face of the power plane 14A. Note that the power plane 14A is so disposed as to be shifted in the direction opposite to the arrangement direction of the power plane 14B.

The shift quantity between the apex portion of the non-linear shape of the adjacent side face of the ground plane 11B and the portion of the linear shape of the adjacent side face of the power plane 14B is referred to as a shift quantity B. The shift quantity B is, when the ground plane 11B and the power plane 14B are overlapped, the shortest distance between the apex portion of the non-linear shape of the adjacent side face of the ground plane 11B and the portion of the linear shape of the adjacent side face of the power plane 14B. Note that the power plane 14B is so disposed as to be shifted in the direction opposite to the arrangement direction of the power plane 14A.

As depicted in FIG. 2B, the trough provided on the adjacent side face of the ground plane 15A is dented from the portion (A2 in FIG. 3B) of the linear shape of the adjacent side face of the power plane 14A toward the arrangement direction of the ground plane 15B. Accordingly, as depicted in FIG. 2B, the wiring board 2 includes an area in which the ground plane 15A does not exist downwardly of the power plane 14A in the thickness direction of the wiring board 2. As illustrated in FIG. 2D, the crest provided on the adjacent side face of the ground plane 15A is projected from the portion (A2 in FIG. 3B) of the linear shape of the adjacent side face of the power plane 14A toward the arrangement direction of the ground plane 15B. Hence, as depicted in FIG. 2D, the wiring board 2 includes an area in which the power plane 14A does not exist upwardly of the crest provided on the adjacent side face of the ground plane 15A in the thickness direction of the wiring board 2.

A projection quantity of the crest or a dent quantity of the trough provided on the adjacent side face of the ground plane 15A may be set to an any value. The projection quantity of the crest provided on the adjacent side face of the ground plane 15A is a quantity of the projection from a straight line passing through the respective middle points of the non-linear shape of the ground plane 15A in the case of drawing the straight line so as to pass through the respective middle points of the non-linear shape of the ground plane 15A. The dent quantity of the trough provided on the adjacent side face of the ground plane 15A is a quantity of the dent from the straight line passing through the respective middle points of the non-linear shape of the ground plane 15A in the case of drawing the straight line so as to pass through the respective middle points of the non-linear shape of the ground plane 15A. The projection quantity of the crest provided on the adjacent side face of the ground plane 15A may be set equal to or larger than, for example, 25 μm but equal to or smaller than 150 μm. The dent quantity of the trough provided on the adjacent side face of the ground plane 15A may be set equal to or larger than, for example, 25 μm but equal to or smaller than 150 μm.

As illustrated in FIG. 2B, the crest provided on the adjacent side face of the ground plane 15B is projected from the portion (A4 in FIG. 3B) of the linear shape of the adjacent side face of the power plane 14B toward the arrangement direction of the ground plane 15A. Accordingly, as depicted in FIG. 2B, the wiring board 2 includes an area in which the power plane 14B does not exist upwardly of the crest provided on the adjacent side face of the ground plane 15B in the thickness direction of the wiring board 2. As depicted in FIG. 2D, the trough provided on the adjacent side face of the ground plane 15B is dented from the portion (A4 in FIG. 3B) of the linear shape of the adjacent side face of the power plane 14B toward the arrangement direction of the ground plane 15A. Accordingly, as depicted in FIG. 2D, the wiring board 2 includes an area in which the ground plane 15B does not exist downwardly of the power plane 14B in the thickness direction of the wiring board 2.

A projection quantity of the crest or a dent quantity of the trough provided on the adjacent side face of the ground plane 15B may be set to an any value. The projection quantity of the crest provided on the adjacent side face of the ground plane 15B is a quantity of the projection from a straight line passing through the respective middle points of the non-linear shape of the ground plane 15B in the case of drawing the straight line so as to pass through the respective middle points of the non-linear shape of the ground plane 15B. The dent quantity of the trough provided on the adjacent side face of the ground plane 15B is a quantity of the dent from the straight line passing through the respective middle points of the non-linear shape of the ground plane 15B in the case of drawing the straight line so as to pass through the respective middle points of the non-linear shape of the ground plane 15B. The projection quantity of the crest provided on the adjacent side face of the ground plane 15A may be set equal to or larger than, for example, 25 μm but equal to or smaller than 150 μm. The dent quantity of the trough provided on the adjacent side face of the ground plane 15B may be set equal to or larger than, for example, 25 μm but equal to or smaller than 150 μm.

If the power plane 14A and the ground plane 15B are overlapped in the thickness direction of the wiring board 2, a voltage fluctuation of one plane affects a voltage of the other plane, resulting in deteriorating an electric characteristic of the power plane 14A or the ground plane 15B. Further, if the power plane 14B and the ground plane 15A are overlapped in the thickness direction of the wiring board 2, the voltage fluctuation of one plane affects the voltage of the other plane, resulting in deteriorating the electric characteristic of the power plane 14A or the ground plane 15B. Accordingly, as illustrated in FIGS. 2B through 2D, the power plane 14A and the ground plane 15B are disposed so that the power plane 14A and the ground plane 15B are not overlapped in the thickness direction of the wiring board 2. Still further, as illustrated in FIGS. 2B through 2D, the power plane 14B and the ground plane 15A are disposed so that the power plane 14B and the ground plane 15A are not overlapped in the thickness direction of the wiring board 2.

In the first working example, the ground plane 11A and the ground plane 15A are disposed so as not to shift the overlap between the adjacent side face of the ground plane 11A and the adjacent side face of the ground plane 15A in the thickness direction of the wiring board 2. Namely, the ground plane 11A and the ground plane 15A are disposed so that the adjacent side face of the ground plane 11A is overlapped in alignment with the adjacent side face of the ground plane 15A in the thickness direction of the wiring board 2. Without being limited to this arrangement, the ground plane 11A and the ground plane 15A may be disposed so that the adjacent side face of the ground plane 11A is overlapped out of alignment with the adjacent side face of the ground plane 15A in the thickness direction of the wiring board 2.

In the first working example, the ground plane 11B and the ground plane 15B are disposed so as not to shift the overlap between the adjacent side face of the ground plane 11B and the adjacent side face of the ground plane 15B in the thickness direction of the wiring board 2. Namely, the ground plane 11B and the ground plane 15B are disposed so that the adjacent side face of the ground plane 11B is overlapped in alignment with the adjacent side face of the ground plane 15B in the thickness direction of the wiring board 2. Without being limited to this arrangement, the ground plane 11B and the ground plane 15B may be disposed so that the adjacent side face of the ground plane 11B is overlapped out of alignment with the adjacent side face of the ground plane 15B in the thickness direction of the wiring board 2.

In the first working example, the power plane 14A and the ground plane 15A are so disposed as to be shifted in the plane direction of the wiring board 2. Further, in the first working example, the power plane 14B and the ground plane 15B are so disposed as to be shifted in the plane direction of the wiring board 2.

If the portion of the linear shape of the power plane 14A is coincident with the apex portion of the non-linear shape of the adjacent side face of the ground plane 15A in the thickness direction of the wiring board 2, it is feasible to further restrain the crack from spreading in the thickness direction of the wiring board 2. Moreover, if the portion of the linear shape of the power plane 14B is coincident with the apex portion of the non-linear shape of the adjacent side face of the ground plane 15B in the thickness direction of the wiring board 2, it is possible to further restrain the crack from spreading in the thickness direction of the wiring board 2. Whereas if the distance between the power plane 14A and the ground plane 15B becomes excessively short, however, the voltage fluctuation of one plane affects the voltage of the other plane, whereby there is a possibility of deteriorating the electric characteristic of the power plane 14A or the ground plane 15B. Further, if the distance between the power plane 14B and the ground plane 15A becomes excessively short, the voltage fluctuation of one plane affects the voltage of the other plane, whereby there is a possibility of deteriorating the electric characteristic of the power plane 14B or the ground plane 15A.

Therefore, it is desirable to take into consideration a balance between the restraint of the spread of the crack and the restraint of the deterioration of the electric characteristic of the power plane 14A or the ground plane 15B. Furthermore, it is desirable to take into consideration the balance between the restraint of the spread of the crack and the restraint of the deterioration of the electric characteristic of the power plane 14B or the ground plane 15A. It is preferable from this point that a shift quantity between the portion of the linear shape of the power plane 14A and the apex portion of the non-linear shape of the adjacent side face of the ground plane 15A is set to approximately a half of the distance between the power plane 14A and the power plane 14B. Moreover, it is preferable that a shift quantity between the portion of the linear shape of the power plane 14B and the apex portion of the non-linear shape of the adjacent side face of the ground plane 15B is set to approximately a half of the distance between the power plane 14A and the power plane 14B.

The shift quantity between the portion of the linear shape of the adjacent side face of the power plane 14A and the apex portion of the non-linear shape of the adjacent side face of the ground plane 15A is referred to as a shift quantity C. The shift quantity C is, when the power plane 14A and the ground plane 15A are overlapped, the shortest distance between the portion of the linear shape of the adjacent side face of the power plane 14A and the apex portion of the non-linear shape of the adjacent side face of the ground plane 15A. Note that the power plane 14A is so disposed as to be shifted in the direction opposite to the arrangement direction of the power plane 14B.

The shift quantity between the portion of the linear shape of the adjacent side face of the power plane 14B and the apex portion of the non-linear shape of the adjacent side face of the ground plane 15B is referred to as a shift quantity D. The shift quantity D is, when the power plane 14B and the ground plane 15B are overlapped, the shortest distance between the portion of the linear shape of the adjacent side face of the power plane 14B and the apex portion of the non-linear shape of the adjacent side face of the ground plane 15B. Note that the power plane 14B is so disposed as to be shifted in the direction opposite to the arrangement direction of the power plane 14A.

As depicted in FIG. 2B, the trough provided on the adjacent side face of the ground plane 15A is dented from the portion (A7 in FIG. 3D) of the linear shape of the adjacent side face of the land 16A toward the arrangement direction of the ground plane 15B. Accordingly, as depicted in FIG. 2B, the land 16A exists downwardly of the trough provided on the adjacent side face of the ground plane 15A in the thickness direction of the wiring board 2. Namely, the wiring board 2 includes an overlapped area of the trough provided on the adjacent side face of the ground plane 15A and the land 16A in the thickness direction of the wiring board 2. As depicted in FIG. 2D, the crest provided on the adjacent side face of the ground plane 15A is projected from the portion (A7 in FIG. 3D) of the linear shape of the adjacent side face of the land 16A toward the arrangement direction of the ground plane 15B. Therefore, as depicted in FIG. 2D, the wiring board 2 includes an area in which the land 16A does not exist downwardly of the crest provided on the adjacent side face of the ground plane 15A in the thickness direction of the wiring board 2.

As depicted in FIG. 2B, the crest provided on the adjacent side face of the ground plane 15B is projected from the portion (A9 in FIG. 3D) of the linear shape of the adjacent side face of the land 16B toward the arrangement direction of the ground plane 15A. Hence, as depicted in FIG. 2B, the wiring board 2 includes an area in which the land 16B does not exist downwardly of the crest provided on the adjacent side face of the ground plane 15B in the thickness direction of the wiring board 2. As depicted in FIG. 2D, the trough provided on the adjacent side face of the ground plane 15B is dented from the portion (A9 in FIG. 3D) of the linear shape of the adjacent side face of the land 16B toward the arrangement direction of the ground plane 15A. Accordingly, as depicted in FIG. 2D, the land 16B exists downwardly of the trough provided on the adjacent side face of the ground plane 15B in the thickness direction of the wiring board 2. That is to say, the wiring board 2 includes an overlapped area of the trough provided on the adjacent side face of the ground plane 15B and the land 16B in the thickness direction of the wiring board 2.

In the first working example, the ground plane 15A and the land 16A are so disposed to be shifted in the plane direction of the wiring board 2. Furthermore, in the first working example, the ground plane 15B and the land 16B are so disposed to be shifted in the plane direction of the wiring board 2.

If the apex portion of the non-linear shape of the adjacent side face of the ground plane 15A is coincident with the portion of the linear shape of the land 16A in the thickness direction of the wiring board 2, it is feasible to further restrain the crack from spreading in the thickness direction of the wiring board 2. Moreover, if the apex portion of the non-linear shape of the adjacent side face of the ground plane 15B is coincident with the portion of the linear shape of the land 16B in the thickness direction of the wiring board 2, it is feasible to further restrain the crack from spreading in the thickness direction of the wiring board 2. Whereas if the distance between the ground plane 15A and the land 16B becomes excessively short, however, the voltage fluctuation of one plane affects the voltage of the other plane, whereby there is a possibility of deteriorating the electric characteristic of the ground plane 15A or the land 16B. Further, if the distance between the ground plane 15B and the land 16A becomes excessively short, the voltage fluctuation of one plane affects the voltage of the other plane, whereby there is a possibility of deteriorating the electric characteristic of the ground plane 15B or the land 16A.

Hence, it is desirable to take into consideration a balance between the restraint of the spread of the crack and the restraint of the deterioration of the electric characteristic of the ground plane 15A or the land 16B. Moreover, it is desirable to take account of a balance between the restraint of the spread of the crack and the restraint of the deterioration of the electric characteristic of the ground plane 15B or the land 16A. It is preferable from this point that a shift quantity between the apex portion of the non-linear shape of the adjacent side face of the ground plane 15A and the portion of the linear shape of the adjacent side face of the land 16A is set to approximately a half of the distance between the adjacent side face of the ground plane 15A and the adjacent side face of the land 16B. Furthermore, it is preferable that a shift quantity between the apex portion of the non-linear shape of the adjacent side face of the ground plane 15B and the portion of the linear shape of the adjacent side face of the land 16B is set to approximately a half of the distance between the adjacent side face of the ground plane 15A and the adjacent side face of the land 16B.

The shift quantity between the apex portion of the non-linear shape of the adjacent side face of the ground plane 15A and the portion of the linear shape of the adjacent side face of the land 16A is referred to as a shift quantity E. The shift quantity E is, when the ground plane 15A and the land 16A are overlapped, the shortest distance between the apex portion of the non-linear shape of the adjacent side face of the ground plane 15A and the portion of the linear shape of the adjacent side face of the land 16A. Note that the land 16A is so disposed as to be shifted in the direction opposite to the arrangement direction of the land 16B.

The shift quantity between the apex portion of the non-linear shape of the adjacent side face of the ground plane 15B and the portion of the linear shape of the adjacent side face of the land 16B is referred to as a shift quantity F. The shift quantity F is, when the ground plane 15B and the land 16B are overlapped, the shortest distance between the apex portion of the non-linear shape of the adjacent side face of the ground plane 15B and the portion of the linear shape of the adjacent side face of the land 16B. Note that the land 16B is so disposed as to be shifted in the direction opposite to the arrangement direction of the land 16A.

If the ground plane 15A and the land 16B are overlapped in the thickness direction of the wiring board 2, the voltage fluctuation of one plane affects the voltage of the other plane, thereby deteriorating the electric characteristic of the ground plane 15A or the land 16B. Moreover, if the ground plane 15B and the land 16A are overlapped in the thickness direction of the wiring board 2, the voltage fluctuation of one plane affects the voltage of the other plane, thereby deteriorating the electric characteristic of the ground plane 15B or the land 16B. Therefore, as illustrated in FIGS. 2B through 2D, the ground plane 15A and the land 16B are disposed so that the ground plane 15A and the land 16B are not overlapped in the thickness direction of the wiring board 2. Further, as illustrated in FIGS. 2B through 2D, the ground plane 15B and the land 16A are disposed so that the ground plane 15B and the land 16A are not overlapped in the thickness direction of the wiring board 2.

In the first working example, the power plane 14A and the land 16A are disposed so as not to shift the overlap between the adjacent side face of the power plane 14A and the adjacent side face of the land 16A in the thickness direction of the wiring board 2. Namely, the power plane 14A and the land 16A are disposed so that the adjacent side face of the power plane 14A is overlapped in alignment with the adjacent side face of the land 16A in the thickness direction of the wiring board 2. Without being limited to this arrangement, the power plane 14A and the land 16A may be disposed so that the adjacent side face of the power plane 14A is overlapped out of alignment with the adjacent side face of the land 16A in the thickness direction of the wiring board 2.

In the first working example, the power plane 14B and the land 16B are disposed so as not to shift the overlap between the adjacent side face of the power plane 14B and the adjacent side face of the land 16B in the thickness direction of the wiring board 2. Namely, the power plane 14B and the land 16B are disposed so that the adjacent side face of the power plane 14B is overlapped in alignment with the adjacent side face of the land 16B in the thickness direction of the wiring board 2. Without being limited to this arrangement, the power plane 14B and the land 16B may be disposed so that the adjacent side face of the power plane 14B is overlapped out of alignment with the adjacent side face of the land 16B in the thickness direction of the wiring board 2.

The crack caused in the insulating layer 20 spreads in the plane direction and the thickness direction of the wiring board 2. The crest is provided on the adjacent side face of the ground plane 11A, thereby increasing a possibility that the crack spreading through the insulating layer 20 in the plane direction of the wiring board 2 collides with the ground plane 11A as compared with the case where the side face of the ground plane 11A takes the linear shape. When the crack spreading through the insulating layer 20 in the plane direction of the wiring board 2 collides with the ground plane 11A, the crack terminates there but does not spread in the plane direction of the wiring board 2. Accordingly, the crests provided on the adjacent side face of the ground plane 11A block the crack spreading through the insulating layer 20 in the plane direction of the wiring board 2, thereby making it feasible to restrain the crack from spreading in the plane direction of the wiring board 2.

The crest is provided on the adjacent side face of the ground plane 11B, thereby increasing a possibility that the crack spreading through the insulating layer 20 in the plane direction of the wiring board 2 collides with the ground plane 11B as compared with the case where the side face of the ground plane 11B takes the linear shape. When the crack spreading through the insulating layer 20 in the plane direction of the wiring board 2 collides with the ground plane 11B, the crack terminates there but does not spread in the plane direction of the wiring board 2. Accordingly, the crests provided on the adjacent side face of the ground plane 11B block the crack spreading through the insulating layer 20 in the plane direction of the wiring board 2, thereby making it possible to restrain the crack from spreading in the plane direction of the wiring board 2.

As illustrated in FIG. 3A, the crests provided on the adjacent side face of the ground plane 11A and the crests provided on the adjacent side face of the ground plane 11B are alternately and repeatedly disposed between the ground plane 11A and the ground plane 11B. With this arrangement, as compared with the case where each of the side faces of the ground planes 11A and 11B takes the linear shape, there increases the possibility that the crack spreading through the insulating layer 20 in the plane direction of the wiring board 2 collides with the ground plane 11A or 11B. The crack spreading through the insulating layer 20 in the plane direction of the wiring board 2 is blocked by the crest provided on the adjacent side face of the ground plane 11A or by the crest provided on the adjacent side face of the ground plane 11B, whereby it is feasible to restrain the crack from spreading in the plane direction of the wiring board 2.

There is a case in which the crack spreading through the insulating layer 20, without colliding with the ground plane 11A, passes through the troughs provided on the adjacent side face of the ground plane 11A and spreads through the insulating layer 21 in the thickness direction of the wiring board 2. The power plane 14A exists downwardly of the trough provided on the adjacent side face of the ground plane 11A in the thickness direction of the wiring board 2. Therefore, the crack spreading through the insulating layer 21 in the thickness direction of the wiring board 2 collides with the power plane 14A. When the crack spreading through the insulating layer 21 in the thickness direction of the wiring board 2 collides with the power plane 14A, the crack terminates but does not spread through the insulating layer 22. Hence, the power plane 14A blocks the crack passing through the trough provided on the adjacent side face of the ground plane 11A, thereby making it possible to restrain the crack from spreading the thickness direction of the wiring board 2.

There is a case in which the crack spreading through the insulating layer 20, without colliding with the ground plane 11B, passes through the troughs provided on the adjacent side face of the ground plane 11B and spreads through the insulating layer 21 in the thickness direction of the wiring board 2. The power plane 14B exists downwardly of the trough provided on the adjacent side face of the ground plane 11B in the thickness direction of the wiring board 2. Consequently, the crack spreading through the insulating layer 21 in the thickness direction of the wiring board 2 collides with the power plane 14B. When the crack spreading through the insulating layer 21 in the thickness direction of the wiring board 2 collides with the power plane 14B, the crack terminates but does not spread through the insulating layer 22. Therefore, the power plane 14B blocks the crack passing through the trough provided on the adjacent side face of the ground plane 11B, thereby making it feasible to restrain the crack from spreading the thickness direction of the wiring board 2.

The crest is provided on the adjacent side face of the ground plane 15A, thereby increasing, in comparison with the case where the side face of the ground plane 15A takes the linear shape, the possibility that the crack spreading through the insulating layer 22 in the plane direction of the wiring board 2 collides with the ground plane 15A. The crack spreading through the insulating layer 22 in the plane direction of the wiring board 2 collides with the ground plane 15A, in which case the crack terminates but does not spread in the plane direction of the wiring board 2. Hence, the crack spreading through the insulating layer 22 in the plane direction of the wiring board 2 is blocked by the crest provided on the adjacent side face of the ground plane 15A, thereby making it feasible to restrain the crack from spreading in the plane direction of the wiring board 2.

The crest is provided on the adjacent side face of the ground plane 15B, thereby increasing, in comparison with the case where the side face of the ground plane 15B takes the linear shape, the possibility that the crack spreading through the insulating layer 22 in the plane direction of the wiring board 2 collides with the ground plane 15B. The crack spreading through the insulating layer 22 in the plane direction of the wiring board 2 collides with the ground plane 15B, in which case the crack terminates but does not spread in the plane direction of the wiring board 2. Therefore, the crack spreading through the insulating layer 22 in the plane direction of the wiring board 2 is blocked by the crest provided on the adjacent side face of the ground plane 15B, thereby making it feasible to restrain the crack from spreading in the plane direction of the wiring board 2.

As illustrated in FIG. 3C, the crests provided on the adjacent side face of the ground plane 15A and the crests provided on the adjacent side face of the ground plane 15B are alternately and repeatedly disposed between the ground plane 15A and the ground plane 15B. With this arrangement, as compared with the case where each of the side faces of the ground planes 15A and 15B takes the linear shape, there increases the possibility that the crack spreading through the insulating layer 22 in the plane direction of the wiring board 2 collides with the ground plane 15A or 15B. The crack spreading through the insulating layer 22 in the plane direction of the wiring board 2 is blocked by the crest provided on the adjacent side face of the ground plane 15A or by the crest provided on the adjacent side face of the ground plane 15B, whereby it is feasible to restrain the crack from spreading in the plane direction of the wiring board 2.

The crack caused in the insulating layer 24 spreads in the thickness direction of the wiring board 2. The crack spreading through the insulating layer 23 in the thickness direction of the wiring board 2 is blocked by the crest provided on the adjacent side face of the ground plane 15A, thereby making it feasible to restrain the crack from spreading in the thickness direction of the wiring board 2. The crack spreading through the insulating layer 23 in the thickness direction of the wiring board 2 is blocked by the crest provided on the adjacent side face of the ground plane 15B, thereby making it feasible to restrain the crack from spreading in the thickness direction of the wiring board 2.

The first working example has exemplified the instance in which each of the crests and the troughs provided on the adjacent side faces of the ground planes 11A, 11B and 15A, 15B takes the triangle, however, the crests and the troughs provided on the adjacent side faces of the ground planes 11A, 11B and 15A, 15B may also take other shapes. For example, the crests and the troughs provided on the adjacent side faces of the ground planes 11A, 11B and 15A, 15B may be formed in rectangular shapes.

[Second Working Example]

Figure 4A:
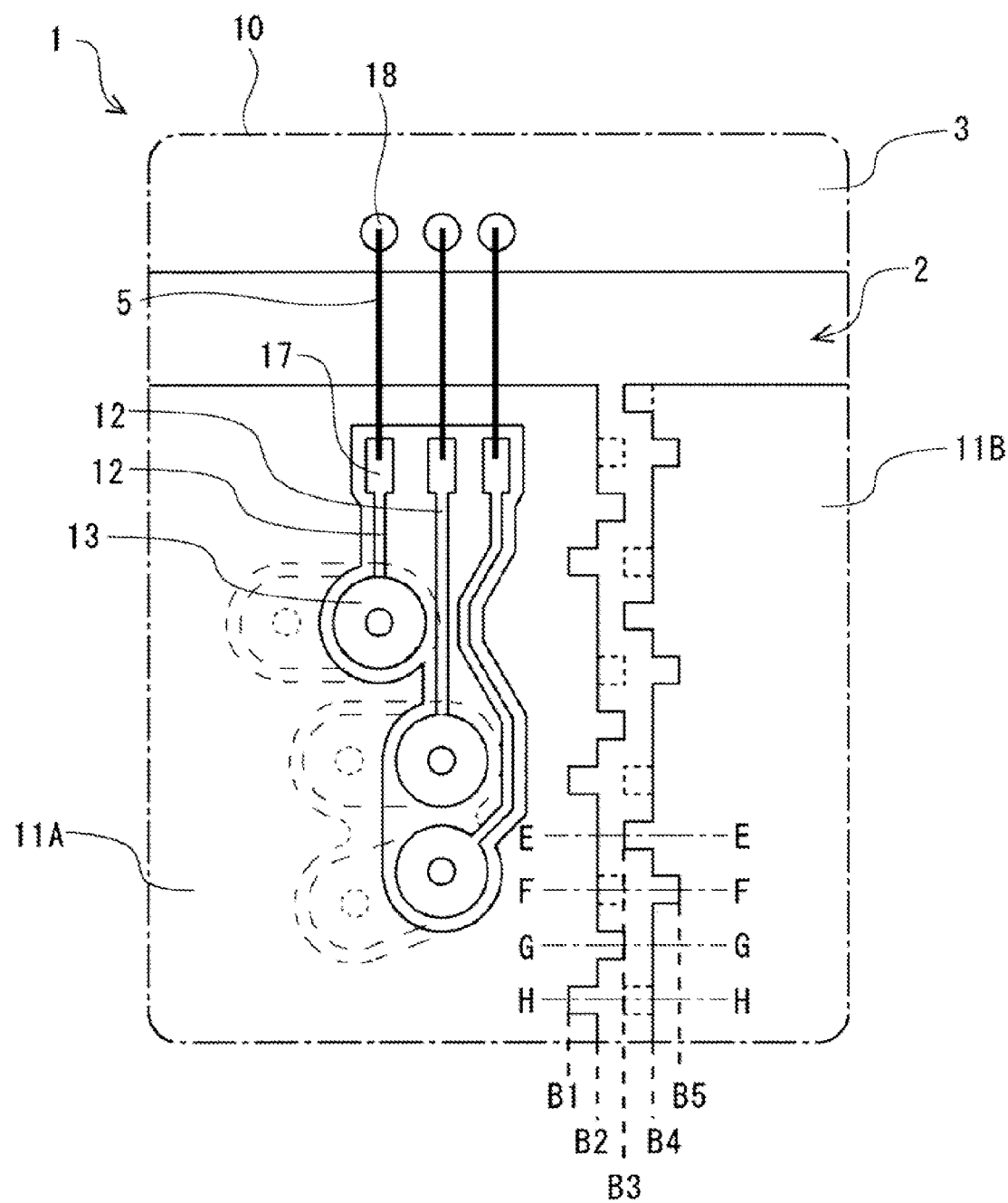
FIG. 4A is a plan view of a principal portion of the semiconductor device 1 according to a second working example.
Figure 4B:
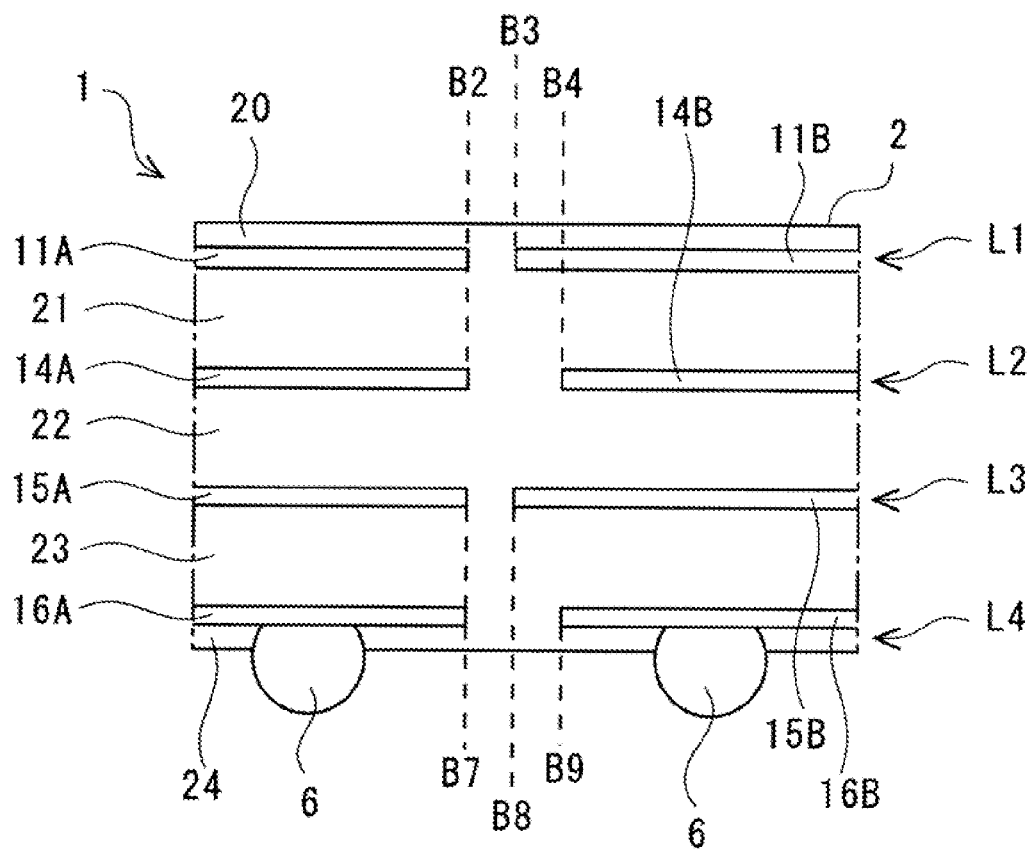
FIG. 4B is a sectional view of the principal portion of the semiconductor device 1, which is taken along the alternate long and short dash line E-E in FIG. 4A.
Figure 4C:
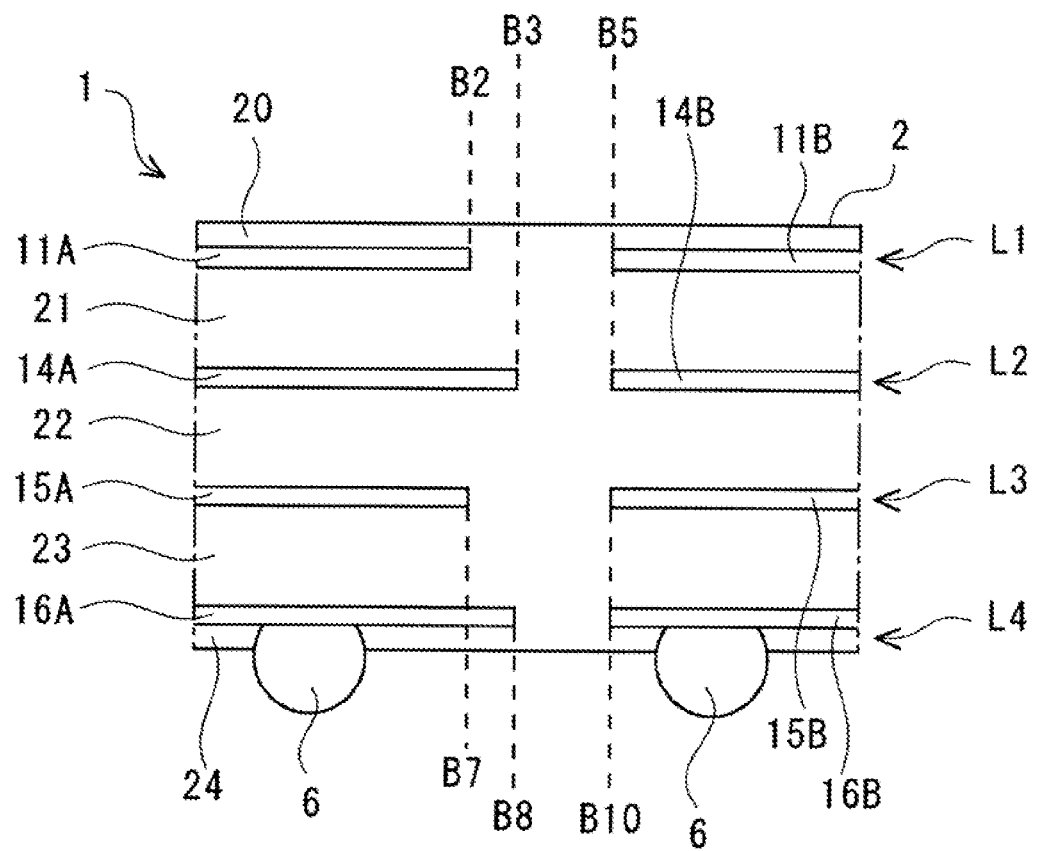
FIG. 4C is a sectional view of the principal portion of the semiconductor device 1, which is taken along the alternate long and short dash line F-F in FIG. 4A.
Figure 4D:
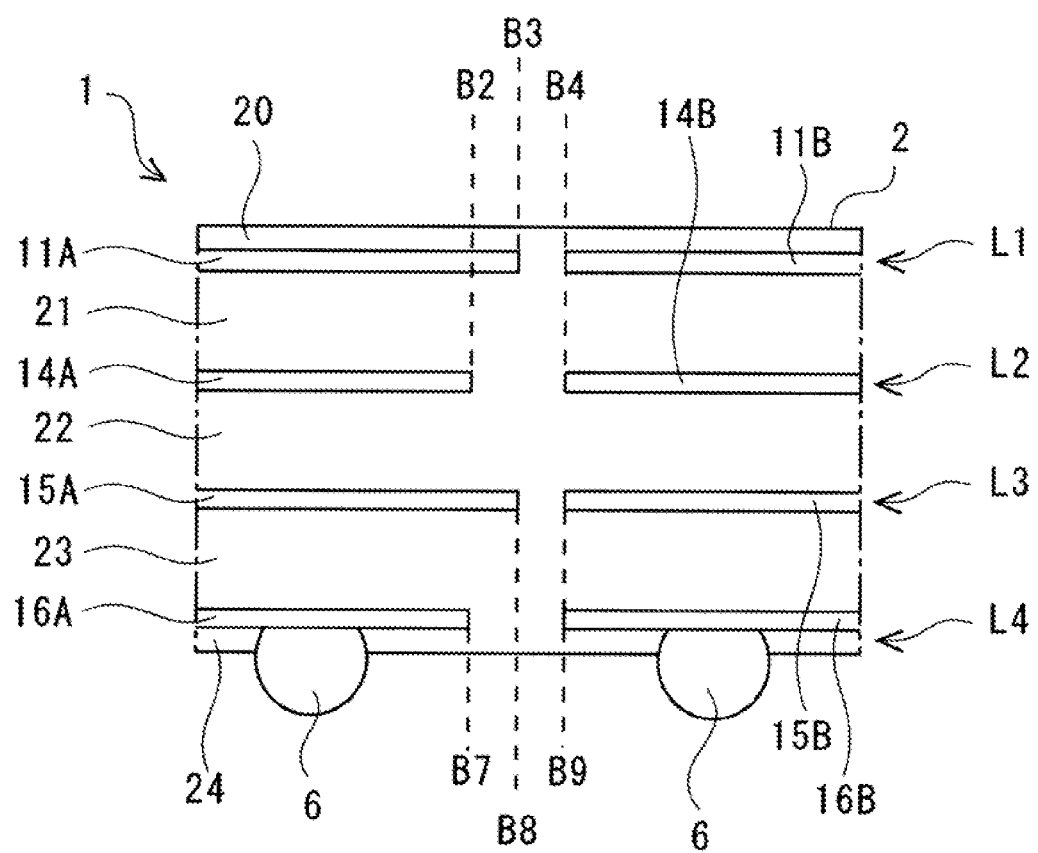
FIG. 4D is a sectional view of the principal portion of the semiconductor device 1, which is taken along the alternate long and short dash line G-G in FIG. 4A.
Figure 4E:
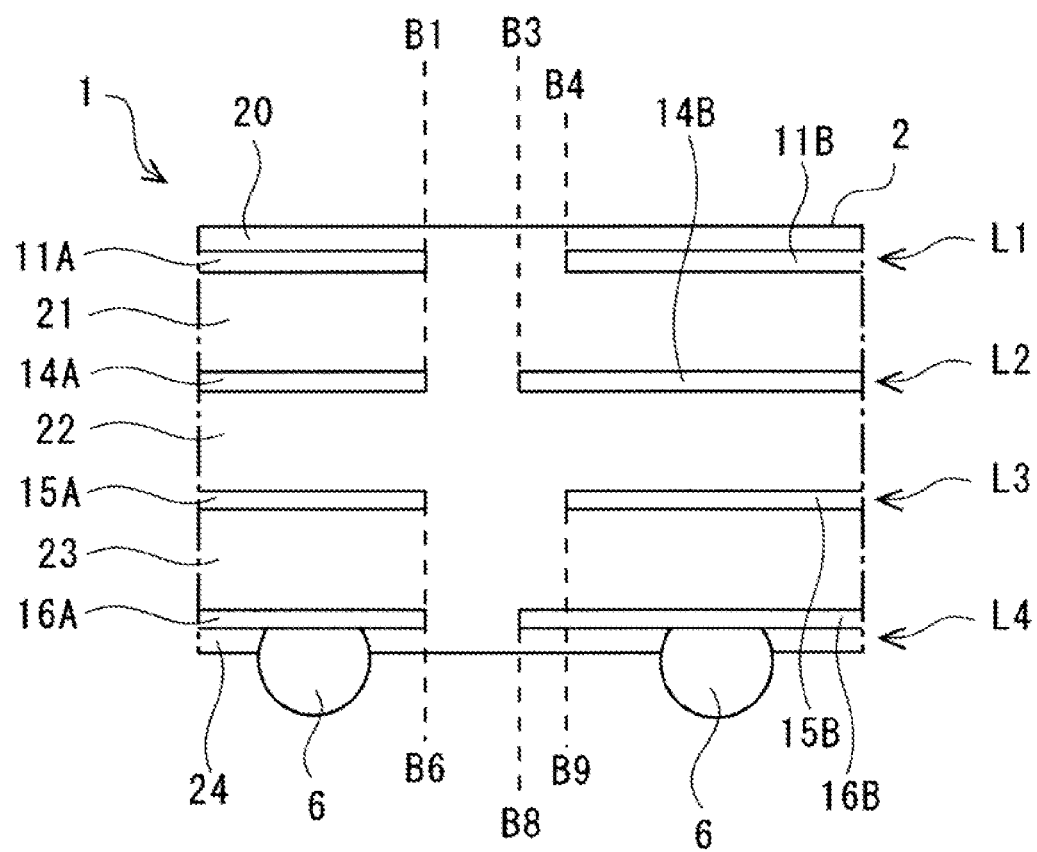
FIG. 4E is a sectional view of the principal portion of the semiconductor device 1, which is taken along the alternate long and short dash line H-H in FIG. 4A.

A second working example of the embodiment will be discussed. A configuration of the second working example is an exemplification, and the semiconductor device 1 according to the embodiment is not limited to the configuration of the second working example. It is to be noted that the same components as those in the first working example are marked with the same numerals and symbols as those in the first working example, and their explanations are omitted. FIG. 4A is a plan view of a principal portion of the semiconductor device 1 according to the second working example. FIG. 4A depicts in enlargement a region 10 circumscribed by the alternate long and short dash line in FIG. 1A. FIG. 4B is a sectional view of the principal portion of the semiconductor device 1, which is taken along the alternate long and short dash line E-E in FIG. 4A. FIG. 4C is a sectional view of the principal portion of the semiconductor device 1, which is taken along the alternate long and short dash line F-F in FIG. 4A. FIG. 4D is a sectional view of the principal portion of the semiconductor device 1, which is taken along the alternate long and short dash line G-G in FIG. 4A. FIG. 4E is a sectional view of the principal portion of the semiconductor device 1, which is taken along the alternate long and short dash line H-H in FIG. 4A. In FIGS. 4A to 4E throughout, the illustration of the sealing resin 4 is omitted.

As illustrated in FIGS. 4A and 4B, the ground planes 11A, 11B, the signal wirings 12 and the conducting-vias 13 are formed in the L1 layer of the wiring board 2. The ground plane 11A is one example of the first wiring. The ground plane 11B is one example of the second wiring. Further, as depicted in FIGS. 4B through 4E, the power planes 14A, 14B are formed in the L2 layer of the wiring board 2, the ground planes 15A, 15B are formed in the L3 layer of the wiring board 2, and the lands 16A, 16B are formed in the L4 layer of the wiring board 2. The power plane 14A is one example of the third wiring. The power plane 14B is one example of the fourth wiring.

As depicted in FIGS. 4A through 4E, the ground plane 11A and the ground plane 11B are disposed in the side-by-side relationship in the plane direction of the wiring board 2. As illustrated in FIGS. 4B through 4E, the power plane 14A and the power plane 14B are disposed in the side-by-side relationship in the plane direction of the wiring board 2. As depicted in FIGS. 4B through 4E, the ground plane 15A and the ground plane 15B are disposed in the side-by-side relationship in the plane direction of the wiring board 2. As illustrated in FIGS. 4B through 4E, the land 16A and the land 16B are disposed in the side-by-side relationship in the plane direction of the wiring board 2.

As depicted in FIGS. FIGS. 4B through 4E, the power plane 14A is disposed under the ground plane 11A, and the power plane 14B is disposed under the ground plane 11B. Namely, as illustrated in FIGS. 4B through 4E, in the thickness direction of the wiring board 2, the ground plane 11A and the power plane 14A are disposed in the side-by-side relationship, and the ground plane 11B and the power plane 14B are disposed in the side-by-side relationship. As illustrated in FIGS. 4B through 4E, the ground plane 15A is disposed under the power plane 14A, and the ground plane 15B is disposed under the power plane 14B. Namely, as illustrated in FIGS. 4B through 4E, in the thickness direction of the wiring board 2, the power plane 14A and the ground plane 15A are disposed in the side-by-side relationship, and the power plane 14B and the ground plane 15B are disposed in the side-by-side relationship. As depicted in FIGS. 4B through 4E, the land 16A is disposed under the ground plane 15A, and the land 16B is disposed under the ground plane 15B. That is to say, as illustrated in FIGS. 4B through 4E, in the thickness direction of the wiring board 2, the ground plane 15A and the land 16A are disposed in the side-by-side relationship, and the ground plane 15B and the land 16B are disposed in the side-by-side relationship.

The ground planes 11A, 15A and the power plane 14A are connected through the unillustrated conducting-via to the land 16A. The ground planes 11B, 15B and the power plane 14B are connected through the unillustrated conducting-via to the land 16B. The ground planes 11A, 11B, 15A, 15B, the signal wirings 12, the conducting-vias 13, the power planes 14A, 14B and the lands 16A, 16B may involve using a metal such as copper (Cu) as their material. As depicted in FIGS. FIGS. 4B through 4E, the solder balls 6 are joined to the lands 16A, 16B.

As illustrated in FIG. 4A, the bonding pads 17 formed on the wiring board 2 are connected via the wires 5 to the bonding pads 18 formed on the semiconductor element 3. As illustrated in FIG. 4A, the signal wirings 12 are connected to the conducting-vias 13 and the bonding pads 17.

As depicted in FIGS. 4B through 4E, on the wiring board 2, the insulating layer 20 is formed over the ground planes 11A, 11B, the signal wirings 12 and the conducting-vias 13. A material of the insulating layer 20 may involve using, e.g., a solder resist. The solder resist may be liquid and may also take the dry-film shape. In FIG. 4A, the illustration of the insulating layer 20 is omitted. As illustrated in FIGS. 4B through 4E, the wiring board 2 includes the insulating layer 21 between the L1 layer and the L2 layer, includes the insulating layer 22 between the L2 layer and the L3 layer, and includes the insulating layer 23 between the L3 layer and the L4 layer.

As depicted in FIGS. 4B through 4E, the wiring board 2 is formed with the insulating layer 21 between the ground plane 11A and the power plane 14A and between the ground plane 11B and the power plane 14B. As illustrated in FIGS. 4B through 4E, the wiring board 2 is formed with the insulating layer 22 between the power plane 14A and the ground plane 15A and between the power plane 14B and the ground plane 15B. As depicted in FIGS. 4B through 4E, the wiring board 2 is formed with the insulating layer 23 between the ground plane 15A and the land 16A and between the ground plane 15B and the land 16B. The material of the insulating layers 21, 22, 23 may involve using, e.g., the epoxy resin. The thickness of each of the insulating layers 21, 22, 23 may be set equal to or larger than, e.g., 30 μm but equal to or smaller than 100 μm.

As depicted in FIGS. 4B through 4E, the wiring board 2 is formed with the insulating layer 24 on the surface opposite to the surface on which the semiconductor element 3 is packaged. The material of the insulating layer 24 may involve using, e.g., the solder resist. The solder resist may be liquid and may also take the dry-film shape.

Figure 5A:
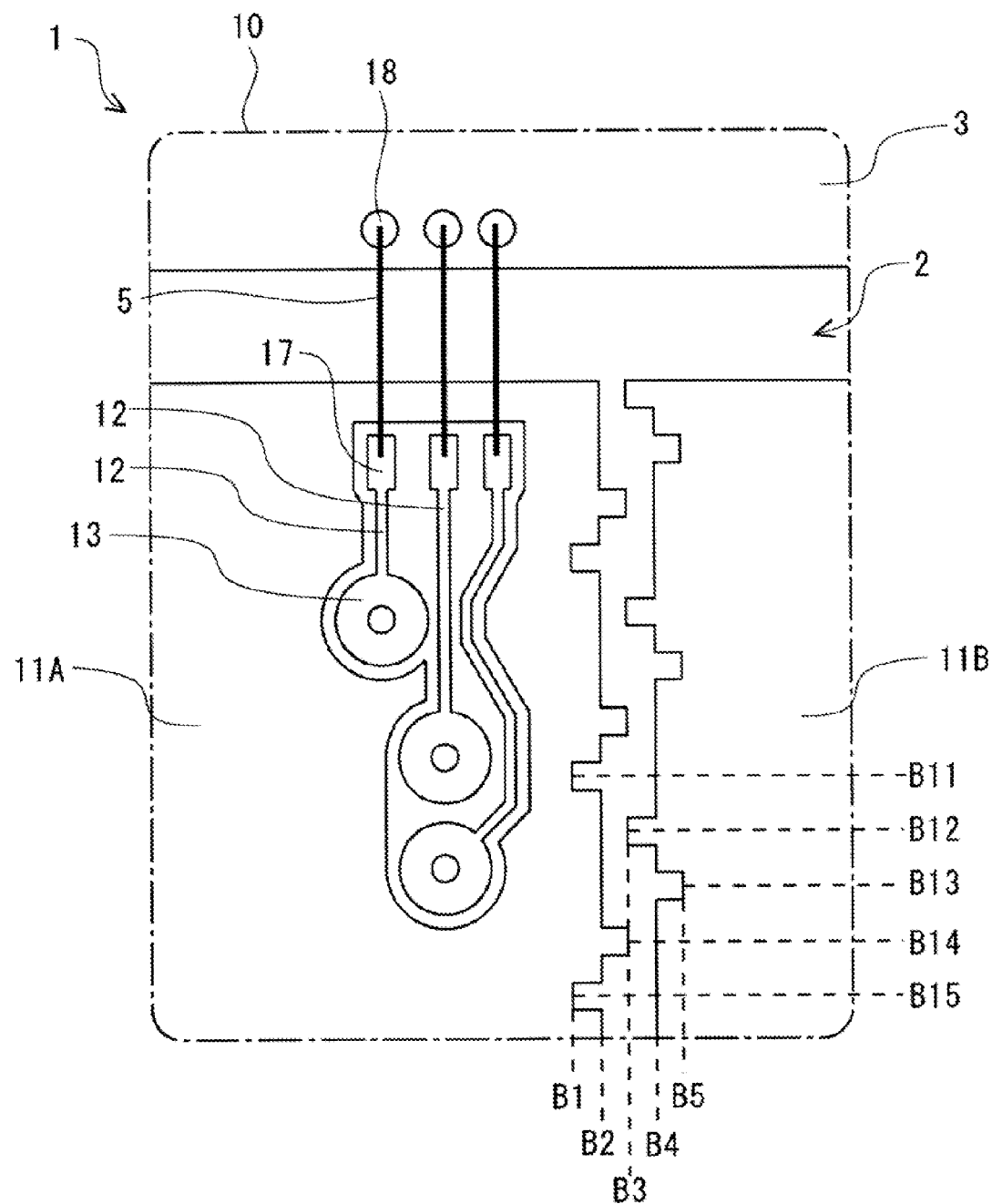
FIG. 5A is a plan view of the principal portion of the L1 layer of the wiring board 2 provided in the semiconductor device 1 according to the second working example.
Figure 5B:
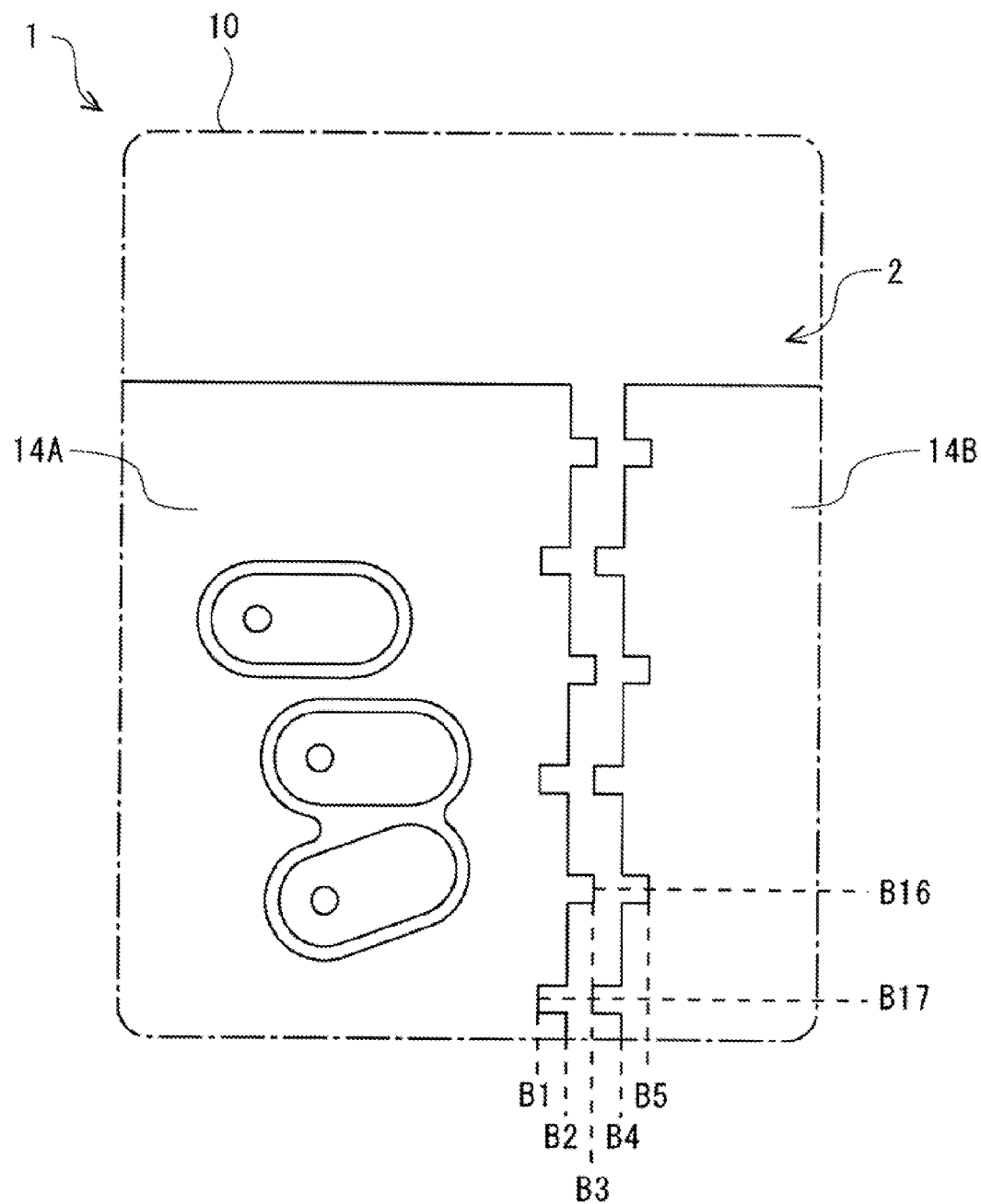
FIG. 5B is a plan view of the principal portion of the L2 layer of the wiring board 2 provided in the semiconductor device 1 according to the second working example.
Figure 5C:
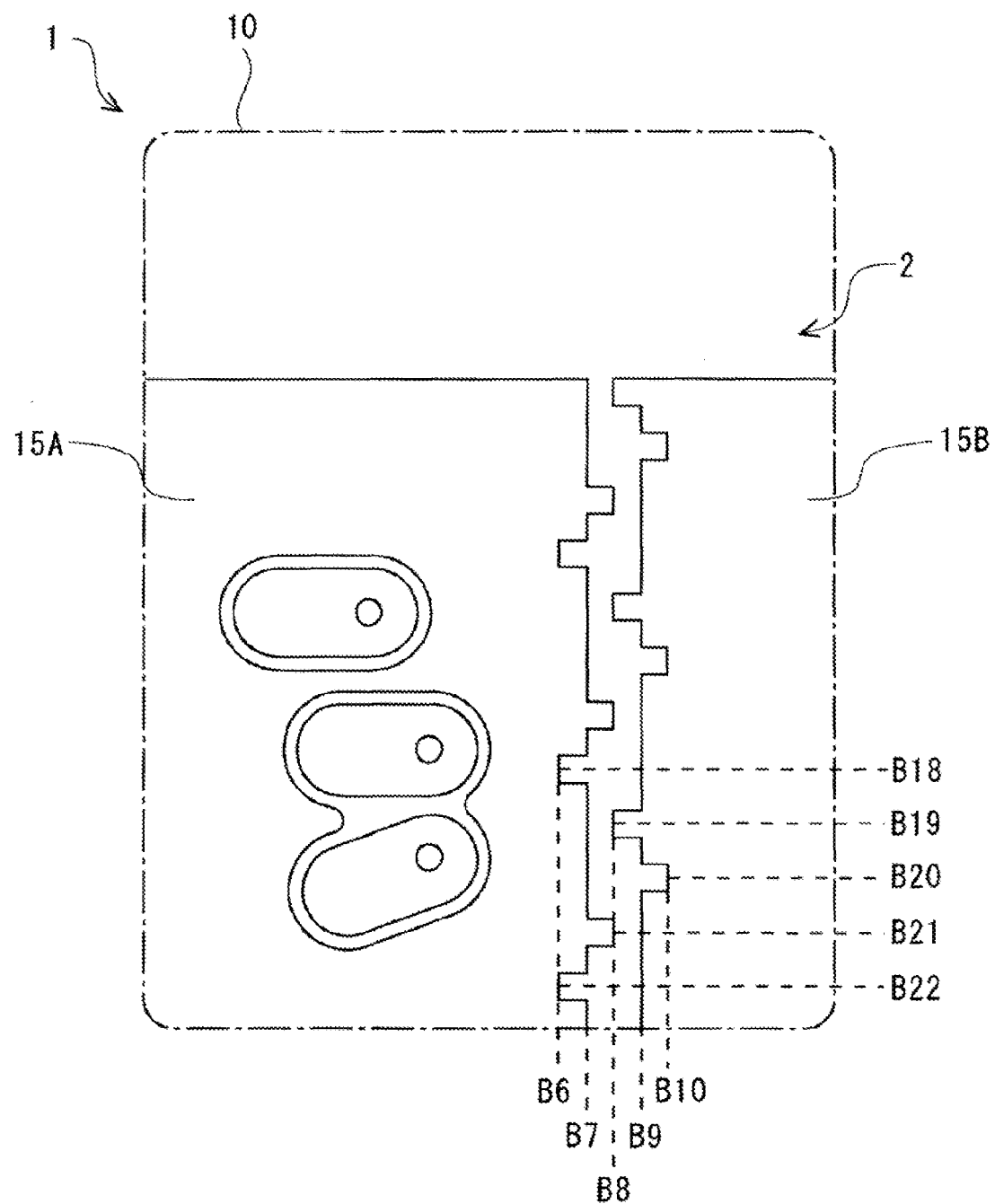
FIG. 5C is a plan view of the principal portion of the L3 layer of the wiring board 2 provided in the semiconductor device 1 according to the second working example.

FIG. 5A is a plan view of the principal portion of the L1 layer of the wiring board 2 provided in the semiconductor device 1 according to the second working example. The illustrations of the sealing resin 4 and the insulating layer 20 are omitted in FIG. 5A. FIG. 5B is a plan view of the principal portion of the L2 layer of the wiring board 2 provided in the semiconductor device 1 according to the second working example. The illustrations of the sealing resin 4, the insulating layer 20 and the L1 layer of the wiring board 2 are omitted in FIG. 5B. FIG. 5C is a plan view of the principal portion of the L3 layer of the wiring board 2 provided in the semiconductor device 1 according to the second working example. The illustrations of the sealing resin 4, the insulating layer 20 and the L1 and L2 layers of the wiring board 2 are omitted in FIG. 5C. FIG. 5D is a plan view of the principal portion of the L4 layer of the wiring board 2 provided in the semiconductor device 1 according to the second working example. The illustrations of the sealing resin 4, the insulating layer 20 and the L1, L2 and L3 layers of the wiring board 2 are omitted in FIG. 5D. Note that FIGS. 5A through 5D similar to FIG. 4A are enlarged plan views of the region 10 circumscribed by the alternate long and short dash line in FIG. 1A.

As illustrated in FIG. 5A, the ground plane 11A and the ground plane 11B are disposed in the side-by-side relationship in the plane direction of the wiring board 2. As illustrated in FIG. 5B, the power plane 14A and the power plane 14B are disposed in the side-by-side relationship in the plane direction of the wiring board 2. As illustrated in FIG. 5C, the ground plane 15A and the ground plane 15B are disposed in the side-by-side relationship in the plane direction of the wiring board 2. As illustrated in FIG. 5D, the land 16A and the land 16B are disposed in the side-by-side relationship in the plane direction of the wiring board 2.

As depicted in FIGS. 5A through 5D, the side faces of the ground planes 11A, 11B, 15A, 15B, the power planes 14A, 14B and the lands 16A, 16B are formed partially in the non-linear shape. Namely, the side faces of the ground planes 11A, 11B, 15A, 15B, the power planes 14A, 14B and the lands 16A, 16B are partially non-planar.

As depicted in FIG. 5A, the side face, adjacent to the ground plane 11B, of the ground plane 11A takes the non-linear shape (comb shape). To be specific, the side face, adjacent to the ground plane 11B, of the ground plane 11A is formed with a rectangular crest (projection) and a rectangular trough (dent) alternately and repeatedly. In the second working example, the crest provided on the adjacent side face of the ground plane 11A is a portion projected from B2 in FIG. 5A toward the arrangement direction of the ground plane 11B. In the second working example, the trough provided on the adjacent side face of the ground plane 11A is a portion dented from B2 in FIG. 5A toward the arrangement direction of the ground plane 11B.

As depicted in FIG. 5A, the side face, adjacent to the ground plane 11A, of the ground plane 11B takes the non-linear shape (comb shape). Specifically, the side face, adjacent to the ground plane 11A, of the ground plane 11B is formed with the rectangular crest (projection) and a rectangular trough (dent) alternately and repeatedly. In the second working example, the crest provided on the adjacent side face of the ground plane 11B is a portion projected from B4 in FIG. 5A toward the arrangement direction of the ground plane 11A. In the second working example, the trough provided on the adjacent side face of the ground plane 11B is a portion dented from B4 in FIG. 5A toward the arrangement direction of the ground plane 11A.

As depicted in FIG. 5B, the side face, adjacent to the power plane 14B, of the power plane 14A takes the non-linear shape (comb shape). Specifically, the side face, adjacent to the power plane 14B, of the power plane 14A is formed with the rectangular crest (projection) and the rectangular trough (dent) alternately and repeatedly. In the second working example, the crest provided on the adjacent side face of the power plane 14A is a portion projected from B2 in FIG. 5B toward the arrangement direction of the power plane 14B. In the second working example, the trough provided on the adjacent side face of the power plane 14A is a portion dented from B2 in FIG. 5B toward the arrangement direction of the power plane 14B.

As depicted in FIG. 5B, the side face, adjacent to the power plane 14A, of the power plane 14B takes the non-linear shape (comb shape). Specifically, the side face, adjacent to the power plane 14A, of the power plane 14B is formed with the rectangular crest (projection) and the rectangular trough (dent) alternately and repeatedly. In the second working example, the crest provided on the adjacent side face of the power plane 14B is a portion projected from B4 in FIG. 5B toward the arrangement direction of the power plane 14A. In the second working example, the trough provided on the adjacent side face of the power plane 14B is a portion dented from B4 in FIG. 5B toward the arrangement direction of the power plane 14A.

As depicted in FIG. 5C, the side face, adjacent to the ground plane 15B, of the ground plane 15A takes the non-linear shape (comb shape). To be specific, the side face, adjacent to the ground plane 15B, of the ground plane 15A is formed with a rectangular crest (projection) and a rectangular trough (dent) alternately and repeatedly. In the second working example, the crest provided on the adjacent side face of the ground plane 15A is a portion projected from B7 in FIG. 5C toward the arrangement direction of the ground plane 15B. In the second working example, the trough provided on the adjacent side face of the ground plane 15A is a portion dented from B7 in FIG. 5C toward the arrangement direction of the ground plane 15B.

As depicted in FIG. 5C, the side face, adjacent to the ground plane 15A, of the ground plane 15B takes the non-linear shape (comb shape). Specifically, the side face, adjacent to the ground plane 15A, of the ground plane 15B is formed with a rectangular crest (projection) and a rectangular trough (dent) alternately and repeatedly. In the second working example, the crest provided on the adjacent side face of the ground plane 15B is a portion projected from B9 in FIG. 5C toward the arrangement direction of the ground plane 15A. In the second working example, the trough provided on the adjacent side face of the ground plane 15B is a portion dented from B9 in FIG. 5C toward the arrangement direction of the ground plane 15A.

As depicted in FIG. 5D, the side face, adjacent to the land 16B, of the land 16A takes the non-linear shape (comb shape). To be specific, the side face, adjacent to the land 16B, of the land 16A is formed with a rectangular crest (projection) and a rectangular trough (dent) alternately and repeatedly. In the second working example, the crest provided on the adjacent side face of the land 16A is a portion projected from B7 in FIG. 5D toward the arrangement direction of the land 16B. In the second working example, the trough provided on the adjacent side face of the land 16A is a portion dented from B7 in FIG. 5D toward the arrangement direction of the land 16B.

As depicted in FIG. 5D, the side face, adjacent to the land 16A, of the land 16B takes the non-linear shape (comb shape). To be specific, the side face, adjacent to the land 16A, of the land 16B is formed with a rectangular crest (projection) and a rectangular trough (dent) alternately and repeatedly. In the second working example, the crest provided on the adjacent side face of the land 16B is a portion projected from B9 in FIG. 5D toward the arrangement direction of the land 16A. In the second working example, the trough provided on the adjacent side face of the land 16B is a portion dented from B9 in FIG. 5D toward the arrangement direction of the land 16A.

The ground plane 11A and the ground plane 11B are disposed apart at a predetermined distance. The insulating layer 20 is formed between the ground plane 11A and the ground plane 11B. The insulating layer 21 may be formed between the ground plane 11A and the ground plane 11B. The insulating layer 20 and the insulating layer 21 may also be formed between the ground plane 11A and the ground plane 11B. A distance between the adjacent side face of the ground plane 11A and the adjacent side face of the ground plane 11B (a distance between B2 and B4 in FIGS. 4A and 5A) may be set equal to or larger than, e.g., 50 μm but equal to or smaller than 300 μm.

A pitch (a distance between B14 and B15 in FIG. 5A) between the crest and the trough provided on the adjacent side face of the ground plane 11A may be set equal to or larger than, for example, 100 μm but equal to or smaller than 300 μm. A pitch (a distance between B12 and B13 in FIG. 5A) between the crest and the trough provided on the adjacent side face of the ground plane 11B may be set equal to or larger than, for example, 100 μm but equal to or smaller than 300 μm. A pitch (a distance between B11 and B12 in FIG. 5A) between the trough provided on the adjacent side face of the ground plane 11A and the crest provided on the adjacent side face of the ground plane 11B may also be set equal to or larger than, for example, 100 μm but equal to or smaller than 300 μm. A pitch (a distance between B13 and B14 in FIG. 5A) between the trough provided on the adjacent side face of the ground plane 11B and the crest provided on the adjacent side face of the ground plane 11A may also be set equal to or larger than, for example, 100 μm but equal to or smaller than 300 μm.

The power plane 14A and the power plane 14B are disposed apart at a predetermined distance. The insulating layer 21 is formed between the power plane 14A and the power plane 14B. The insulating layer 22 may be formed between the power plane 14A and the power plane 14B. The insulating layer 21 and the insulating layer 22 may also be formed between the power plane 14A and the power plane 14B. A distance between the adjacent side face of the power plane 14A and the adjacent side face of the power plane 14B (a distance between B2 and B4 in FIG. 5B) may be set equal to or larger than, e.g., 50 μm but equal to or smaller than 300 μm.

A pitch (a distance between B16 and B17 in FIG. 5B) between the crest and the trough provided on the adjacent side face of the power plane 14A may be set equal to or larger than, for example, 200 μm but equal to or smaller than 600 μm. A pitch (a distance between B16 and B17 in FIG. 5B) between the crest and the trough provided on the adjacent side face of the power plane 14B may be set equal to or larger than, for example, 200 μm but equal to or smaller than 600 μm.

The ground plane 15A and the ground plane 15B are disposed apart at a predetermined distance. The insulating layer 22 is formed between the ground plane 15A and the ground plane 15B. The insulating layer 23 may be formed between the ground plane 15A and the ground plane 15B. The insulating layer 22 and the insulating layer 23 may also be formed between the ground plane 15A and the ground plane 15B. A distance between the adjacent side face of the ground plane 15A and the adjacent side face of the ground plane 15B (a distance between B2 and B4 in FIG. 5C) may be set equal to or larger than, e.g., 50 μm but equal to or smaller than 300 μm.

A pitch (a distance between B21 and B22 in FIG. 5C) between the crest and the trough provided on the adjacent side face of the ground plane 15A may be set equal to or larger than, for example, 100 μm but equal to or smaller than 300 μm. A pitch (a distance between B19 and B20 in FIG. 5C) between the crest and the trough provided on the adjacent side face of the ground plane 15B may be set equal to or larger than, for example, 100 μm but equal to or smaller than 300 μm. A pitch (a distance between B18 and B19 in FIG. 5C) between the trough provided on the adjacent side face of the ground plane 15A and the crest provided on the adjacent side face of the ground plane 15B may also be set equal to or larger than, for example, 100 μm but equal to or smaller than 300 μm. A pitch (a distance between B20 and B21 in FIG. 5A) between the trough provided on the adjacent side face of the ground plane 15B and the crest provided on the adjacent side face of the ground plane 15A may also be set equal to or larger than, for example, 100 μm but equal to or smaller than 300 μm.

The land 16A and the land 16B are disposed apart at the predetermined distance. The insulating layer 24 is formed between the land 16A and the land 16B. The insulating layer 23 may also be formed between the land 16A and the land 16B. The insulating layer 23 and the insulating layer 24 may also be formed between the land 16A and the land 16B. A distance between the adjacent side face of the land 16A and the adjacent side face of the land 16B (a distance between B2 and B4 in FIG. 5D) may be set equal to or larger than, for example, 50 μm but equal to or smaller than 300 μm.

A pitch (a distance between B23 and B24 in FIG. 5D) between the crest and the trough provided on the adjacent side face of the land 16A may be set equal to or larger than, for example, 200 μm but equal to or smaller than 600 μm. A pitch (a distance between B23 and B24 in FIG. 5D) between the trough and the crest provided on the adjacent side face of the land 16B may be set equal to or larger than, for example, 200 μm but equal to or smaller than 600 μm.

If the ground plane 11A and the power plane 14B are overlapped in the thickness direction (in the stacking direction) of the wiring board 2, a voltage fluctuation of one plane affects a voltage of the other plane, resulting in deteriorating an electric characteristic of the ground plane 11A or the power plane 14B. Further, if the ground plane 11B and the power plane 14A are overlapped in the thickness direction of the wiring board 2, the voltage fluctuation of one plane affects the voltage of the other plane, resulting in deteriorating the electric characteristic of the ground plane 11B or the power plane 14A. Accordingly, as illustrated in FIGS. 4B through 4E, the ground plane 11A and the power plane 14B are disposed so that the ground plane 11A and the power plane 14B are not overlapped in the thickness direction of the wiring board 2. Still further, as illustrated in FIGS. 4B through 4E, the ground plane 11B and the power plane 14A are disposed so that the ground plane 11B and the power plane 14A are not overlapped in the thickness direction of the wiring board 2.

If the power plane 14A and the ground plane 15B are overlapped in the thickness direction of the wiring board 2, the voltage fluctuation of one plane affects the voltage of the other plane, resulting in deteriorating the electric characteristic of the power plane 14A or the ground plane 15B. Further, if the power plane 14B and the ground plane 15A are overlapped in the thickness direction of the wiring board 2, the voltage fluctuation of one plane affects the voltage of the other plane, resulting in deteriorating the electric characteristic of the power plane 14B or the ground plane 15A. Accordingly, as illustrated in FIGS. 4B through 4E, the power plane 14A and the ground plane 15B are disposed so that the power plane 14A and the ground plane 15B are not overlapped in the thickness direction of the wiring board 2. Still further, as illustrated in FIGS. 4B through 4E, the power plane 14B and the ground plane 15A are disposed so that the power plane 14B and the ground plane 15A are not overlapped in the thickness direction of the wiring board 2.

If the ground plane 15A and the land 16B are overlapped in the thickness direction of the wiring board 2, the voltage fluctuation of one plane affects the voltage of the other plane, resulting in deteriorating the electric characteristic of the ground plane 15A or the land 16B. Further, if the ground plane 15B and the land 16A are overlapped in the thickness direction of the wiring board 2, the voltage fluctuation of one plane affects the voltage of the other plane, resulting in deteriorating the electric characteristic of the ground plane 15B or the land 16A. Accordingly, as illustrated in FIGS. 4B through 4E, the ground plane 15A and the land 16B are disposed so that the ground plane 15A and the land 16B are not overlapped in the thickness direction of the wiring board 2. Still further, as illustrated in FIGS. 4B through 4E, the ground plane 15B and the land 16A are disposed so that the ground plane 15B and the land 16A are not overlapped in the thickness direction of the wiring board 2.

In the second working example, in the thickness direction of the wiring board 2, the crest provided on the adjacent side face of the ground plane 11A and the crest provided on the adjacent side face of the power plane 14A are not overlapped.

As depicted in FIG. 4C, the crest provided on the adjacent side face of the power plane 14A is projected from the portion (B2 in FIG. 5A) of the linear shape of the adjacent side face of the ground plane 11A toward the arrangement direction of power plane 14B. Therefore, as illustrated in FIG. 4C, the wiring board 2 includes an area where the ground plane 11A does not exist upwardly of the crest provided on the adjacent side face of the power plane 14A in the thickness direction of the wiring board 2. That is, as depicted in FIG. 4C, the wiring board 2 includes the area where the ground plane 11A and the crests provided on the adjacent side faces of the power plane 14A are not overlapped in the thickness direction of the wiring board 2.

As depicted in FIG. 4D, the crest provided on the adjacent side face of the ground plane 11A is projected from the portion (B2 in FIG. 5B) of the linear shape of the adjacent side face of the power plane 14A toward the arrangement direction of the ground plane 11B. Therefore, as illustrated in FIG. 4D, the wiring board 2 includes an area where the power plane 14A does not exist downwardly of the crest provided on the adjacent side face of the ground plane 11A in the thickness direction of the wiring board 2. That is, as depicted in FIG. 4D, the wiring board 2 includes the area where the crest provided on the adjacent side face of the ground plane 11A and the power plane 14A are not overlapped in the thickness direction of the wiring board 2.

In the second working example, the crest provided on the adjacent side face of the ground plane 11B and the crest provided on the adjacent side face of the power plane 14B are not overlapped in the thickness direction of the wiring board 2.

As depicted in FIG. 4B, the crest provided on the adjacent side face of the ground plane 11B is projected from the portion (B4 in FIG. 5B) of the linear shape of the adjacent side face of the power plane 14B toward the arrangement direction of the ground plane 11A. Therefore, as illustrated in FIG. 4B, there is an area where the power plane 14B does not exist downwardly of the crest provided on the adjacent side face of the ground plane 11B in the thickness direction of the wiring board 2. That is, as depicted in FIG. 4B, the wiring board 2 includes the area where the crest provided on the adjacent side face of the ground plane 11B and the power plane 14B are not overlapped in the thickness direction of the wiring board 2.

As depicted in FIG. 4E, the crest provided on the adjacent side face of the power plane 14B is projected from the portion (B4 in FIG. 5A) of the linear shape of the adjacent side face of the ground plane 11B toward the arrangement direction of power plane 14B. Therefore, as illustrated in FIG. 4E, there is an area where the ground plane 11B does not exist upwardly of the crest provided on the adjacent side face of the power plane 14B in the thickness direction of the wiring board 2. That is, as depicted in FIG. 4E, the wiring board 2 includes the area where the ground plane 11B and the crests provided on the adjacent side faces of the power plane 14B are not overlapped in the thickness direction of the wiring board 2.

In the second working example, the crest provided on the adjacent side face of the power plane 14A and the crest provided on the adjacent side face of the ground plane 15A are not overlapped in the thickness direction of the wiring board 2.

As depicted in FIG. 4C, the crest provided on the adjacent side face of the power plane 14A is projected from the portion (B7 in FIG. 5C) of the linear shape of the adjacent side face of the ground plane 15A toward the arrangement direction of the power plane 14B. Therefore, as illustrated in FIG. 4C, there is an area where the ground plane 15A does not exist downwardly of the crest provided on the adjacent side face of the power plane 14A in the thickness direction of the wiring board 2. That is, as depicted in FIG. 4C, the wiring board 2 includes the area where the crest provided on the adjacent side face of the power plane 14A and the ground plane 15A are not overlapped in the thickness direction of the wiring board 2.

As depicted in FIG. 4D, the crest provided on the adjacent side face of the ground plane 15A is projected from the portion (B2 in FIG. 5B) of the linear shape of the adjacent side face of the power plane 14A toward the arrangement direction of the ground plane 15B. Therefore, as illustrated in FIG. 4D, there is an area where the power plane 14A does not exist upwardly of the crest provided on the adjacent side face of the ground plane 15A. That is, as depicted in FIG. 4D, the wiring board 2 includes the area where the power plane 14A and the crest provided on the adjacent side face of the ground plane 15A are not overlapped in the thickness direction of the wiring board 2.

In the second working example, the crest provided on the adjacent side face of the power plane 14B and the crest provided on the adjacent side face of the ground plane 15B are not overlapped in the thickness direction of the wiring board 2.

As depicted in FIG. 4B, the crest provided on the adjacent side face of the ground plane 15B is projected from the portion (B4 in FIG. 5B) of the linear shape of the adjacent side face of the power plane 14B toward the arrangement direction of the ground plane 15A. Therefore, as illustrated in FIG. 4B, the wiring board 2 includes an area where the power plane 14B does not exist upwardly of the crest provided on the adjacent side face of the ground plane 15B in the thickness direction of the wiring board 2. That is, as depicted in FIG. 4B, the wiring board 2 includes the area where the power plane 14A and the crest provided on the adjacent side face of the ground plane 15B are not overlapped in the thickness direction of the wiring board 2.

As depicted in FIG. 4E, the crest provided on the adjacent side face of the power plane 14B is projected from the portion (B9 in FIG. 5C) of the linear shape of the adjacent side face of the ground plane 15B toward the arrangement direction of the power plane 14A. Therefore, as illustrated in FIG. 4E, there is an area where the ground plane 15B does not exist downwardly of the crest provided on the adjacent side face of the power plane 14B in the thickness direction of the wiring board 2. That is, as depicted in FIG. 4E, the wiring board 2 includes the area where the crest provided on the adjacent side face of the power plane 14B and the ground plane 15B are not overlapped in the thickness direction of the wiring board 2.

In the second working example, the crest provided on the adjacent side face of the ground plane 15A and the crest provided on the adjacent side face of the land 16A are not overlapped in the thickness direction of the wiring board 2.

As depicted in FIG. 4C, the crest provided on the adjacent side face of the land 16A is projected from the portion (B7 in FIG. 5C) of the linear shape of the adjacent side face of the ground plane 15A toward the arrangement direction of the land 16B. Therefore, as illustrated in FIG. 4C, the wiring board 2 includes an area where the ground plane 15A does not exist upwardly of the crest provided on the adjacent side face of the land 16A in the thickness direction of the wiring board 2. That is, as depicted in FIG. 4C, the wiring board 2 includes the area where the ground plane 15A and the crest provided on the adjacent side face of the land 16A are not overlapped in the thickness direction of the wiring board 2.

As depicted in FIG. 4D, the crest provided on the adjacent side face of the ground plane 15A is projected from the portion (B7 in FIG. 5D) of the linear shape of the adjacent side face of the land 16A toward the arrangement direction of the ground plane 15B. Therefore, as illustrated in FIG. 4D, the wiring board 2 includes an area where the land 16A does not exist downwardly of the crest provided on the adjacent side face of the ground plane 15A in the thickness direction of the wiring board 2. That is, as depicted in FIG. 4D, the wiring board 2 includes the area where the crest provided on the adjacent side face of the ground plane 15A and the land 16A are not overlapped in the thickness direction of the wiring board 2.

In the second working example, the crest provided on the adjacent side face of the ground plane 15B and the crest provided on the adjacent side face of the land 16B are not overlapped in the thickness direction of the wiring board 2.

As depicted in FIG. 4B, the crest provided on the adjacent side face of the ground plane 15B is projected from the portion (B9 in FIG. 5D) of the linear shape of the adjacent side face of the land 16B toward the arrangement direction of the ground plane 15A. Therefore, as illustrated in FIG. 4B, the wiring board 2 includes an area where the land 16B does not exist downwardly of the crest provided on the adjacent side face of the ground plane 15B in the thickness direction of the wiring board 2. That is, as depicted in FIG. 4B, the wiring board 2 includes the area where the crest provided on the adjacent side face of the ground plane 15B and the land 16B are not overlapped in the thickness direction of the wiring board 2.

As depicted in FIG. 4E, the crest provided on the adjacent side face of the land 16B is projected from the portion (B9 in FIG. 5C) of the linear shape of the adjacent side face of the ground plane 15B toward the arrangement direction of the land 16A. Therefore, as illustrated in FIG. 4E, there is an area where the ground plane 15B does not exist upwardly of the crest provided on the adjacent side face of the land 16B in the thickness direction of the wiring board 2. That is, as depicted in FIG. 4E, the wiring board 2 includes the area where the ground plane 15B and the crest provided on the adjacent side face of the land 16B are not overlapped in the thickness direction of the wiring board 2.

A projection quantity of the crest and a dent quantity of the trough provided on the adjacent side face of the ground plane 11A may be set to any values. The projection quantity of the crest provided on the adjacent side face of the ground plane 11A is a quantity of the projection from the portion (B2 in FIG. 5A) of the linear shape of the ground plane 11A. The dent quantity of the trough provided on the adjacent side face of the ground plane 11A is a quantity of the dent from the portion (B2 in FIG. 5A) of the linear shape of the ground plane 11A. The projection quantity of the crest provided on the adjacent side face of the ground plane 11A may be set equal to or larger than, for example, 25 μm but equal to or smaller than 150 μm. The projection quantity of the crest provided on the adjacent side face of the ground plane 11A may be set to approximately a half of the distance between the adjacent side face of the ground plane 11A and the adjacent side face of the ground plane 11B. The dent quantity of the trough provided on the adjacent side face of the ground plane 11A may be set equal to or larger than, for example, 25 μm but equal to or smaller than 150 μm. The dent quantity of the trough provided on the adjacent side face of the ground plane 11A may be set to approximately a half of the distance between the adjacent side face of the ground plane 11A and the adjacent side face of the ground plane 11B.

A projection quantity of the crest and a dent quantity of the trough provided on the adjacent side face of the ground plane 11B may be set to any values. The projection quantity of the crest provided on the adjacent side face of the ground plane 11B is a quantity of the projection from the portion (B4 in FIG. 5A) of the linear shape of the ground plane 11B. The dent quantity of the trough provided on the adjacent side face of the ground plane 11B is a quantity of the dent from the portion (B4 in FIG. 5A) of the linear shape of the ground plane 11B. The projection quantity of the crest provided on the adjacent side face of the ground plane 11B may be set equal to or larger than, for example, 25 μm but equal to or smaller than 150 μm. The projection quantity of the crest provided on the adjacent side face of the ground plane 11B may be set to approximately a half of the distance between the adjacent side face of the ground plane 11A and the adjacent side face of the ground plane 11B. The dent quantity of the trough provided on the adjacent side face of the ground plane 11B may be set equal to or larger than, for example, 25 μm but equal to or smaller than 150 μm. The dent quantity of the trough provided on the adjacent side face of the ground plane 11B may be set to approximately a half of the distance between the adjacent side face of the ground plane 11A and the adjacent side face of the ground plane 11B.

A projection quantity of the crest and a dent quantity of the trough provided on the adjacent side face of the power plane 14A may be set to any values. The projection quantity of the crest provided on the adjacent side face of the power plane 14A is a quantity of the projection from the portion (B2 in FIG. 5B) of the linear shape of the power plane 14A. The dent quantity of the trough provided on the adjacent side face of the power plane 14A is a quantity of the dent from the portion (B2 in FIG. 5B) of the linear shape of the power plane 14A. The projection quantity of the crest provided on the adjacent side face of the power plane 14A may be set equal to or larger than, for example, 25 μm but equal to or smaller than 150 μm. The projection quantity of the crest provided on the adjacent side face of the power plane 14A may be set to approximately a half of the distance between the adjacent side face of the power plane 14A and the adjacent side face of the power plane 14B. The dent quantity of the trough provided on the adjacent side face of the power plane 14A may be set equal to or larger than, for example, 25 μm but equal to or smaller than 150 μm. The dent quantity of the trough provided on the adjacent side face of the power plane 14A may be set to approximately a half of the distance between the adjacent side face of the power plane 14A and the adjacent side face of the power plane 14B.

A projection quantity of the crest and a dent quantity of the trough provided on the adjacent side face of the power plane 14B may be set to any values. The projection quantity of the crest provided on the adjacent side face of the power plane 14B is a quantity of the projection from the portion (B4 in FIG. 5B) of the linear shape of the power plane 14B. The dent quantity of the trough provided on the adjacent side face of the power plane 14B is a quantity of the dent from the portion (B4 in FIG. 5B) of the linear shape of the power plane 14B. The projection quantity of the crest provided on the adjacent side face of the power plane 14B may be set equal to or larger than, for example, 25 μm but equal to or smaller than 150 μm. The projection quantity of the crest provided on the adjacent side face of the power plane 14B may be set to approximately a half of the distance between the adjacent side face of the power plane 14A and the adjacent side face of the power plane 14B. The dent quantity of the trough provided on the adjacent side face of the power plane 14B may be set equal to or larger than, for example, 25 μm but equal to or smaller than 150 μm. The dent quantity of the trough provided on the adjacent side face of the power plane 14B may be set to approximately a half of the distance between the adjacent side face of the power plane 14A and the adjacent side face of the power plane 14B.

In the second working example, in the thickness direction of the wiring board 2, the shape of the adjacent side face of the ground plane 11A is the same as the shape of the adjacent side face of the ground plane 15A. Hence, the projection quantity of the crest and the dent quantity of the trough provided on the adjacent side face of the ground plane 15A take the same values as those of the projection quantity of the crest and the dent quantity of the trough provided on the adjacent side face of the ground plane 11A.

In the second working example, in the thickness direction of the wiring board 2, the ground plane 11A and the ground plane 15A are disposed so as not to shift the overlap between the adjacent side face of the ground plane 11A and the adjacent side face of the ground plane 15A. Namely, in the thickness direction of the wiring board 2, the ground plane 11A and the ground plane 15A are disposed so that the adjacent side face of the ground plane 11A is overlapped in alignment with the adjacent side face of the ground plane 15A. Without being limited to this arrangement, in the thickness direction of the wiring board 2, the ground plane 11A and the ground plane 15A may be disposed so that the adjacent side face of the ground plane 11A is overlapped out of alignment with the adjacent side face of the ground plane 15A.

In the second working example, in the thickness direction of the wiring board 2, the shape of the adjacent side face of the ground plane 11B is the same as the shape of the adjacent side face of the ground plane 15B. Therefore, the projection quantity of the crest and the dent quantity of the trough provided on the adjacent side face of the ground plane 15B take the same values as those of the projection quantity of the crest and the dent quantity of the trough provided on the adjacent side face of the ground plane 11B.

In the second working example, in the thickness direction of the wiring board 2, the ground plane 11B and the ground plane 15B are disposed so as not to shift the overlap between the adjacent side face of the ground plane 11B and the adjacent side face of the ground plane 15B. That is to say, in the thickness direction of the wiring board 2, the ground plane 11B and the ground plane 15B are disposed so that the adjacent side face of the ground plane 11B is overlapped in alignment with the adjacent side face of the ground plane 15B. Without being limited to this arrangement, in the thickness direction of the wiring board 2, the ground plane 11B and the ground plane 15B may be disposed so that the adjacent side face of the ground plane 11B is overlapped out of alignment with the adjacent side face of the ground plane 15B.

In the second working example, in the thickness direction of the wiring board 2, the shape of the adjacent side face of the power plane 14A is the same as the shape of the adjacent side face of the land 16A. Therefore, the projection quantity of the crest and the dent quantity of the trough provided on the adjacent side face of the land 16A take the same values as those of the projection quantity of the crest and the dent quantity of the trough provided on the adjacent side face of the power plane 14A.

In the second working example, in the thickness direction of the wiring board 2, the power plane 14A and the land 16A are disposed so as not to shift the overlap between the adjacent side face of the power plane 14A and the adjacent side face of the land 16A. Namely, in the thickness direction of the wiring board 2, the power plane 14A and the land 16A are disposed so that the adjacent side face of the power plane 14A is overlapped in alignment with the adjacent side face of the land 16A. Without being limited to this arrangement, in the thickness direction of the wiring board 2, the power plane 14A and the land 16A may be disposed so that the adjacent side face of the power plane 14A is overlapped out of alignment with the adjacent side face of the land 16A.

In the second working example, in the thickness direction of the wiring board 2, the shape of the adjacent side face of the power plane 14B is the same as the shape of the adjacent side face of the land 16B. Therefore, the projection quantity of the crest and the dent quantity of the trough provided on the adjacent side face of the land 16B take the same values as those of the projection quantity of the crest and the dent quantity of the trough provided on the adjacent side face of the power plane 14B.

In the second working example, in the thickness direction of the wiring board 2, the power plane 14B and the land 16B are disposed so as not to shift the overlap between the adjacent side face of the power plane 14B and the adjacent side face of the land 16B. Namely, in the thickness direction of the wiring board 2, the power plane 14B and the land 16B are disposed so that the adjacent side face of the power plane 14B is overlapped in alignment with the adjacent side face of the land 16B. Without being limited to this arrangement, in the thickness direction of the wiring board 2, the power plane 14B and the land 16B may be disposed so that the adjacent side face of the power plane 14B is overlapped out of alignment with the adjacent side face of the land 16B.

The second working example exemplifies the example in which the adjacent side face of the ground plane 11A takes the same shape as the shape of the adjacent side face of the ground plane 15A in the thickness direction of the wiring board 2. Without being limited to this configuration, the adjacent side face of the ground plane 11A and the adjacent side face of the ground plane 15A may take shapes different from each other. For example, the crest and the trough provided on the adjacent side face of the ground plane 15A may be provided in positions different from those of the crest and the trough provided on the adjacent side face of the ground plane 11A. For instance, the crest and the trough provided on the adjacent side face of the ground plane 15A may have sizes different from those of the crest and the trough provided on the adjacent side face of the ground plane 11A.

Figure 6:
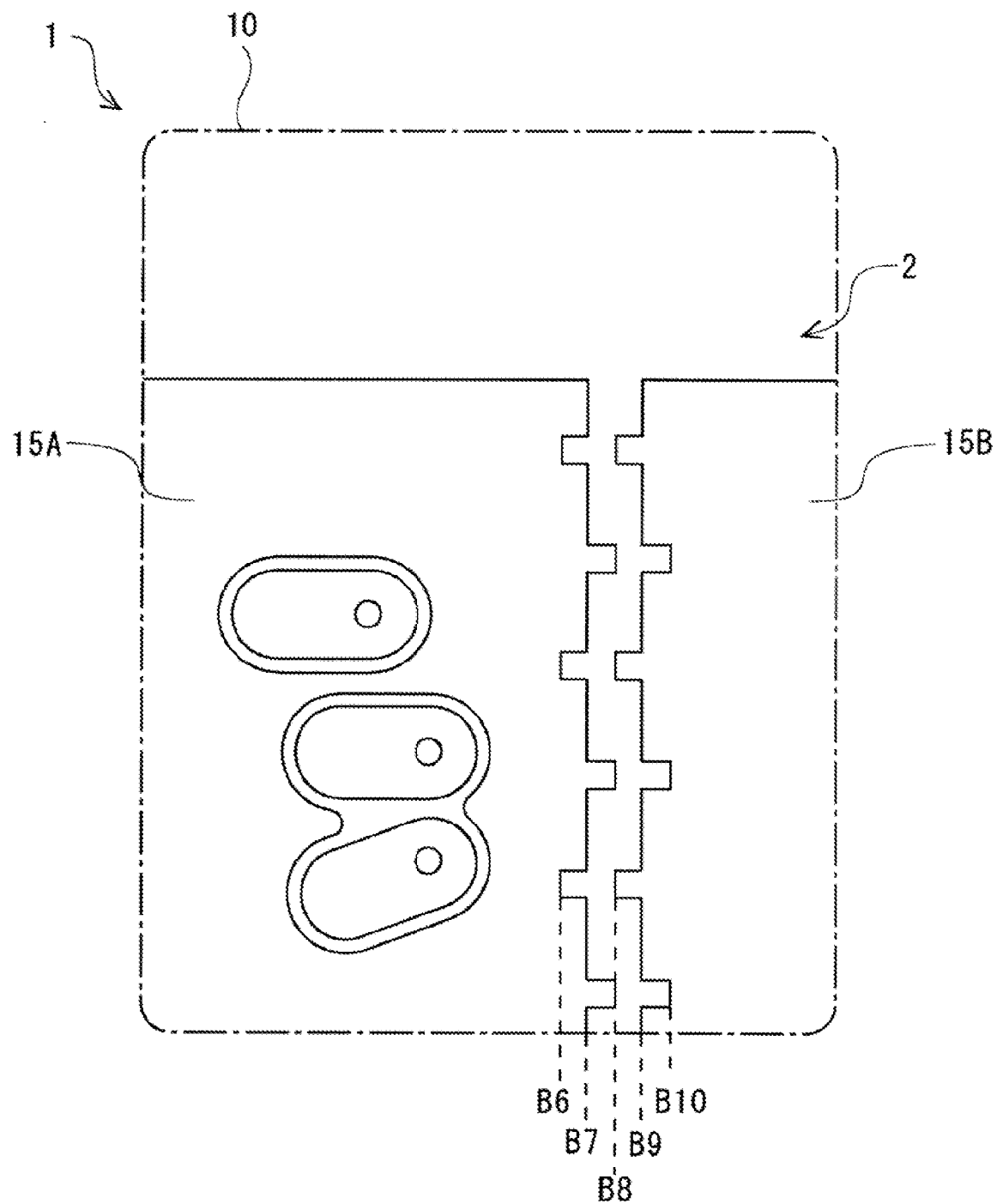
FIG. 6 is a plan view of the principal portion of the L3 layer of the wiring board 2 provided in the semiconductor device 1 according to a modified example of the second working example.

The second working example exemplifies the example in which the adjacent side face of the ground plane 11B takes the same shape as the shape of the adjacent side face of the ground plane 15B in the thickness direction of the wiring board 2. Without being limited to this configuration, the adjacent side face of the ground plane 11B and the adjacent side face of the ground plane 15B may take shapes different from each other. For example, the crest and the trough provided on the adjacent side face of the ground plane 15B may be provided in positions different from those of the crest and the trough provided on the adjacent side face of the ground plane 11B. For instance, the crest and the trough provided on the adjacent side face of the ground plane 15B may have sizes different from those of the crest and the trough provided on the adjacent side face of the ground plane 11B. For example, as illustrated in FIG. 6, the shape of the adjacent side face of the ground plane 11A is differentiated from the shape of the adjacent side face of the ground plane 15A, and the shape of the adjacent side face of the ground plane 11B is differentiated from the shape of the adjacent side face of the ground plane 15B. FIG. 6 is a plan view of the principal portion of the L3 layer of the wiring board 2 provided in the semiconductor device 1 according to a modified example of the second working example.

The second working example exemplifies the example in which the adjacent side face of the power plane 14A takes the same shape as the shape of the adjacent side face of the land 16A in the thickness direction of the wiring board 2. Without being limited to this configuration, the adjacent side face of the power plane 14A and the adjacent side face of the land 16A may take shapes different from each other. For example, the crest and the trough provided on the adjacent side face of the land 16A may be provided in positions different from those of the crest and the trough provided on the adjacent side face of the land 14A. For instance, the crest and the trough provided on the adjacent side face of the land 16A may have sizes different from those of the crest and the trough provided on the adjacent side face of the power plane 14A.

The second working example exemplifies the example in which the adjacent side face of the power plane 14B takes the same shape as the shape of the adjacent side face of the land 16B in the thickness direction of the wiring board 2. Without being limited to this configuration, the adjacent side face of the power plane 14B and the adjacent side face of the land 16B may take shapes different from each other. For example, the crest and the trough provided on the adjacent side face of the land 16B may be provided in positions different from those of the crest and the trough provided on the adjacent side face of the land 14B. For instance, the crest and the trough provided on the adjacent side face of the land 16B may have sizes different from those of the crest and the trough provided on the adjacent side face of the power plane 14B.

The cracks caused in the insulating layers 20, 21 in the region between the ground plane 11A and the ground plane 11B spread in the plane direction of the wiring board 2.

Further, the cracks caused in the insulating layers 20, 21 between the ground plane 11A and the ground plane 11B spread in the thickness direction of the wiring board 2.

The crest is provided on the adjacent side face of the ground plane 11A, thereby increasing, as compared with the case where the side face of the ground plane 11A takes the linear shape, the possibility that the crack spreading in the plane direction of the wiring board 2 collides with the ground plane 11A. The crack spreading in the plane direction of the wiring board 2 collides with the ground plane 11A, in which case the crack terminates but does not spread in the plane direction of the wiring board 2. Accordingly, the cracks caused in the insulating layers 20, 21 of the wiring board 2 are blocked by the crests provided on the adjacent side face of the ground plane 11A, thereby making it feasible to restrain the cracks from spreading in the plane direction of the wiring board 2.

The crest is provided on the adjacent side face of the ground plane 11B, thereby increasing, as compared with the case where the side face of the ground plane 11B takes the linear shape, the possibility that the crack spreading in the plane direction of the wiring board 2 collides with the ground plane 11B. The crack spreading in the plane direction of the wiring board 2 collides with the ground plane 11B, in which case the crack terminates but does not spread in the plane direction of the wiring board 2. Accordingly, the cracks caused in the insulating layers 20, 21 of the wiring board 2 are blocked by the crests provided on the adjacent side face of the ground plane 11B, thereby making it feasible to restrain the cracks from spreading in the plane direction of the wiring board 2.

As illustrated in FIG. 5A, the crests provided on the adjacent side face of the ground plane 11A and the crests provided on the adjacent side face of the ground plane 11B are alternately and repeatedly disposed between the ground plane 11A and the ground plane 11B. With this arrangement, as compared with the case where each of the side faces of the ground planes 11A, 11B takes the linear shape, there increases the possibility that the crack spreading in the plane direction of the wiring board 2 collides with the ground plane 11A or 11B. The cracks caused in the insulating layers 20, 21 of the wiring board 2 are blocked by the crests provided on the adjacent side face of the ground plane 11A or by the crests provided on the adjacent side face of the ground plane 11B, whereby it is feasible to restrain the cracks from spreading in the plane direction of the wiring board 2.

There is a case in which the crack caused in the insulating layer 20 of the wiring board 2, without colliding with the crest provided on the adjacent side face of the ground plane 11A, spreads through the insulating layer 21 in the thickness direction of the wiring board 2. As discussed above, in the thickness direction of the wiring board 2, the crest provided on the adjacent side face of the ground plane 11A is not overlapped with the crest provided on the adjacent side face of the power plane 14A. Therefore, there is a case in which the crack spreading through the insulating layer 21 in the thickness direction of the wiring board 2 collides not with the crest provided on the adjacent side face of the ground plane 11A but collides with the crest provided on the adjacent side face of the power plane 14A. The crack spreading through the insulating layer 21 in the thickness direction of the wiring board 2 collides with the crest provided on the adjacent side face of the power plane 14A, in which case the crack terminates but does not spread in the thickness direction of the wiring board 2. Consequently, the crack not colliding with the crest provided on the adjacent side face of the ground plane 11A is blocked by the crest provided on the adjacent side face of the power plane 14A, thereby making it possible to restrain the crack from spreading in the thickness direction of the wiring board 2.

There is a case in which the crack caused in the insulating layer 20 of the wiring board 2, without colliding with the crest provided on the adjacent side face of the ground plane 11B, spreads through the insulating layer 21 in the thickness direction of the wiring board 2. As discussed above, in the thickness direction of the wiring board 2, the crest provided on the adjacent side face of the ground plane 11B is not overlapped with the crest provided on the adjacent side face of the power plane 14B. Therefore, there is a case in which the crack spreading through the insulating layer 21 in the thickness direction of the wiring board 2 collides not with the crest provided on the adjacent side face of the ground plane 11B but collides with the crest provided on the adjacent side face of the power plane 14B. The crack spreading through the insulating layer 21 in the thickness direction of the wiring board 2 collides with the crest provided on the adjacent side face of the power plane 14B, in which case the crack terminates but does not spread in the thickness direction of the wiring board 2. Consequently, the crack not colliding with the crest provided on the adjacent side face of the ground plane 11B is blocked by the crest provided on the adjacent side face of the power plane 14B, thereby making it possible to restrain the crack from spreading in the thickness direction of the wiring board 2.

The crest is provided on the adjacent side face of the ground plane 15A, thereby increasing, as compared with the case where the side face of the ground plane 15A takes the linear shape, the possibility that the crack spreading in the plane direction of the wiring board 2 collides with the ground plane 15A. The crack spreading in the plane direction of the wiring board 2 collides with the ground plane 15A, in which case the crack terminates but does not spread in the plane direction of the wiring board 2. Accordingly, the crack spreading through the insulating layer 22 or 23 of the wiring board 2 is blocked by the crest provided on the adjacent side face of the ground plane 15A, thereby making it feasible to restrain the crack from spreading in the plane direction of the wiring board 2.

The crest is provided on the adjacent side face of the ground plane 15B, thereby increasing, as compared with the case where the side face of the ground plane 15B takes the linear shape, the possibility that the crack spreading in the plane direction of the wiring board 2 collides with the ground plane 15B. The crack spreading in the plane direction of the wiring board 2 collides with the ground plane 15B, in which case the crack terminates but does not spread in the plane direction of the wiring board 2. Accordingly, the crack spreading through the insulating layer 22 or 23 of the wiring board 2 is blocked by the crest provided on the adjacent side face of the ground plane 15B, thereby making it feasible to restrain the crack from spreading in the plane direction of the wiring board 2.

As illustrated in FIG. 5C, the crests provided on the adjacent side face of the ground plane 15A and the crests provided on the adjacent side face of the ground plane 15B are alternately and repeatedly disposed between the ground plane 15A and the ground plane 15B. With this arrangement, as compared with the case where each of the side faces of the ground planes 15A, 15B takes the linear shape, there increases the possibility that the crack spreading in the plane direction of the wiring board 2 collides with the ground plane 15A or 15B. The crack spreading through the insulating layer 22 or 23 of the wiring board 2 is blocked by the crest provided on the adjacent side face of the ground plane 15A or by the crest provided on the adjacent side face of the ground plane 15B, whereby it is feasible to restrain the crack from spreading in the plane direction of the wiring board 2.

As illustrated in FIG. 5D, the crests provided on the adjacent side face of the land 16A and the crests provided on the adjacent side face of the land 16B are alternately and repeatedly disposed between the land 16A and the land 16B. With this arrangement, as compared with the case where each of the side faces of the lands 16A, 16B takes the linear shape, there increases the possibility that the crack spreading in the plane direction of the wiring board 2 collides with the land 16A or 16B. The crack spreading through the insulating layer 23 or 24 of the wiring board 2 is blocked by the crest provided on the adjacent side face of the land 16A or by the crest provided on the adjacent side face of the land 16B, whereby it is feasible to restrain the crack from spreading in the plane direction of the wiring board 2.

The crack caused in the insulating layer 24 in the region between the land 16A and the land 16B spreads through the insulating layer 23 in the thickness direction of the wiring board 2. There is a case where the crack caused in the insulating layer 24 does not collide with the crest provided on the adjacent side face of the land 16A but spreads through the insulating layer 23 in the thickness direction of the wiring board 2. As described above, in the thickness direction of the wiring board 2, the crest provided on the adjacent side face of the ground plane 15A is not overlapped with the crest provided on the adjacent side face of the land 16A. Consequently, there is a case in which the crack not colliding with the crest provided on the adjacent side face of the land 16A but spreading through the insulating layer 23 in the thickness direction of the wiring board 2, collides with the crest provided on the adjacent side face of the ground plane 15A. The crack spreading through the insulating layer 23 in the thickness direction of the wiring board 2 collides with the crest provided on the adjacent side face of the ground plane 15A, in which case the crack terminates but does not spread in the thickness direction of the wiring board 2. Hence, the crack not colliding with the crest provided on the adjacent side face of the land 16A is blocked by the crest provided on the adjacent side face of the ground plane 15A, thereby making it possible to restrain the crack from spreading in the thickness direction of the wiring board 2.

There is a case where the crack caused in the insulating layer 24 of the wiring board 2 does not collide with the crest provided on the adjacent side face of the land 16B but spreads through the insulating layer 23 in the thickness direction of the wiring board 2. As described above, in the thickness direction of the wiring board 2, the crest provided on the adjacent side face of the ground plane 15B is not overlapped with the crest provided on the adjacent side face of the land 16B. Consequently, there is a case in which the crack not colliding with the crest provided on the adjacent side face of the land 16B but spreading through the insulating layer 23 in the thickness direction of the wiring board 2, collides with the crest provided on the adjacent side face of the ground plane 15B. The crack spreading through the insulating layer 23 in the thickness direction of the wiring board 2 collides with the crest provided on the adjacent side face of the ground plane 15B, in which case the crack terminates but does not spread in the thickness direction of the wiring board 2. Hence, the crack not colliding with the crest provided on the adjacent side face of the land 16B is blocked by the crest provided on the adjacent side face of the ground plane 15B, thereby making it possible to restrain the crack from spreading in the thickness direction of the wiring board 2.

[Third Working Example]

Figure 7A:
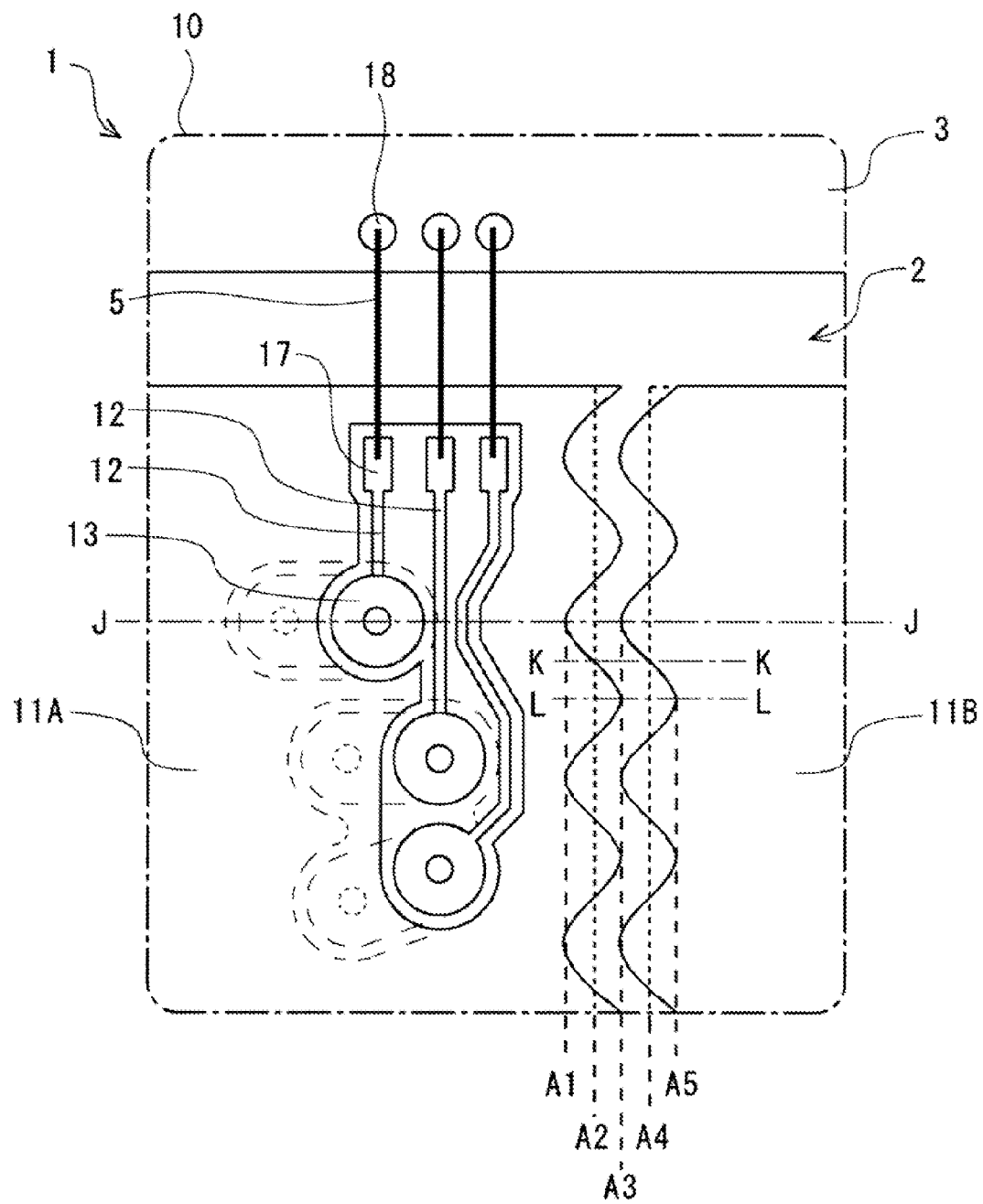
FIG. 7A is a plan view of a principal portion of the semiconductor device 1 according to a third working example.
Figure 7C:
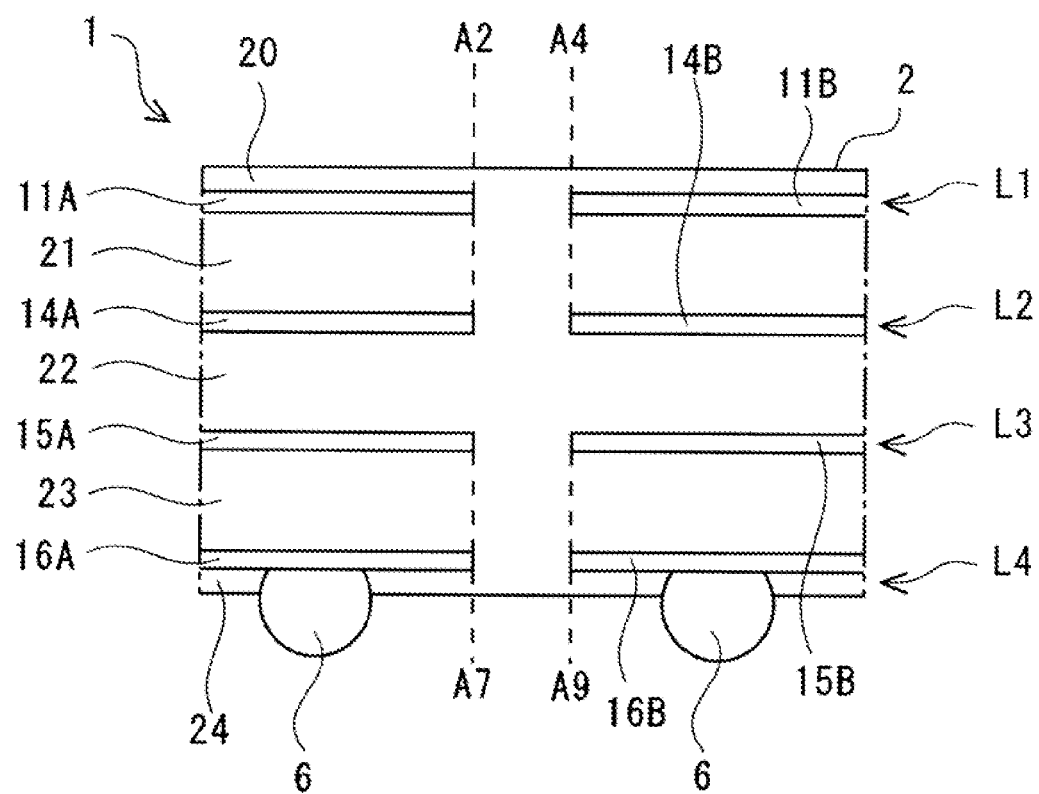
FIG. 7C is a sectional view of the principal portion of the semiconductor device 1, which is taken along the alternate long and short dash line K-K in FIG. 7A.
Figure 7D:
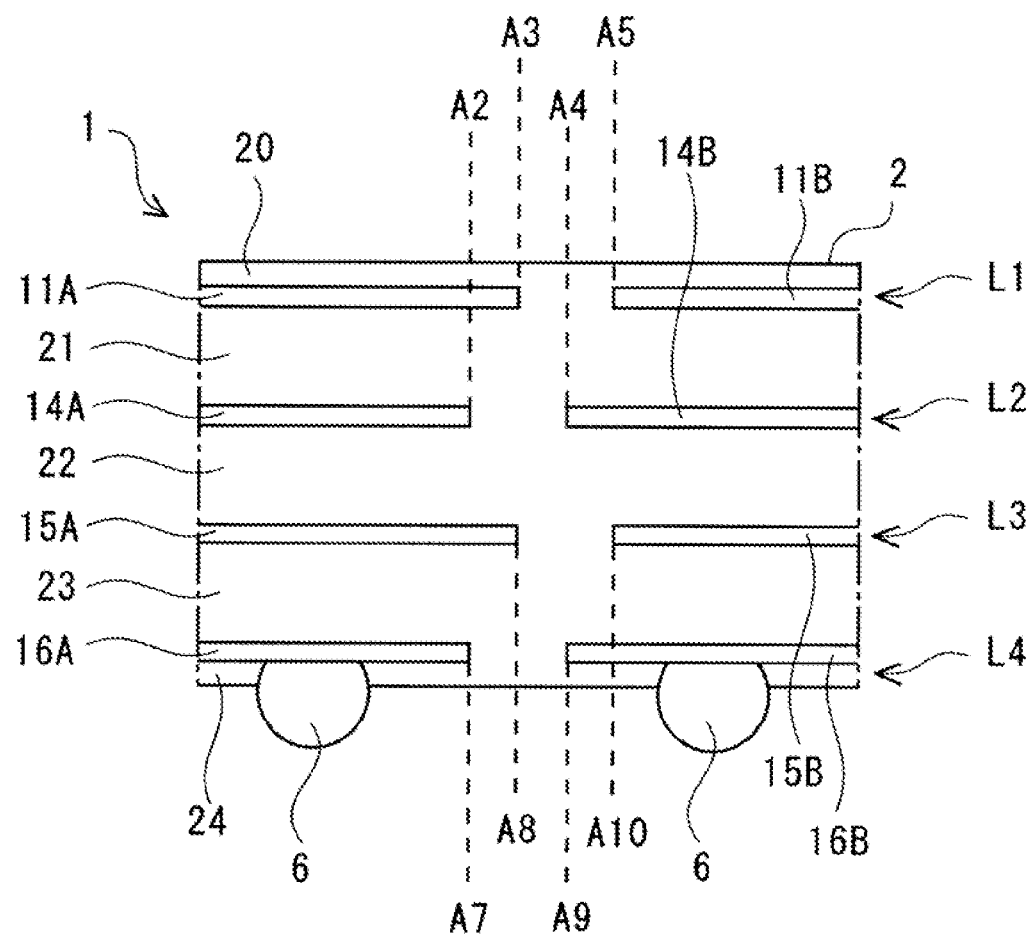
FIG. 7D is a sectional view of the principal portion of the semiconductor device 1, which is taken along the alternate long and short dash line L-L in FIG. 7A.

A third working example of the embodiment will be discussed. A configuration of the third working example is an exemplification, and the semiconductor device 1 according to the embodiment is not limited to the configuration of the third working example. It is to be noted that the same components as those in the first and second working examples are marked with the same numerals and symbols as those in the first and second working examples, and their explanations are omitted. FIG. 7A is a plan view of a principal portion of the semiconductor device 1 according to the third working example. FIG. 7A depicts in enlargement a region 10 circumscribed by the alternate long and short dash line in FIG. 1A. FIG. 7B is a sectional view of the principal portion of the semiconductor device 1, which is taken along the alternate long and short dash line J-J in FIG. 7A. FIG. 7C is a sectional view of the principal portion of the semiconductor device 1, which is taken along the alternate long and short dash line K-K in FIG. 7A. FIG. 7D is a sectional view of the principal portion of the semiconductor device 1, which is taken along the alternate long and short dash line L-L in FIG. 7A. In FIGS. 7A to 4D throughout, the illustration of the sealing resin 4 is omitted.

As illustrated in FIGS. 7A and 7B, the ground planes 11A, 11B, the signal wirings 12 and the conducting-vias 13 are formed in the L1 layer of the wiring board 2. Further, as depicted in FIGS. 7B through 7D, the power planes 14A, 14B are formed in the L2 layer of the wiring board 2, the ground planes 15A, 15B are formed in the L3 layer of the wiring board 2, and the lands 16A, 16B are formed in the L4 layer of the wiring board 2.

As depicted in FIGS. 7A through 7D, the ground plane HA and the ground plane 11B are disposed in the side-by-side relationship in the plane direction of the wiring board 2. As illustrated in FIGS. 7B through 7D, the power plane 14A and the power plane 14B are disposed in the side-by-side relationship in the plane direction of the wiring board 2. As depicted in FIGS. 7B through 7D, the ground plane 15A and the ground plane 15B are disposed in the side-by-side relationship in the plane direction of the wiring board 2. As illustrated in FIGS. 7B through 7D, the land 16A and the land 16B are disposed in the side-by-side relationship in the plane direction of the wiring board 2.

As depicted in FIGS. 7B through 7D, the power plane 14A is disposed under the ground plane 11A, and the power plane 14B is disposed under the ground plane 11B. Namely, as illustrated in FIGS. 7B through 7D, in the thickness direction of the wiring board 2, the ground plane 11A and the power plane 14A are disposed in the side-by-side relationship, and the ground plane 11B and the power plane 14B are disposed in the side-by-side relationship. As illustrated in FIGS. 7B through 7D, the ground plane 15A is disposed under the power plane 14A, and the ground plane 15B is disposed under the power plane 14B. Namely, as illustrated in FIGS. 7B through 7D, in the thickness direction of the wiring board 2, the power plane 14A and the ground plane 15A are disposed in the side-by-side relationship, and the power plane 14B and the ground plane 15B are disposed in the side-by-side relationship. As depicted in FIGS. 7B through 7D, the land 16A is disposed under the ground plane 15A, and the land 16B is disposed under the ground plane 15B. That is to say, as illustrated in FIGS. 7B through 7D, in the thickness direction of the wiring board 2, the ground plane 15A and the land 16A are disposed in the side-by-side relationship, and the ground plane 15B and the land 16B are disposed in the side-by-side relationship.

The ground planes 11A, 15A and the power plane 14A are connected through an unillustrated conducting-via to the land 16A. The ground planes 11B, 15B and the power plane 14B are connected through the unillustrated conducting-via to the land 16B. The ground planes 11A, 11B, 15A, 15B, the signal wirings 12, the conducting-vias 13, the power planes 14A, 14B and the lands 16A, 16B may involve using a metal such as copper (Cu) as their material. As depicted in FIGS. 7B through 7D, the solder balls 6 are joined to the lands 16A, 16B.

As illustrated in FIG. 7A, the bonding pads 17 formed on the wiring board 2 are connected via the wires 5 to the bonding pads 18 formed on the semiconductor element 3. As illustrated in FIG. 7A, the signal wirings 12 are connected to the conducting-vias 13 and the bonding pads 17.

As depicted in FIGS. 7B through 7D, the wiring board 2 includes the insulating layer 20 formed over the ground planes 11A, 11B, the signal wirings 12 and the conducting-vias 13. A material of the insulating layer 20 may involve using, e.g., a solder resist. The solder resist may be liquid and may also take a dry-film shape. In FIG. 7A, the illustration of the insulating layer 20 is omitted. As illustrated in FIGS. 7B through 7D, the wiring board 2 includes the insulating layer 21 between the L1 layer and the L2 layer, includes the insulating layer 22 between the L2 layer and the L3 layer, and includes the insulating layer 23 between the L3 layer and the L4 layer.

As depicted in FIGS. 7B through 7D, the wiring board 2 is formed with the insulating layer 21 between the ground plane 11A and the power plane 14A and between the ground plane 11B and the power plane 14B. As illustrated in FIGS. 7B through 7D, the wiring board 2 is formed with the insulating layer 22 between the power plane 14A and the ground plane 15A and between the power plane 14B and the ground plane 15B. As depicted in FIGS. 7B through 7D, the wiring board 2 is formed with the insulating layer 23 between the ground plane 15A and the land 16A and between the ground plane 15B and the land 16B.

A material of the insulating layers 21, 22, 23 may involve using, e.g., the epoxy resin. A thickness of each of the insulating layers 21, 22, 23 may be set equal to or larger than, e.g., 30 μm but equal to or smaller than 100 μm.

As depicted in FIGS. 7B through 7D, the wiring board 2 is formed with the insulating layer 24 on the surface opposite to the surface on which the semiconductor element 3 is packaged. A material of the insulating layer 24 may involve using, e.g., the solder resist. The solder resist may be liquid and may also take the dry-film shape.

FIG. 8A is a plan view of a principal portion of the L1 layer of the wiring board 2 provided in the semiconductor device 1 according to the third working example. The illustrations of the sealing resin 4 and the insulating layer 20 are omitted in FIG. 8A. FIG. 8B is a plan view of a principal portion of the L2 layer of the wiring board 2 provided in the semiconductor device 1 according to the third working example. The illustrations of the sealing resin 4, the insulating layer 20 and the L1 layer of the wiring board 2 are omitted in FIG. 8B. FIG. 8C is a plan view of a principal portion of the L3 layer of the wiring board 2 provided in the semiconductor device 1 according to the third working example. The illustrations of the sealing resin 4, the insulating layer 20 and the L1 and L2 layers of the wiring board 2 are omitted in FIG. 8C. FIG. 8D is a plan view of a principal portion of the L4 layer of the wiring board 2 provided in the semiconductor device 1 according to the third working example. The illustrations of the sealing resin 4, the insulating layer 20 and the L1, L2 and L3 layers of the wiring board 2 are omitted in FIG. 8D. Note that FIGS. 8A through 8D similar to FIG. 7A are enlarged plan views of the region 10 circumscribed by the alternate long and short dash line in FIG. 1A.

As illustrated in FIG. 8A, the ground plane 11A and the ground plane 11B are disposed in the side-by-side relationship in the plane direction of the wiring board 2. As illustrated in FIG. 8B, the power plane 14A and the power plane 14B are disposed in the side-by-side relationship in the plane direction of the wiring board 2. As illustrated in FIG. 8C, the ground plane 15A and the ground plane 15B are disposed in the side-by-side relationship in the plane direction of the wiring board 2. As illustrated in FIG. 8D, the land 16A and the land 16B are disposed in the side-by-side relationship in the plane direction of the wiring board 2.

As depicted in FIGS. 8A through 8D, side faces of the ground planes 11A, 11B, 15A, 15B are formed partially in a non-linear shape, while side faces of the power planes 14A, 14B and the lands 16A, 16B are formed partially in a linear shape. Namely, the side faces of the ground planes 11A, 11B, 15A, 15B are partially non-planar, while the side faces of the power planes 14A, 14B and the lands 16A, 16B are partially planar.

As depicted in FIG. 8A, the side face, adjacent to the ground plane 11B, of the ground plane 11A takes the non-linear shape (wavy shape). To be specific, the side face, adjacent to the ground plane 11B, of the ground plane 11A is provided with a semicircular crest (projection) and a semicircular trough (dent), alternately and repeatedly. The crest provided on the adjacent side face of the ground plane 11A is a portion projected from A2 in FIG. 8A toward an arrangement direction of the ground plane 11B. The trough provided on the adjacent side face of the ground plane 11A is a portion dented from A2 in FIG. 8A toward the arrangement direction of the ground plane 11B.

As illustrated in FIG. 8A, the side face, adjacent to the ground plane 11A, of the ground plane 11B takes the non-linear shape (wavy shape). Specifically, the side face, adjacent to the ground plane 11A, of the ground plane 11B is provided with the semicircular crest (projection) and the semicircular trough (dent), alternately and repeatedly. The crest provided on the adjacent side face of the ground plane 11B is a portion projected from A4 in FIG. 8A toward the arrangement direction of the ground plane 11A. The trough provided on the adjacent side face of the ground plane 11B is a portion dented from A4 in FIG. 8A toward the arrangement direction of the ground plane 11A.

As depicted in FIG. 8B, the side face, adjacent to the power plane 14B, of the power plane 14A takes the linear shape. To be specific, the side face, adjacent to the power plane 14B, of the power plane 14A is planar. As illustrated in FIG. 8B, the side face, adjacent to the power plane 14A, of the power plane 14B takes the linear shape. Specifically, the side face, adjacent to the power plane 14A, of the power plane 14B is planar.

As depicted in FIG. 8C, the side face, adjacent to the ground plane 15B, of the ground plane 15A takes the non-linear shape (wavy shape). Specifically, the side face, adjacent to the ground plane 15B, of the ground plane 15A is provided with the semicircular crest (projection) and the semicircular trough (dent), alternately and repeatedly. The crest provided on the adjacent side face of the ground plane 15A is a portion projected from A7 in FIG. 8C toward the arrangement direction of the ground plane 15B. The trough provided on the adjacent side face of the ground plane 15A is a portion dented from A7 in FIG. 8C toward the arrangement direction of the ground plane 15B.

As depicted in FIG. 8C, the side face, adjacent to the ground plane 15A, of the ground plane 15B takes the non-linear shape (wavy shape). To be specific, the side face, adjacent to the ground plane 15A, of the ground plane 15B is provided with the semicircular crest (projection) and the semicircular trough (dent), alternately and repeatedly. The crest provided on the adjacent side face of the ground plane 15B is a portion projected from A9 in FIG. 8C toward the arrangement direction of the ground plane 15A. The trough provided on the adjacent side face of the ground plane 15B is a portion dented from A9 in FIG. 8C toward the arrangement direction of the ground plane 15A.

As illustrated in FIG. 8D, the side face, adjacent to the land 16B, of the land 16A takes a linear shape. Specifically, the side face, adjacent to the land 16B, of the land 16A is planar. As depicted in FIG. 8D, the side face, adjacent to the land 16A, of the land 16B takes the linear shape. That is to say, the side face, adjacent to the land 16A, of the land 16B is planar.

The third working example is different from the first working example in such a point that with respect to the ground plane 11A, the adjacent side face of the ground plane 11A takes the wavy shape. Other points with respect to the ground plane 11A are the same as those in the first working example. The third working example is different from the first working example in such a point that with respect to the ground plane 11B, the adjacent side face of the ground plane 11B takes the wavy shape. Other points with respect to the ground plane 11B are the same as those in the first working example. The third working example is the same as the first working example with respect to the power planes 14A, 14B.

The third working example is different from the first working example in such a point that with respect to the ground plane 15A, the adjacent side face of the ground plane 15A takes the wavy shape. Other points with respect to the ground plane 15A are the same as those in the first working example. The third working example is different from the first working example in such a point that with respect to the ground plane 15B, the adjacent side face of the ground plane 15B takes the wavy shape. Other points with respect to the ground plane 15B are the same as those in the first working example. The third working example is the same as the first working example with respect to the lands 16A, 16B.

<<Common Items in First through Third Working Examples>>

The embodiment is capable of restraining the spread of the crack caused in the insulating layer of the wiring board without deteriorating the electric characteristics of the wirings arranged in the respective layers of the wiring board. In the first through third working examples, in the thickness direction of the wiring board 2, the ground plane 11A is not overlapped with the power plane 14B. Accordingly, there is a small possibility that the voltage fluctuation of the ground plane 11A affects the voltage of the power plane 14B. Further, such a possibility is small that the voltage fluctuation of the power plane 14B affects the voltage of the ground plane 11A. Hence, it is feasible to restrain the crack from spreading in a state where the electric characteristics of the ground plane 11A and of the power plane 14B are restrained from being deteriorated. In the first through third working examples, in the thickness direction of the wiring board 2, the ground plane 11B is not overlapped with the power plane 14A. Accordingly, there is a small possibility that the voltage fluctuation of the ground plane 11B affects the voltage of the power plane 14A. Further, such a possibility is small that the voltage fluctuation of the power plane 14A affects the voltage of the ground plane 11B. Hence, it is feasible to restrain the crack from spreading in a state where the electric characteristics of the ground plane 11B and of the power plane 14A are restrained from being deteriorated.

In the first through third working examples, in the thickness direction of the wiring board 2, the power plane 14A is not overlapped with the ground plane 15B. Accordingly, there is a small possibility that the voltage fluctuation of the power plane 14A affects the voltage of the ground plane 15B. Further, such a possibility is small that the voltage fluctuation of the ground plane 15B affects the voltage of the power plane 14A. Hence, it is feasible to restrain the crack from spreading in a state where the electric characteristics of the power plane 14A and of the ground plane 15B are restrained from being deteriorated. In the first through third working examples, in the thickness direction of the wiring board 2, the power plane 14B is not overlapped with the ground plane 15A. Accordingly, there is a small possibility that the voltage fluctuation of the power plane 14B affects the voltage of the ground plane 15A. Further, such a possibility is small that the voltage fluctuation of the ground plane 15A affects the voltage of the power plane 14B. Hence, it is feasible to restrain the crack from spreading in a state where the electric characteristics of the power plane 14B and of the ground plane 15A are restrained from being deteriorated.

In the first through third working examples, in the thickness direction of the wiring board 2, the ground plane 15A is not overlapped with the land 16B. Accordingly, there is a small possibility that the voltage fluctuation of the ground plane 15A affects the voltage of the land 16B. Further, such a possibility is small that the voltage fluctuation of the land 16B affects the voltage of the ground plane 15A. Therefore, it is feasible to restrain the crack from spreading in a state where the electric characteristics of the ground plane 15A and of the land 16B are restrained from being deteriorated. In the first through third working examples, in the thickness direction of the wiring board 2, the ground plane 15B is not overlapped with the land 16A. Accordingly, there is a small possibility that the voltage fluctuation of the ground plane 15B affects the voltage of the land 16A. Further, such a possibility is small that the voltage fluctuation of the land 16A affects the voltage of the ground plane 15B. Hence, it is feasible to restrain the crack from spreading in a state where the electric characteristics of the ground plane 15B and of the land 16A are restrained from being deteriorated.

The first through third working examples have exemplified the example in which the ground planes 11A, 11B are formed in the L1 layer of the wiring board 2. In the first through third working examples, the power planes 14A, 14B may be formed in the L1 layer of the wiring board 2. Furthermore, in the first through third working examples, the power plane taking the same shape as that of the ground plane 11A and the power plane taking the same shape as that of the ground plane 11B may be disposed in the side-by-side relationship in the L1 layer of the wiring board 2. Moreover, in the first through third working examples, the ground plane taking the same shape as that of the power plane 14A and the ground plane taking the same shape as that of the power plane 14B may be disposed in the side-by-side relationship in the L1 layer of the wiring board 2.

The first through third working examples have exemplified the example in which the power planes 14A, 14B are formed in the L2 layer of the wiring board 2. In the first through third working examples, the ground planes 11A, 11B may also be formed in the L2 layer of the wiring board 2. Further, in the first through third working examples, the ground plane taking the same shape as that of the power plane 14A and the ground plane taking the same shape as that of the power plane 14B may also be disposed in the side-by-side relationship in the L2 layer of the wiring board 2. Still further, in the first through third working examples, the power plane taking the same shape as that of the ground plane 11A and the ground plane taking the same shape as that of the ground plane 11B may also be disposed in the side-by-side relationship in the L2 layer of the wiring board 2.

The first through third working examples have exemplified the example in which the ground planes 15A, 15B are formed in the L3 layer of the wiring board 2. In the first through third working examples, the power planes 14A, 14B may be formed in the L3 layer of the wiring board 2. Further, in the first through third working examples, the power plane taking the same shape as that of the ground plane 15A and the power plane taking the same shape as that of the ground plane 15B may also be disposed in the side-by-side relationship in the L3 layer of the wiring board 2. Still further, in the first through third working examples, the ground plane taking the same shape as that of the power plane 14A and the ground plane taking the same shape as that of the power plane 14B may also be disposed in the side-by-side relationship in the L3 layer of the wiring board 2. Yet further, in the first through third working examples, the land taking the same shape as that of the ground plane 15A and the land taking the same shape as that of the ground plane 15B may also be disposed in the side-by-side relationship in the L4 layer of the wiring board 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring board comprising:
   a first wiring;
   a second wiring being disposed adjacently to the first wiring in a plane direction of the wiring board;
   a third wiring being disposed adjacently to the first wiring in a thickness direction of the wiring board;
   a fourth wiring being disposed adjacently to the third wiring in the plane direction of the wiring board; and
   an insulating layer being formed between the first wiring and the second wiring, between the first wiring and the third wiring, between the second wiring and the fourth wiring and between the third wiring and the fourth wiring,
   wherein the second wiring and the fourth wiring are disposed adjacently to each other in the thickness direction of the wiring board,
   the first wiring and the fourth wiring are not overlapped in the thickness direction of the wiring board,
   the second wiring and the third wiring are not overlapped in the thickness direction of the wiring board,
   a first crest and a first trough are provided on a side face of the first wiring in an area where the first wiring is adjacent to the second wiring,
   a second crest and a second trough are provided on a side face of the second wiring in the area where the first wiring is adjacent to the second wiring,
   the first trough provided on the side face of the first wiring and a part of the third wiring are overlapped in the thickness direction of the wiring board, and
   the second trough provided on the side face of the second wiring and a part of the fourth wiring are overlapped in the thickness direction of the wiring board.

2. The wiring board according to claim 1, wherein the side face of the third wiring in the area, where the third wiring and the fourth wiring are adjacent to each other, takes a linear shape, and
   the side face of the fourth wiring in the area, where the third wiring and the fourth wiring are adjacent to each other, takes the linear shape.

3. The wiring board according to claim 2, wherein the first wiring and the third wiring are so disposed as to be shifted in the plane direction of the wiring board,
   the second wiring and the fourth wiring are so disposed as to be shifted in the plane direction of the wiring board,
   a shift quantity between an apex portion of the first crest provided on the side face of the first wiring and a portion of the linear shape of the side face of the third wiring is a half of a distance between the first wiring and the second wiring, and
   a shift quantity between the apex portion of the second crest provided on the side face of the second wiring and the portion of the linear shape of the side face of the fourth wiring is a half of a distance between the third wiring and the fourth wiring.

4. The wiring board according to claim 1, wherein a plurality of the first crests and a plurality of the first troughs are provided on a side face of the first wiring in an area where the first wiring is adjacent to the second wiring,
   a plurality of the second crests and a plurality of the second troughs are provided on a side face of the second wiring in the area where the first wiring is adjacent to the second wiring,
   the plurality of the first crests and the plurality of the first troughs provided on the side face of the first wiring are provided alternately and repeatedly, and
   the plurality of the second crests and the plurality of the second troughs provided on the side face of the second wiring are provided alternately and repeatedly.

5. A wiring board comprising:
   a first wiring;
   a second wiring being disposed adjacently to the first wiring in a plane direction of the wiring board;
   a third wiring being disposed adjacently to the first wiring in a thickness direction of the wiring board;
   a fourth wiring being disposed adjacently to the third wiring in the plane direction of the wiring board; and
   an insulating layer being formed between the first wiring and the second wiring, between the first wiring and the third wiring, between the second wiring and the fourth wiring and between the third wiring and the fourth wiring,
   wherein the second wiring and the fourth wiring are disposed adjacently to each other in the thickness direction of the wiring board,
   the first wiring and the fourth wiring are not overlapped in the thickness direction of the wiring board,
   the second wiring and the third wiring are not overlapped in the thickness direction of the wiring board,
   a first crest and a first trough are provided on a side face of the first wiring in an area where the first wiring is adjacent to the second wiring,
   a second crest and a second trough are provided on a side face of the second wiring in the area where the first wiring is adjacent to the second wiring, a third crest and a third trough are provided on a side face of the third wiring in an area where the third wiring is adjacent to the fourth wiring, a fourth crest and a fourth trough are provided on a side face of the fourth wiring in the area where the third wiring is adjacent to the fourth wiring, the first crest provided on the side face of the first wiring and the third crest provided on the side face of the third wiring are not overlapped in the thickness direction of the wiring board, and the second crest provided on the side face of the second wiring and the fourth crest provided on the side face of the fourth wiring are not overlapped in the thickness direction of the wiring board.

6. The wiring board according to claim 5, wherein a projection quantity of the first crest provided on the side face of the first wiring is a half of the distance between the first wiring and the second wiring, a projection quantity of the second crest provided on the side face of the second wiring is a half of the distance between the first wiring and the second wiring, a projection quantity of the third crest provided on the side face of the third wiring is a half of the distance between the third wiring and the fourth wiring, and a projection quantity of the fourth crest provided on the side face of the fourth wiring is a half of the distance between the third wiring and the fourth wiring.

7. The wiring board according to claim 5, wherein a plurality of the first crests and a plurality of the first troughs are provided on a side face of the first wiring in an area where the first wiring is adjacent to the second wiring, a plurality of the second crests and a plurality of the second troughs are provided on a side face of the second wiring in the area where the first wiring is adjacent to the second wiring, a plurality of the third crests and a plurality of the third troughs are provided on a side face of the third wiring in an area where the third wiring is adjacent to the fourth wiring, a plurality of the fourth crests and a plurality of the fourth troughs are provided on a side face of the fourth wiring in the area where the third wiring is adjacent to the fourth wiring, the plurality of the first crests and the plurality of the first troughs provided on the side face of the first wiring are provided alternately and repeatedly, the plurality of the second crests and the plurality of the second troughs provided on the side face of the second wiring are provided alternately and repeatedly, the plurality of the third crests and the plurality of the third troughs provided on the side face of the third wiring are provided alternately and repeatedly, and the plurality of the fourth crests and the plurality of the fourth troughs provided on the side face of the fourth wiring are provided alternately and repeatedly.

8. The wiring board according to claim 5, wherein the side face of the first wiring between the first crest and the first trough provided on the side face of the first wiring takes the linear shape, the side face of the second wiring between the second crest and the second trough provided on the side face of the second wiring takes the linear shape, the side face of the third wiring between the third crest and the third trough provided on the side face of the third wiring takes the linear shape, and the side face of the fourth wiring between the fourth crest and the fourth trough provided on the side face of the fourth wiring takes the linear shape.

9. The wiring board according to claim 1, wherein the first wiring and the second wiring are ground planes, and the third wiring and the fourth wiring are power planes.

10. The wiring board according to claim 1, wherein the first wiring and the second wiring are power planes, and the third wiring and the fourth wiring are ground planes.

11. The wiring board according to claim 5, wherein the first wiring and the second wiring are ground planes, and the third wiring and the fourth wiring are power planes.

12. The wiring board according to claim 5, wherein the first wiring and the second wiring are power planes, and the third wiring and the fourth wiring are ground planes.

* * * * *